(12) United States Patent
Sasaki et al.

(10) Patent No.: US 11,749,219 B2
(45) Date of Patent: Sep. 5, 2023

(54) BIDIRECTIONAL SHIFT REGISTER PERFORMING SHIFT ACTION BASED ON CLOCK SIGNALS AND DISPLAY DEVICE PROVIDED WITH SAME

(71) Applicant: Sharp Display Technology Corporation, Kameyama (JP)

(72) Inventors: Yasushi Sasaki, Kameyama (JP); Shige Furuta, Kameyama (JP); Yuhichiroh Murakami, Kameyama (JP); Hidekazu Yamanaka, Kameyama (JP); Hiroyuki Adachi, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 17/539,515

(22) Filed: Dec. 1, 2021

(65) Prior Publication Data
US 2022/0246104 A1 Aug. 4, 2022

(30) Foreign Application Priority Data
Jan. 29, 2021 (JP) ................ 2021-013784

(51) Int. Cl.
*G09G 3/36* (2006.01)
*G11C 19/28* (2006.01)

(52) U.S. Cl.
CPC .............. *G09G 3/36* (2013.01); *G11C 19/28* (2013.01); *G09G 3/3674* (2013.01); *G09G 2300/0814* (2013.01); *G09G 2310/0267* (2013.01); *G09G 2310/0283* (2013.01); *G09G 2310/0286* (2013.01); *G09G 2310/08* (2013.01)

(58) Field of Classification Search
CPC ............ G09G 3/36; G09G 2300/0814; G09G 2310/0286; G09G 2310/08; G09G 3/3674; G09G 2310/0267; G09G 2310/0283; G11C 19/28
See application file for complete search history.

(56) References Cited

U.S. PATENT DOCUMENTS

| 5,859,630 A | 1/1999 | Huq | |
|---|---|---|---|
| 2008/0122774 A1* | 5/2008 | Jo | G09G 3/3677 345/94 |
| 2008/0170009 A1* | 7/2008 | Eom | G09G 3/3266 345/76 |
| 2009/0021509 A1* | 1/2009 | Lee | G09G 3/3677 345/213 |

(Continued)

FOREIGN PATENT DOCUMENTS

| JP | 4165907 B2 | 10/2008 |
|---|---|---|
| JP | 2008-276849 A | 11/2008 |
| JP | 2012-009097 A | 1/2012 |

*Primary Examiner* — Adam J Snyder
(74) *Attorney, Agent, or Firm* — ScienBiziP, P.C.

(57) ABSTRACT

A signal obtained through sampling a gate start pulse signal GSP by using one of a plurality of gate clock signals is supplied as a shift pulse for a forward shift action (a forward shift start pulse signal) to the first stage of a plurality of stages constituting a bidirectional shift register, and a signal obtained through sampling the gate start pulse signal GSP by using another one of the plurality of gate clock signals is supplied as a shift pulse for a backward shift action (a backward shift start pulse signal) to the last stage of the plurality of stages constituting the bidirectional shift register.

9 Claims, 49 Drawing Sheets

(56) References Cited

U.S. PATENT DOCUMENTS

| | | | |
|---|---|---|---|
| 2009/0129535 A1* | 5/2009 | Chen | G11C 19/18 377/69 |
| 2009/0262058 A1* | 10/2009 | Pak | G09G 3/3677 345/92 |
| 2011/0316831 A1 | 12/2011 | Ochiai et al. | |
| 2015/0116385 A1* | 4/2015 | Lee | G09G 3/3607 345/694 |
| 2015/0279480 A1* | 10/2015 | Murakami | G09G 3/3677 345/100 |
| 2017/0110077 A1* | 4/2017 | Tobita | G09G 3/3677 |

* cited by examiner

BIDIRECTIONAL SHIFT REGISTER PERFORMING SHIFT ACTION BASED ON CLOCK SIGNALS AND DISPLAY DEVICE PROVIDED WITH SAME

CROSS-REFERENCE TO RELATED APPLICATIONS

This application claims the benefit of priority to Japanese Patent Application Number 2021-013784 filed on Jan. 29, 2021. The entire contents of the above-identified application are hereby incorporated by reference.

BACKGROUND

Technical Field

The following disclosure relates to a bidirectional shift register, and more specifically relates to a bidirectional shift register constituting a gate driver (scanning signal line drive circuit) to drive gate bus lines (scanning signal lines) of a display device.

A liquid crystal display device that includes a display portion including a plurality of source bus lines (image signal lines) and a plurality of gate bus lines (scanning signal lines) has been known. In such a liquid crystal display device, a pixel forming section that forms a pixel is provided at each of intersections of the source bus lines and the gate bus lines. Each pixel forming section includes a thin film transistor (TFT) serving as a switching element, in which a gate terminal is connected to a gate bus line passing through a corresponding intersection and a source terminal is connected to a source bus line passing through the corresponding intersection, a pixel capacitance configured to hold a pixel voltage value, and the like. The liquid crystal display device also includes a gate driver (a scanning signal line drive circuit) for driving the gate bus lines and a source driver (an image signal line drive circuit) for driving the source bus lines.

An image signal indicating a pixel voltage value is transmitted through the source bus lines. However, each source bus line is incapable of transmitting image signals indicating pixel voltage values for a plurality of rows at one time (at the same time). Thus, image signals are sequentially written (charged) into pixel capacitances in a plurality of pixel forming sections provided in the display portion on a row-by-row basis. In order to achieve the writing scheme, the gate driver is constituted of a shift register having a plurality of stages in such a manner as to sequentially select a plurality of gate bus lines for each predetermined period. Then, active scanning signals are sequentially output from the plurality of stages to cause the image signals to be sequentially written into the pixel capacitances on the row-by-row basis as described above. Hereinafter, a circuit constituting each of the stages of the shift register is also referred to as a "unit circuit".

A configuration that enables switching of scanning sequences (scanning directions) of gate bus lines has been proposed with regard to a display device. The switching of scanning sequences of the gate bus lines is achieved by providing a shift register with a function to switch shift directions (transfer directions of shift pulses). The shift register having a function to switch the shift directions is referred to as a "bidirectional shift register". In a liquid crystal display device, the writing of image signals is generally performed in a sequence from an upper portion toward a lower portion of the image; however, in a liquid crystal display device provided with the bidirectional shift register, it is also possible to perform the writing of the image signals in a sequence from the lower portion toward the upper portion of the image. This makes it possible to reverse an orientation of a display image by a simple scheme compared to a configuration in which a frame memory for buffering image data is provided and the sequence of the image data is changed by using the frame memory. In the following, an operation in which a shift pulse is transferred from the first stage toward the last stage in a bidirectional shift register is referred to as a "forward shift", while an operation in which the shift pulse is transferred from the last stage toward the first stage in the bidirectional shift register is referred to as a "backward shift".

FIG. 44 is a block diagram illustrating a configuration example of a bidirectional shift register 90 constituting a gate driver of a known liquid crystal display device. The bidirectional shift register 90 includes a plurality of unit circuits 9 corresponding one-to-one to a plurality of gate bus lines disposed in a display portion. It is assumed that the number of gate bus lines is i, and that the bidirectional shift register 90 includes i unit circuits of 9(1) to 9(i).

As illustrated in FIG. 44, the bidirectional shift register 90 is supplied with a gate start pulse signal GSP, a gate clock signal GCK, a forward shift control signal UD, and a backward shift control signal UDB. In this example, the gate clock signal GCK is a three-phase clock signal constituted of first to third gate clock signals GCK1 to GCK3.

Each unit circuit 9 includes an input terminal that receives any of the first to third gate clock signals GCK1 to GCK3 as an input gate clock signal GCKin, an input terminal that receives the forward shift control signal UD, an input terminal that receives the backward shift control signal UDB, an input terminal that receives an output signal Q of the unit circuit 9 of the previous stage as a first set signal S1, an input terminal that receives an output signal Q of the unit circuit 9 of the next stage as a second set signal S2, and an output terminal for outputting an output signal Q. However, the gate start pulse signal GSP is supplied to the unit circuit 9(1) of the first stage as the first set signal S1, and the gate start pulse signal GSP is supplied as the second set signal S2 to the unit circuit 9(i) of the last stage.

FIG. 45 is a circuit diagram illustrating a configuration example of the unit circuit 9. As illustrated in FIG. 45, the unit circuit 9 includes 10 thin film transistors Tr91 to Tr99 and Tr9a, a capacitor (capacitance element) C9, and a resistor R9. In FIG. 45, an input terminal that receives the input gate clock signal GCKin is denoted by a reference sign 910, and an output terminal that outputs the output signal Q is denoted by a reference sign 919.

Action of the unit circuit 9 will be described with reference to FIGS. 46 and 47. For convenience, a node connected to a control terminal (gate) of the thin film transistor Tr99 is referred to as a "node VC", and a node connected to a control terminal of the thin film transistor Tr9a is referred to as a "node VCB".

When a forward shift is performed, as illustrated in FIG. 46, the forward shift control signal UD is maintained at a high level, and the backward shift control signal UDB is maintained at a low level. Thus, the thin film transistors Tr91 and Tr94 are maintained in an on state, and the thin film transistors Tr92 and Tr93 are maintained in an off state. With this, the first set signal S1 is supplied to a control terminal of the thin film transistor Tr95, and the second set signal S2 is supplied to a control terminal of the thin film transistor Tr96. Under the above assumption, when the first set signal S1 changes from the low level to the high level in a period T91, the thin film transistor Tr95 is brought into the on state and the capacitor C9 is charged. This raises a potential of the node VC, so that the thin film transistor Tr99 is brought into the on state. The input gate clock signal GCKin is at the low level during the period T91. Thus, during the period T91, the output signal Q is maintained at the low level. With the increase in potential of the node VC, the thin film transistor Tr97 is brought into the on state and the potential of the node VCB drops, whereby the thin film transistor Tr9a is brought into the off state. When the input gate clock signal GCKin changes from the low level to the high level in a period T92, since the thin film transistor Tr99 is in the on state, the potential of the output terminal 919 rises along with the rise of the potential of the input terminal 910. Since the capacitor C9 is provided between the node VC and the output terminal 919 as illustrated in FIG. 45, the potential of the node VC rises along with the rise of the potential of the output terminal 919 (the node VC is brought into a boost state). As a result, a high voltage is applied to the control terminal of the thin film transistor Tr99, and the potential of the output signal Q is raised up to the high level potential of the input gate clock signal GCKin. Consequently, a gate bus line connected to the output terminal 919 of the unit circuit 9 is set to be in a selection state. When the input gate clock signal GCKin changes from the high level to the low level in a period T93, the potential of the output terminal 919 (the potential of the output signal Q) decreases along with the decrease in potential of the input terminal 910, and the potential of the node VC also decreases via the capacitor C9. Further, in the period T93, the second set signal S2 changes from the low level to the high level. With this, the thin film transistor Tr96 is brought into the on state, so that the potential of the node VC is completely lowered down to the low level. This brings the thin film transistor Tr97 into the off state, and the potential of the node VCB rises due to the presence of the resistor R9, which functions as a pull-up resistor. As a result, the thin film transistor Tr9a is brought into the on state, and the potential of the output terminal 919 (potential of the output signal Q) is set to be at the low level.

When a backward shift is performed, as illustrated in FIG. 47, the forward shift control signal UD is maintained at the low level, and the backward shift control signal UDB is maintained at the high level. Thus, the thin film transistors Tr91 and Tr94 are maintained in the off state, and the thin film transistors Tr92 and Tr93 are maintained in the on state. With this, the first set signal S1 is supplied to the control terminal of the thin film transistor Tr96, and the second set signal S2 is supplied to the control terminal of the thin film transistor Tr95. Under the above assumption, when the second set signal S2 changes from the low level to the high level in a period T96, the potential of the node VC rises in the same manner as in the period T91. When the input gate clock signal GCKin changes from the low level to the high level in a period T97, the potential of the output signal Q is raised up to the high level potential of the input gate clock signal GCKin in the same manner as in the period T92. In a period T98, the input gate clock signal GCKin changes from the high level to the low level, and the first set signal S1 changes from the low level to the high level. Thus, as in the period T93, the potential of the node VC and the potential of the output signal Q are set to be at the low level.

As each unit circuit 9 acts in the manner described above, the forward shift is performed as illustrated in FIG. 48 by generating clock pulses in the order of the "first gate clock signal GCK1, second gate clock signal GCK2, and third gate clock signal GCK3" in the configuration illustrated in FIG. 44. Further, the backward shift is performed as illustrated in FIG. 49 by generating clock pulses in the order of the "third gate clock signal GCK3, second gate clock signal GCK2, and first gate clock signal GCK1" in the configuration illustrated in FIG. 44.

However, according to the above-described bidirectional shift register 90, signals for switching the shift directions (the forward shift control signal UD and the backward shift control signal UDB) are needed, and switch circuits (a switch circuit including the thin film transistors Tr91 and Tr92 and a switch circuit including the thin film transistors Tr93 and Tr94) are needed in the unit circuit 9. Thus, an increase in the circuit area is inevitable.

JP 4165907 B discloses a bidirectional shift register that enables switching of shift directions without using a signal for switching the shift directions. In this bidirectional shift register, switching of shift directions is performed by interchanging, among three-phase clock signals (C1, C2, and C3), the clock signal C1 and the clock signal C3.

JP 2012-9097 A discloses a bidirectional shift register that is provided with a trigger signal generator configured to generate a forward trigger signal for starting a forward shift and a backward trigger signal for starting a backward shift, and performs shift action using four-phase clock signals. In this bidirectional shift register, a trigger signal (the forward trigger signal or backward trigger signal) corresponding to the shift direction is generated by the trigger signal generator, and the generation sequence of pulses of the four-phase clock signals is changed so as to switch the shift directions.

JP 2008-276849 A discloses a display device including a shift register that performs a forward shift and a shift register that performs a backward shift. In this display device, switching of the shift registers configured to perform the shift action is carried out based on a scan direction switching signal.

SUMMARY

According to the configurations disclosed in JP 2012-9097 A and JP 2008-276849 A, a signal for switching the shift directions is needed. According to the configuration disclosed in JP 4165907 B, a signal for switching the shift directions is unnecessary, but two gate start pulse signals (shift start signals) are needed to indicate the start of the shift action. This is described below.

In general, as for a bidirectional shift register, a dummy stage for resetting the internal state of the last stage when the forward shift is performed is provided on the subsequent stage side of the last stage, and another dummy stage for resetting the internal state of the first stage when the backward shift is performed is provided on the preceding stage side of the first stage. An initialization signal is required to reset the internal states of the dummy stages. Furthermore, in the bidirectional shift register, different signals are required to be supplied, as gate start pulse signals, to the first stage and the last stage. In a case where the same signal is supplied to the first stage and the last stage as the gate start pulse signal, an unnecessary pulse is output from the last stage at the shift action start time when the forward shift is performed, and an unnecessary pulse is output from the first stage at the shift action start time when the backward shift is performed, for example. This causes a problem to occur. As described above, even with the configuration disclosed in JP 4165907 B, the increase in the circuit area is inevitable because the number of signals needed to control the shift directions increases.

Thus, an object of the disclosure given below is to achieve a bidirectional shift register having a smaller circuit area than the known bidirectional shift registers, and being able to switch shift directions without causing a problem.

(1) A bidirectional shift register according to some embodiments of the present disclosure is a bidirectional shift register configured to perform shift action based on a plurality of clock signals of three or more phases and including a plurality of stages, wherein a signal obtained through sampling a shift start signal by using one of the plurality of clock signals is supplied as a shift pulse for a forward shift action to the first stage of the plurality of stages, and a signal obtained through sampling the shift start signal by using another one of the plurality of clock signals is supplied as a shift pulse for a backward shift action to the last stage of the plurality of stages.

(2) The bidirectional shift register according to some embodiments of the present disclosure includes the above-described configuration (1), wherein the sampling of the shift start signal is performed by transistors.

(3) The bidirectional shift register according to some embodiments of the present disclosure includes the above-described configuration (2), and further includes as the transistors configured to perform the sampling of the shift start signal, a first transistor including a control terminal to be supplied with the one of the plurality of clock signals, a first conduction terminal to be supplied with the shift start signal, and a second conduction terminal connected to the first stage of the plurality of stages, and a second transistor including a control terminal to be supplied with the other one of the plurality of clock signals, a first conduction terminal to be supplied with the shift start signal, and a second conduction terminal connected to the last stage of the plurality of stages.

(4) The bidirectional shift register according to some embodiments of the present disclosure includes the above-described configuration (1), wherein the sampling of the shift start signal is performed by logic circuits.

(5) The bidirectional shift register according to some embodiments of the present disclosure includes the above-described configuration (4), and further includes as the logic circuits configured to perform the sampling of the shift start signal, a first logic circuit configured to output a signal indicating a logical product of the one of the plurality of clock signals and the shift start signal, and a second logic circuit configured to output a signal indicating a logical product of the other one of the plurality of clock signals and the shift start signal.

(6) The bidirectional shift register according to some embodiments of the present disclosure includes any one of the above-described configurations (1) to (5), wherein the number of phases of the plurality of clock signals is three, and the number of the plurality of stages is 3K or (3K+1), where K is a natural number.

(7) The bidirectional shift register according to some embodiments of the present disclosure includes any one of the above-described configurations (1) to (5), wherein the number of phases of the plurality of clock signals is four, and the internal state of a unit circuit constituting each stage of the plurality of stages is reset based on one of the plurality of clock signals.

(8) The bidirectional shift register according to some embodiments of the present disclosure includes any one of the above-described configurations (1) to (7), wherein a pulse width of the shift start signal is equal to a pulse width of at least one of the plurality of clock signals.

(9) A display device according to some embodiments of the present disclosure includes a display portion in which a plurality of scanning signal lines are disposed, a scanning signal line drive circuit configured to drive the plurality of scanning signal lines, and a display control circuit configured to control action of the scanning signal line drive circuit, wherein the scanning signal line drive circuit includes the bidirectional shift register having any one of the above-described configurations (1) to (8), in which the plurality of stages are provided corresponding one-to-one to the plurality of scanning signal lines, and the display control circuit causes a generation sequence of pulses of the plurality of clock signals that are supplied to the scanning signal line drive circuit to differ at a time of performing a forward shift action and at a time of performing a backward shift action.

According to the bidirectional shift register according to some embodiments of the present disclosure, it is possible to switch shift directions by simply changing the generation sequence of pulses of multi-phase clock signals by using only one shift start signal as a signal for switching the shift directions. Since the shift pulse for the forward shift action and the shift pulse for the backward shift action are obtained through sampling the shift start signal by using mutually different clock signals, the shift pulses are not input at the same timing to the first stage and the last stage. This prevents occurrence of a problem. Thus, there is achieved a bidirectional shift register having a smaller circuit area than the known bidirectional shift registers, and being able to switch the shift directions without causing a problem.

BRIEF DESCRIPTION OF DRAWINGS

The disclosure will be described with reference to the accompanying drawings, wherein like numbers reference like elements.

DESCRIPTION OF EMBODIMENTS

Embodiments will be described below with reference to the accompanying drawings. Of the drain and the source of an n-channel transistor, the drain is a portion having a higher potential, and of the drain and the source of a p-channel transistor, the source is a portion having a higher potential. However, in some thin film transistors among the thin film transistors used in the following embodiments, the drain and the source are switched during the action. Thus, in the following description, one of two terminals configured to function as the drain and the source is referred to as a "first conduction terminal" and the other one thereof is referred to as a "second conduction terminal". A terminal configured to function as the gate of a thin film transistor is referred to as a "control terminal".

Figure 2:
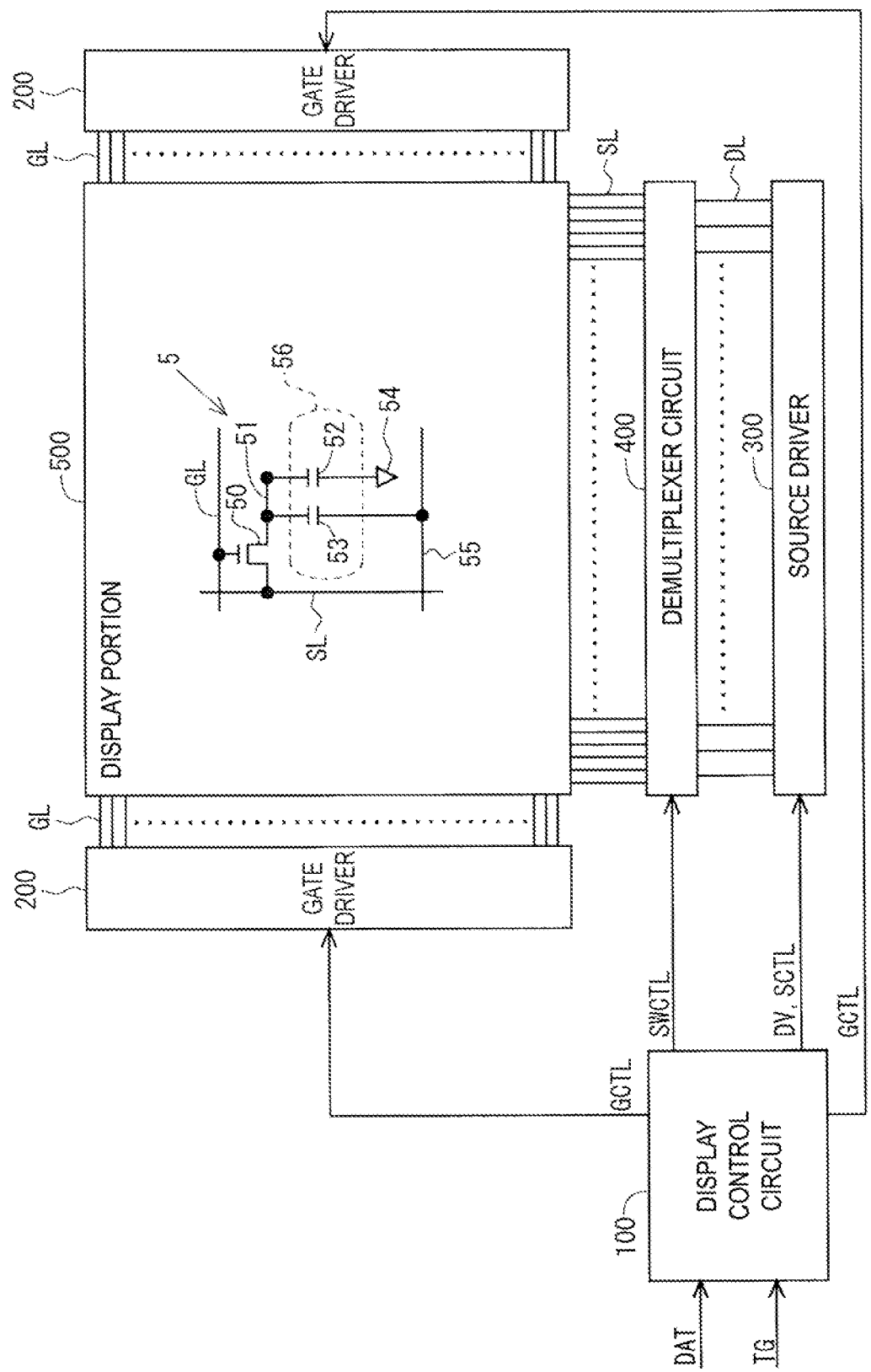
FIG. 2 is a block diagram illustrating an overall configuration of a liquid crystal display device in all embodiments.

0. Configurations Common to All Embodiments 0.1 Overall Configuration and Action Outline FIG. 2 is a block diagram illustrating an overall configuration of a liquid crystal display device in all embodiments. The liquid crystal display device includes a display control circuit 100, a gate driver (scanning signal line drive circuit) 200, a source driver (image signal line drive circuit) 300, a demultiplexer circuit 400, and a display portion 500. In FIG. 2, the gate drivers 200 are provided on both one end side and the other end side of the display portion 500, but the gate driver 200 may be provided on only one of the above-described two sides.

In the display portion 500, there are disposed a plurality of source bus lines (image signal lines) SL and a plurality of gate bus lines (scanning signal lines) GL. A pixel forming section 5 for forming a pixel is provided corresponding to each of intersections between the plurality of source bus lines SL and the plurality of gate bus lines GL. In other words, the display portion 500 includes a plurality of the pixel forming sections 5. Each pixel forming section 5 includes a thin film transistor (pixel TFT) 50 serving as a switching element, in which a control terminal is connected to the gate bus line GL passing through the corresponding intersection and a first conduction terminal is connected to the source bus line SL passing through the above corresponding intersection, a pixel electrode 51 connected to a second conduction terminal of the thin film transistor 50, a common electrode 54 and an auxiliary capacitance electrode 55 provided common to the plurality of pixel forming sections 5, a liquid crystal capacitance 52 formed of the pixel electrode 51 and the common electrode 54, and an auxiliary capacitance 53 formed of the pixel electrode 51 and the auxiliary capacitance electrode 55. A pixel capacitance 56 is constituted of the liquid crystal capacitance 52 and the auxiliary capacitance 53. In FIG. 2, only one pixel forming section 5 is illustrated.

The gate bus lines GL are connected to the gate drivers 200. The source bus lines SL are connected to the demultiplexer circuit 400. The demultiplexer circuit 400 and the source driver 300 are connected by data output lines DL. The number of data output lines DL is, for example, one third the number of source bus lines SL.

The display control circuit 100 receives an image signal DAT and a group of timing signals TG such as a horizontal synchronization signal, a vertical synchronization signal and the like sent from the outside, and outputs a digital video signal DV, a gate control signal GCTL for controlling the action of the gate driver 200, a source control signal SCTL for controlling the action of the source driver 300, and a switch control signal SWCTL for controlling the action of the demultiplexer circuit 400. The gate control signal GCTL includes a gate start pulse signal (shift start signal) and a gate clock signal, and the source control signal SCTL includes a source start pulse signal, a source clock signal, and a latch strobe signal.

The gate driver 200 repeats application of active scanning signals to each of the gate bus lines GL in one vertical scan period as a cycle, based on the gate control signal GCTL sent from the display control circuit 100.

Based on the digital video signal DV and the source control signal SCTL sent from the display control circuit 100, the source driver 300 outputs an image signal for driving by time division in each horizontal scan period with respect to the data output line DL corresponding to each of source bus line groups obtained by grouping the plurality of source bus lines SL, in which three source bus lines SL, for example, are taken as one set. At this time, the source driver 300 sequentially holds the digital video signal DV indicating a voltage to be applied to each data output line DL at a timing when a pulse of the source clock signal is generated. At a timing when a pulse of the latch strobe signal is generated, the held digital video signals DV are converted into analog voltages. The resultant analog voltages are concurrently applied to all of the data output lines DL as the drive image signals.

Figure 3:
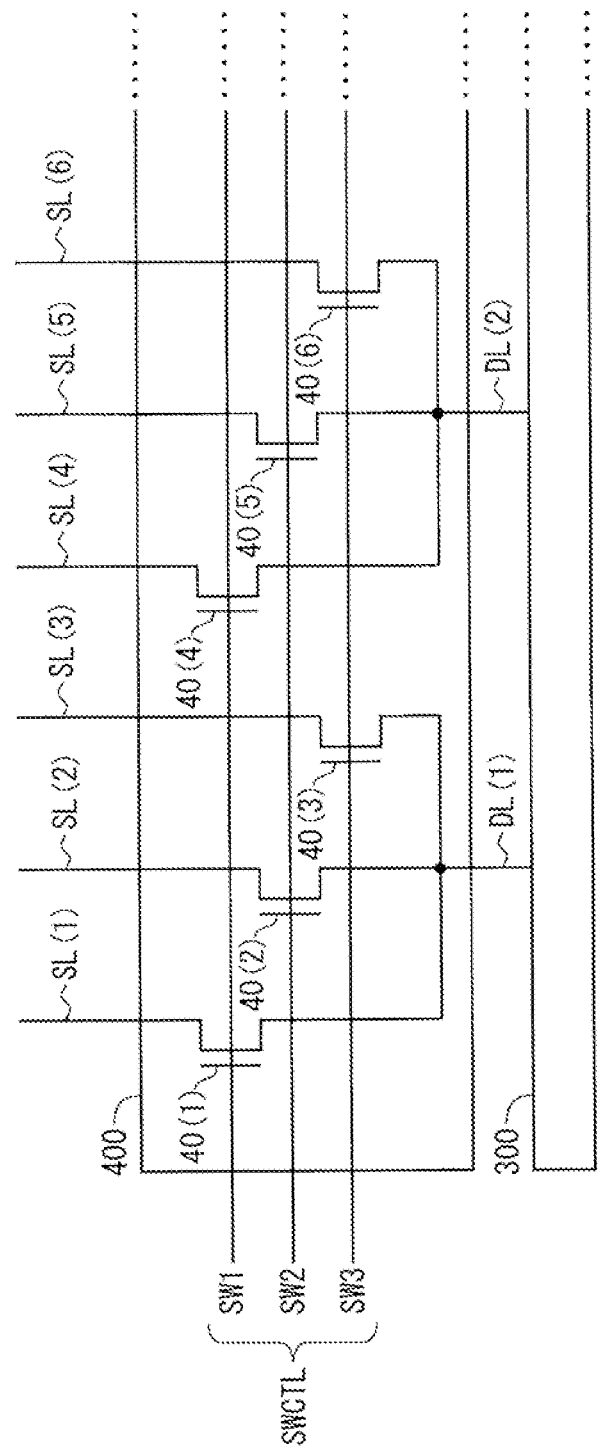
FIG. 3 is a circuit diagram illustrating a configuration example of a demultiplexer circuit in all embodiments.

The demultiplexer circuit 400 supplies the image signal sent from the source driver 300 through each data output line DL to any of the source bus lines SL corresponding to the image signal, based on the switch control signal SWCTL sent from the display control circuit 100. The demultiplexer circuit 400 has a configuration as illustrated in FIG. 3, for example. In the example illustrated in FIG. 3, first to third switch control signals SW1 to SW3 are input as the switch control signal SWCTL to the demultiplexer circuit 400. For example, when the image signal is to be applied to the source bus lines SL(1) and SL(4), the display control circuit 100 sets the first switch control signal SW1 to be a high level, and sets the second switch control signal SW2 and the third switch control signal SW3 to be a low level. As a result, thin film transistors 40(1) and 40(4) are turned on and thin film transistors 40(2), 40(3), 40(5), and 40(6) are turned off, whereby the data output line DL(1) is electrically connected to the source bus line SL(1), and the data output line DL(2) is electrically connected to the source bus line SL(4). By providing the demultiplexer circuit 400 as described above, connection destinations of each data output line DL are switched by time division in each horizontal scan period among three source bus lines SL.

As described above, the scanning signal is applied to the gate bus line GL, and the image signal is applied to the source bus line SL, whereby the image based on the image signal DAT sent from the outside is displayed in the display portion 500.

0.2 Schematic Configuration of Gate Driver

Figure 4:
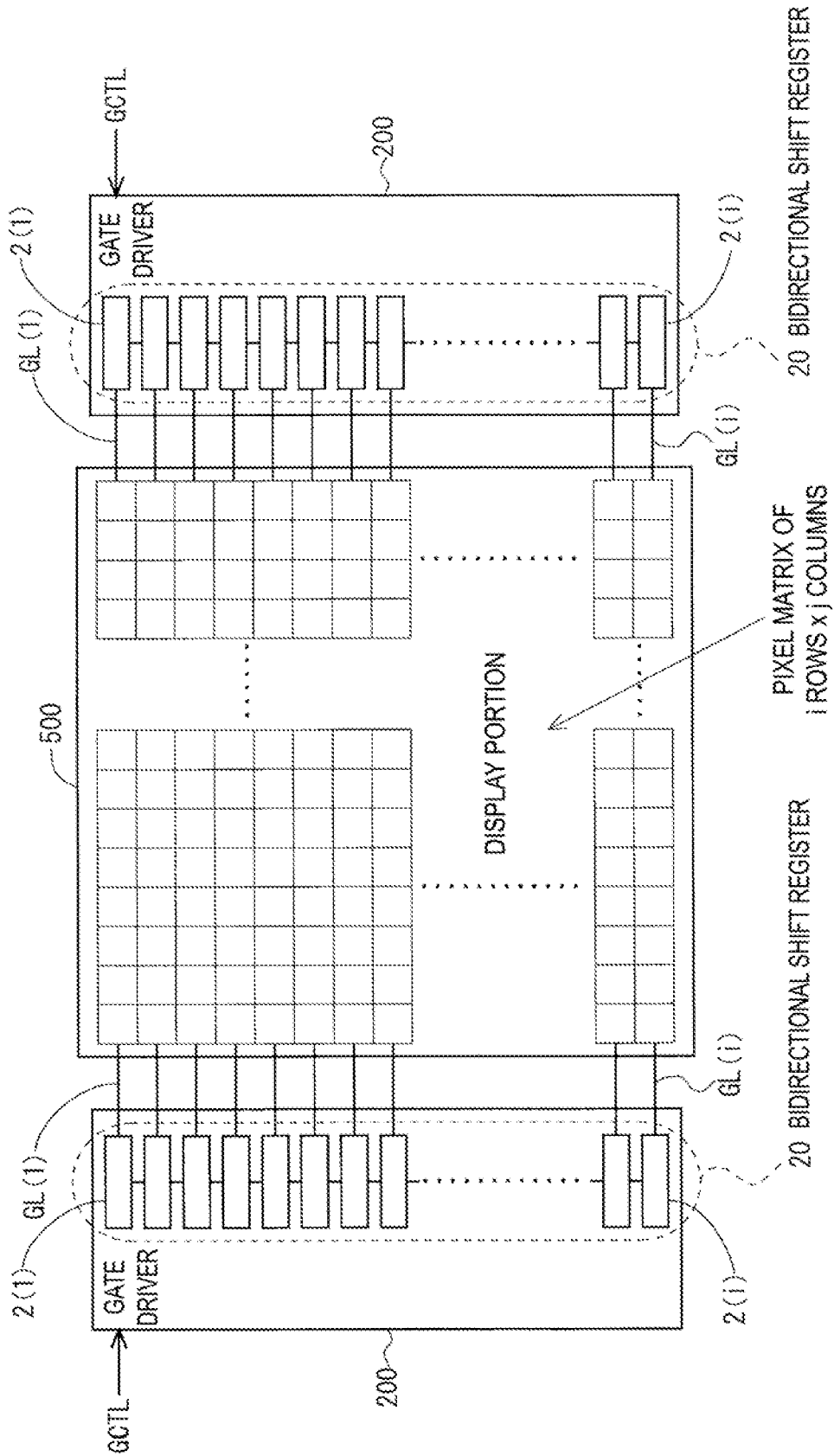
FIG. 4 is a block diagram for describing a schematic configuration of a gate driver in all embodiments.

FIG. 4 is a block diagram for describing a schematic configuration of the gate driver 200. As illustrated in FIG. 4, the gate driver 200 is configured by a bidirectional shift register 20 including a plurality of stages. In the display portion 500, there is formed a pixel matrix having i rows and j columns, and the respective stages of the bidirectional shift register 20 are provided to correspond one-to-one to the respective rows of the pixel matrix. In other words, the bidirectional shift register 20 includes i unit circuits of 2(1) to 2(i). In first to third embodiments, unit circuits to serve as dummy stages are provided on a preceding stage side relative to the first stage and on a subsequent stage side relative to the last stage.

Hereinafter, first to fifth embodiments will be described in sequence.

1. First Embodiment 1.1 Overall Configuration of Bidirectional Shift Register

Figure 1:
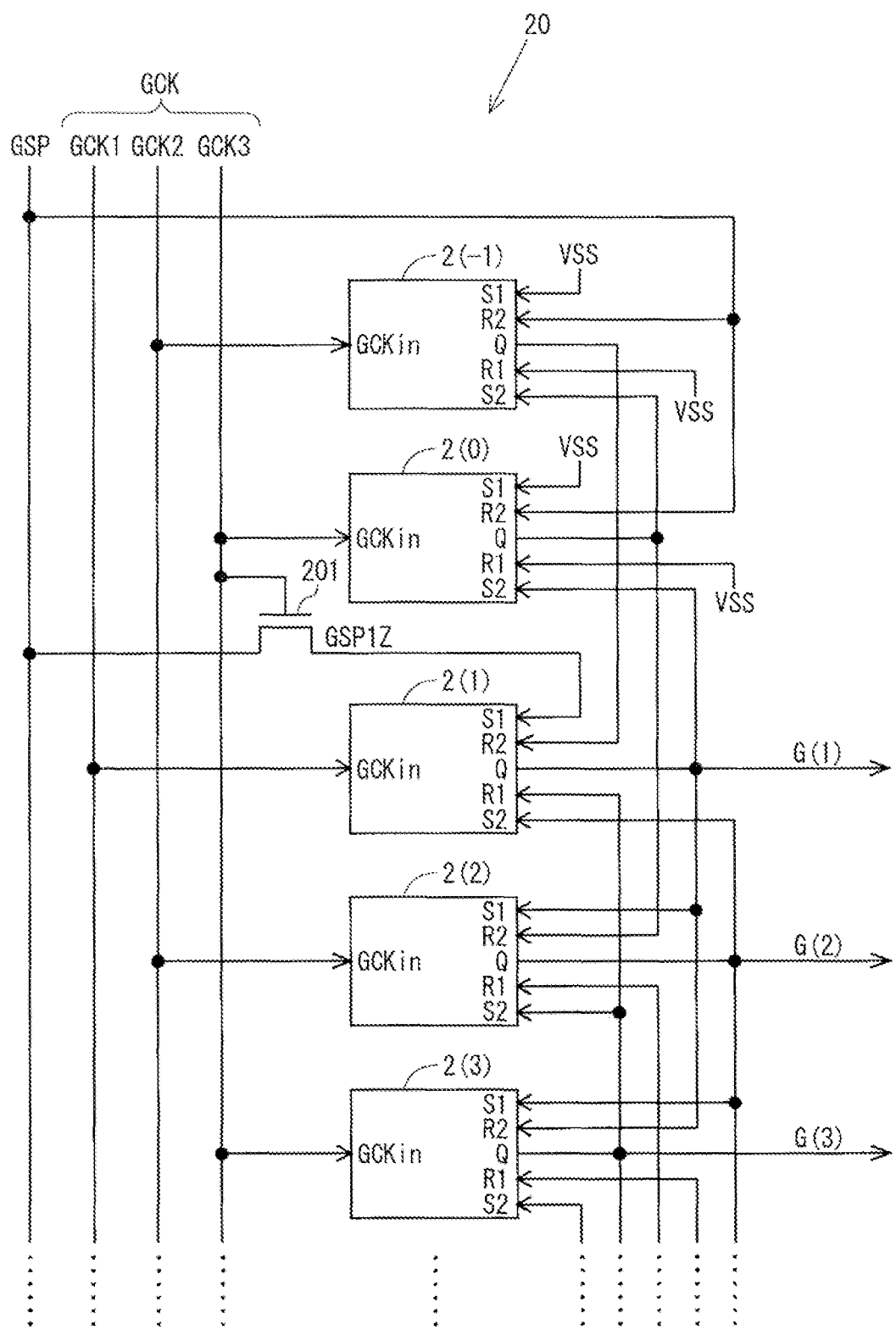
FIG. 1 is a block diagram illustrating a configuration near the first stage of a bidirectional shift register in a first embodiment.
Figure 5:
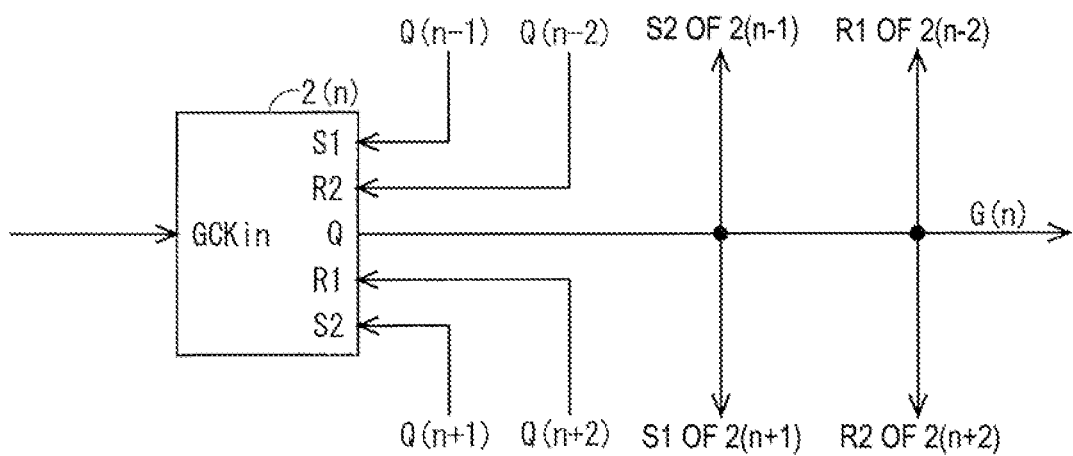
FIG. 5 is a diagram illustrating input and output signals of a unit circuit of the n-th stage in the first embodiment.
Figure 6:
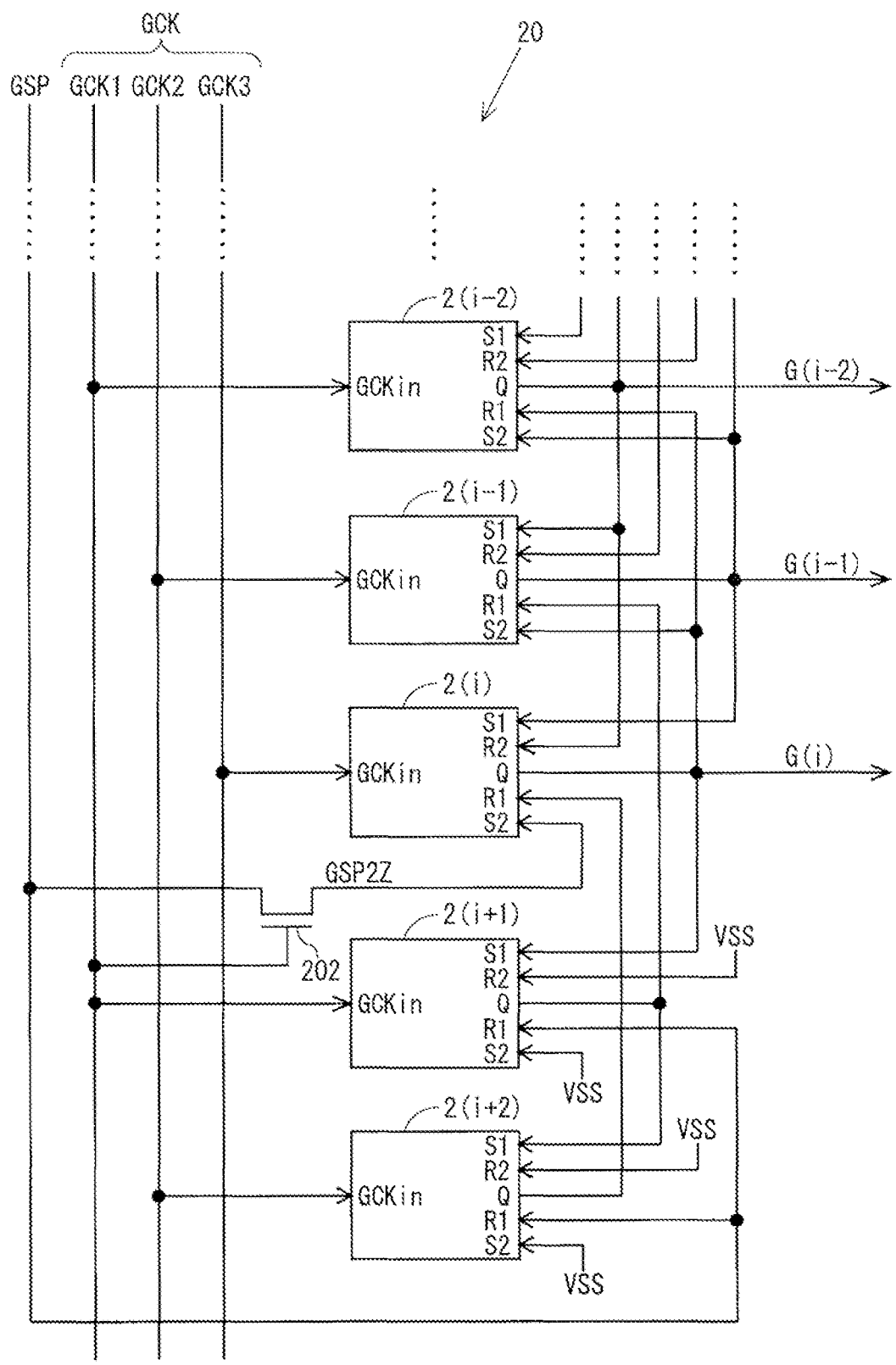
FIG. 6 is a block diagram illustrating a configuration near the last stage of a bidirectional shift register in the first embodiment.

FIG. 1 is a block diagram illustrating a configuration near the first stage of the bidirectional shift register 20. FIG. 5 is a diagram illustrating input and output signals of the unit circuit 2(n) of the n-th stage, where n is an integer in a range of 3 or more and (i−2) or less. FIG. 6 is a block diagram illustrating a configuration near the last stage of the bidirectional shift register 20. In the present embodiment, i is a multiple of 3. As illustrated in FIGS. 1 and 6, the bidirectional shift register 20 in the present embodiment is supplied with first to third gate clock signals GCK1 to GCK3, which are three-phase clock signals, as a gate clock signal GCK. As is understood from FIG. 1, two unit circuits 2(−1) and 2(0) are provided as dummy stages on the preceding stage side relative to the first stage. Further, as is understood from FIG. 6, two unit circuits 2(i+1) and 2(i+2) are provided as dummy stages on the subsequent stage side relative to the last stage. The unit circuits 2(1) to 2(i) from the first stage to the last stage are connected to the gate bus lines GL disposed in the display portion 500.

Each unit circuit 2 includes an input terminal that receives any of the first to third gate clock signals GCK1 to GCK3 as an input gate clock signal GCKin, an input terminal that receives a first set signal S1 (a shift pulse when a forward shift is performed), an input terminal that receives a second set signal S2 (a shift pulse when a backward shift is performed), an input terminal that receives a first reset signal R1, an input terminal that receives a second reset signal R2, and an output terminal for outputting an output signal Q.

Basically, each unit circuit 2 is supplied with the output signal Q of the preceding stage as the first set signal S1, supplied with the output signal Q of the subsequent stage as the second set signal S2, supplied with the output signal Q of the second subsequent stage as the first reset signal R1, and supplied with the output signal Q of the second preceding stage as the second reset signal R2 (see FIG. 5). However, a forward shift start pulse signal GSP1Z to be described below is supplied as the first set signal S1 to the unit circuit 2(1) of the first stage (see FIG. 1), and a backward shift start pulse signal GSP2Z to be described below is supplied as the second set signal S2 to the unit circuit 2(i) of the last stage (see FIG. 6). Two unit circuits 2(−1) and 2(0) as dummy stages provided on the preceding stage side relative to the first stage are each supplied with a low-level power supply voltage VSS as the first set signal S1 and the first reset signal R1, and supplied with a gate start pulse signal GSP as the second reset signal R2 (see FIG. 1). Furthermore, two unit circuits 2(i+1) and 2(i+2) as dummy stages provided on the subsequent stage side relative to the last stage are each supplied with the low-level power supply voltage VSS as the second set signal S2 and the second reset signal R2, and supplied with the gate start pulse signal GSP as the first reset signal R1 (see FIG. 6).

The input gate clock signal GCKin is a signal as follows. Note that Z is an integer. The unit circuit 2(3Z−2) of the (3Z−2)th stage is supplied with the first gate clock signal GCK1 as the input gate clock signal GCKin. The unit circuit 2(3Z−1) of the (3Z−1)th stage is supplied with the second gate clock signal GCK2 as the input gate clock signal GCKin. The unit circuit 2(3Z) of the 3Zth stage is supplied with the third gate clock signal GCK3 as the input gate clock signal GCKin.

The output signals Q of the unit circuits 2(1) to 2(i) from the first stage to the last stage are applied as scanning signals G(1) to G(i) to the gate bus lines GL(1) to GL(i), respectively.

In the present embodiment, a thin film transistor 201 as illustrated in FIG. 1 is provided in the vicinity of the first stage unit circuit 2(1). The thin film transistor 201 is constituted such that the control terminal is supplied with the third gate clock signal GCK3, the first conduction terminal is supplied with the gate start pulse signal GSP, and the second conduction terminal is connected to the input terminal for the first set signal S1 of the first stage unit circuit 2(1). Thus, a signal obtained through sampling the gate start pulse signal GSP by using the third gate clock signal GCK3 is supplied as the first set signal S1 to the first stage unit circuit 2(1). The signal obtained through sampling the gate start pulse signal GSP by using the third gate clock signal GCK3 functions as the forward shift start pulse signal GSP1Z for giving an instruction to start the forward shift action. As described above, in the present embodiment, the forward shift start pulse signal GSP1Z is generated through sampling the gate start pulse signal GSP by using the third gate clock signal GCK3, and the generated forward shift start pulse signal GSP1Z is supplied as the first set signal S1 to the first stage unit circuit 2(1).

In the present embodiment, a thin film transistor 202 as illustrated in FIG. 6 is provided in the vicinity of the last stage unit circuit 2(i). The thin film transistor 202 is constituted such that the control terminal is supplied with the first gate clock signal GCK1, the first conduction terminal is supplied with the gate start pulse signal GSP, and the second conduction terminal is connected to the input terminal for the second set signal S2 of the last stage unit circuit 2(i). Thus, a signal obtained through sampling the gate start pulse signal GSP by using the first gate clock signal GCK1 is supplied as the second set signal S2 to the last stage unit circuit 2(i). The signal obtained through sampling the gate start pulse signal GSP by using the first gate clock signal GCK1 functions as the backward shift start pulse signal GSP2Z for giving an instruction to start the backward shift action. As described above, in the present embodiment, the backward shift start pulse signal GSP2Z is generated through sampling the gate start pulse signal GSP by using the first gate clock signal GCK1, and the generated backward shift start pulse signal GSP2Z is supplied as the second set signal S2 to the last stage unit circuit 2(i).

In the present embodiment, the first transistor is achieved by the thin film transistor 201, and the second transistor is achieved by the thin film transistor 202.

1.2 Configuration and Action of Unit Circuit

Figure 7:
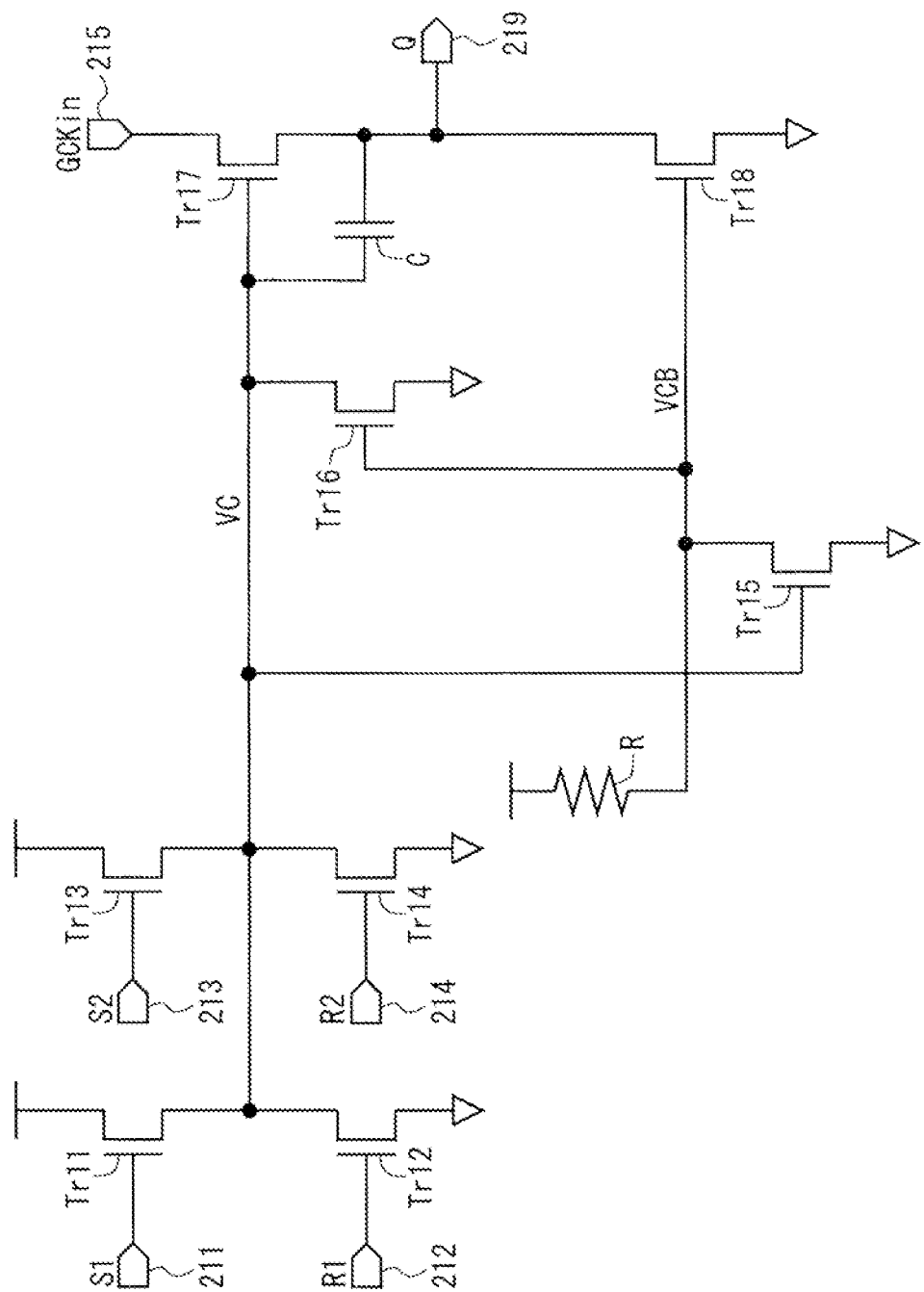
FIG. 7 is a circuit diagram illustrating a configuration of a unit circuit (configuration of one stage of a bidirectional shift register) in the first embodiment.

FIG. 7 is a circuit diagram illustrating a configuration of the unit circuit 2 (configuration of one stage of the bidirectional shift register 20) in the present embodiment. As illustrated in FIG. 7, the unit circuit 2 includes eight thin film transistors Tr11 to Tr18, a capacitor (capacitance element) C, and a resistor R. Each of the thin film transistors Tr11 to Tr18 is an n-channel thin film transistor. The unit circuit 2 includes, in addition to input terminals for a high-level DC power supply voltage VDD and the low-level DC power supply voltage VSS, five input terminals 211 to 215 and an output terminal 219. The input terminal for receiving the first set signal S1 is denoted by a reference sign 211, the input terminal for receiving the first reset signal R1 is denoted by a reference sign 212, the input terminal for receiving the second set signal S2 is denoted by a reference sign 213, the input terminal for receiving the second reset signal R2 is denoted by a reference sign 214, and the input terminal for receiving the input gate clock signal GCKin is denoted by a reference sign 215. The output terminal for outputting the output signal Q is denoted by a reference sign 219. A node connected to the control terminal of the thin film transistor Tr17 is referred to as a "node VC", and a node connected to the control terminal of the thin film transistor Tr18 is referred to as a "node VCB".

As for the thin film transistor Tr11, the control terminal is connected to the input terminal 211, the first conduction terminal is connected to an input terminal for the high-level DC power supply voltage VDD, and the second conduction terminal is connected to the node VC. As for the thin film transistor Tr12, the control terminal is connected to the input terminal 212, the first conduction terminal is connected to the node VC, and the second conduction terminal is connected to an input terminal for the low-level DC power supply voltage VSS. As for the thin film transistor Tr13, the control terminal is connected to the input terminal 213, the first conduction terminal is connected to an input terminal for the high-level DC power supply voltage VDD, and the second conduction terminal is connected to the node VC. As for the thin film transistor Tr14, the control terminal is connected to the input terminal 214, the first conduction terminal is connected to the node VC, and the second conduction terminal is connected to an input terminal for the low-level DC power supply voltage VSS. As for the thin film transistor Tr15, the control terminal is connected to the node VC, the first conduction terminal is connected to the node VCB, and the second conduction terminal is connected to an input terminal for the low-level DC power supply voltage VSS.

As for the thin film transistor Tr16, the control terminal is connected to the node VCB, the first conduction terminal is connected to the node VC, and the second conduction terminal is connected to an input terminal for the low-level DC power supply voltage VSS. As for the thin film transistor Tr17, the control terminal is connected to the node VC, the first conduction terminal is connected to the input terminal 215, and the second conduction terminal is connected to the output terminal 219. As for the thin film transistor Tr18, the control terminal is connected to the node VCB, the first conduction terminal is connected to the output terminal 219, and the second conduction terminal is connected to an input terminal for the low-level DC power supply voltage VSS.

One end of the capacitor C is connected to the node VC, and the other end thereof is connected to the output terminal 219. One end of the resistor R is connected to an input terminal for the high-level DC power supply voltage VDD, and the other end thereof is connected to the node VCB.

Figure 8:
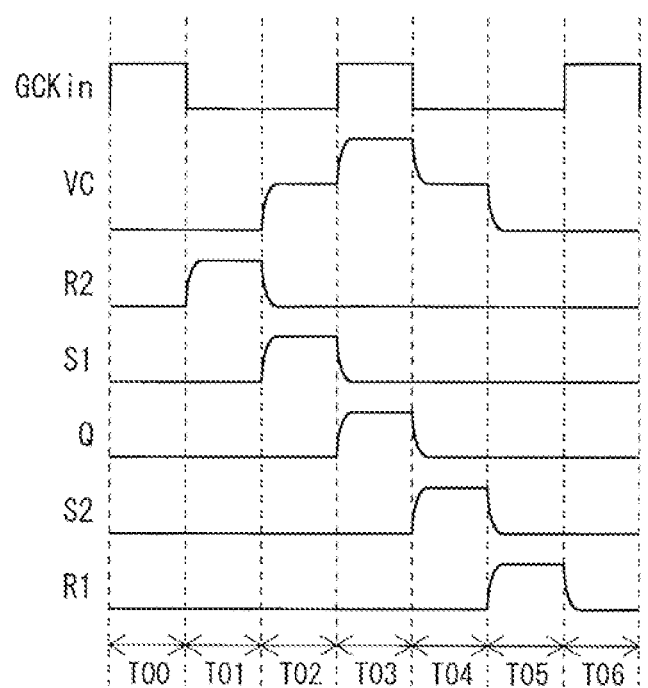
FIG. 8 is a signal waveform diagram for describing action of a unit circuit when a forward shift is performed in the first embodiment.

Action of the unit circuit 2 when a forward shift is performed will be described with reference to FIG. 8. In a period before a period T00 and in the period T00, the potential of the node VC, the second reset signal R2, the first set signal S1, the output signal Q, the second set signal S2, and the first reset signal R1 are at the low level.

In a period T01, the second reset signal R2 changes from the low level to the high level. With this, the thin film transistor Tr14 is turned on, but the potential of the node VC is at the low level, so that the state of the thin film transistor Tr17 does not change.

In a period T02, the second reset signal R2 changes from the high level to the low level. With this, the thin film transistor Tr14 is turned off. Further, in the period T02, the first set signal S1 changes from the low level to the high level. With this, the thin film transistor Tr11 is turned on, and the capacitor C is charged. As a result, the potential of the node VC rises, and the thin film transistor Tr17 is turned on. In the period T02, the input gate clock signal GCKin is at the low level. Due to this, during this period, the output signal Q is maintained at the low level.

In a period T03, the input gate clock signal GCKin changes from the low level to the high level. At this time, since the thin film transistor Tr17 is in an on state, the potential of the output terminal 219 rises along with the rise of the potential of the input terminal 215. Since the capacitor C is provided between the node VC and the output terminal 219 as illustrated in FIG. 7, the potential of the node VC rises along with the rise of the potential of the output terminal 219 (the node VC is brought into a boost state). As a result, a high voltage is applied to the control terminal of the thin film transistor Tr17, and the potential of the output signal Q is raised up to the high level potential of the input gate clock signal GCKin. Consequently, the gate bus line GL connected to the output terminal 219 of the unit circuit 2 is set to be in a selection state. During this period, since the thin film transistor Tr15 is maintained in the on state, the potential of the node VCB is maintained at the low level. This maintains the thin film transistor Tr18 in an off state, so that the potential of the output signal Q is not lowered during this period.

In a period T04, the input gate clock signal GCKin changes from the high level to the low level. As a result, the potential of the output terminal 219 (the potential of the output signal Q) is lowered as the potential of the input terminal 215 is lowered, and the potential of the node VC is also lowered through the capacitor C. Further, in the period T04, the second set signal S2 changes from the low level to the high level. With this, the thin film transistor Tr13 is turned on. Thus, the potential of the node VC is not lowered down to the low level.

In a period T05, the second set signal S2 changes from the high level to the low level. With this, the thin film transistor Tr13 is turned off. Further, in the period T05, the first reset signal R1 changes from the low level to the high level. With this, the thin film transistor Tr12 is turned on. As a result, the potential of the node VC is lowered completely down to the low level. With the drop in potential of the node VC down to the low level, the thin film transistor Tr15 is brought into the off state, and the potential of the node VCB rises due to the presence of the resistor R, which functions as a pull-up resistor. As a result, the thin film transistor Tr18 is brought into the on state, and the potential of the output terminal 219 (potential of the output signal Q) is completely dropped to the low level.

Figure 9:
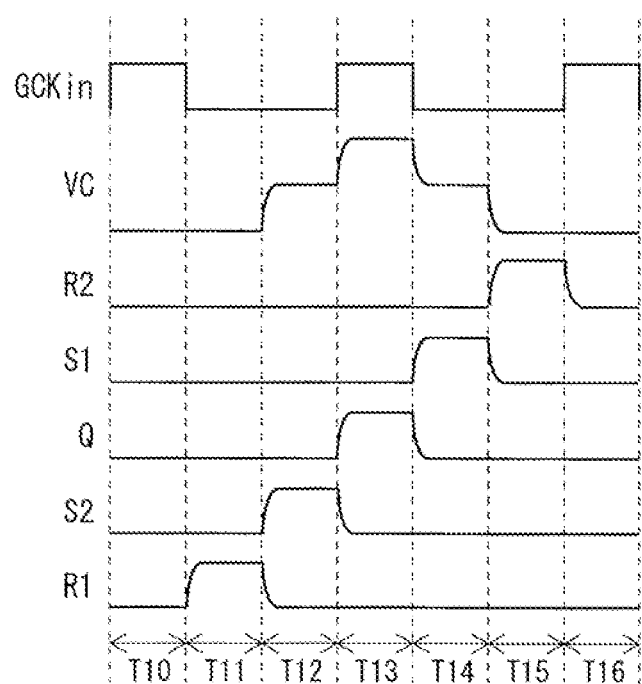
FIG. 9 is a signal waveform diagram for describing action of a unit circuit when a backward shift is performed in the first embodiment.

Action of the unit circuit 2 when a backward shift is performed will be described with reference to FIG. 9. In a period before a period T10 and in the period T10, the potential of the node VC, the second reset signal R2, the first set signal S1, the output signal Q, the second set signal S2, and the first reset signal R1 are at the low level.

In a period T11, the first reset signal R1 changes from the low level to the high level. With this, the thin film transistor Tr12 is turned on, but the potential of the node VC is at the low level, so that the state of the thin film transistor Tr17 does not change.

In a period T12, the first reset signal R1 changes from the high level to the low level. With this, the thin film transistor Tr12 is turned off. Further, in the period T12, the second set signal S2 changes from the low level to the high level. With this, the thin film transistor Tr13 is turned on, and the capacitor C is charged. As a result, the potential of the node VC rises, and the thin film transistor Tr17 is turned on. During the period T12, the input gate clock signal GCKin is at the low level. Due to this, during this period, the output signal Q is maintained at the low level.

In a period T13, the input gate clock signal GCKin changes from the low level to the high level. As a result, like in the above-described period T03, the potential of the output signal Q rises up to the high level potential of the input gate clock signal GCKin, and the gate bus line GL connected to the output terminal 219 of the unit circuit 2 is set to be in the selection state.

In a period T14, the input gate clock signal GCKin changes from the high level to the low level. As a result, the potential of the output terminal 219 (the potential of the output signal Q) is lowered as the potential of the input terminal 215 is lowered, and the potential of the node VC is also lowered through the capacitor C. Further, in the period T14, the first set signal S1 changes from the low level to the high level. With this, the thin film transistor Tr11 is turned on. Thus, the potential of the node VC is not lowered down to the low level.

In a period T15, the first set signal S1 changes from the high level to the low level. With this, the thin film transistor Tr11 is turned off. Further, in the period T15, the second reset signal R2 changes from the low level to the high level. With this, the thin film transistor Tr14 is turned on. As a result, the potential of the node VC is lowered completely down to the low level. Furthermore, as in the above-described period T05, the potential of the output terminal 219 (potential of the output signal Q) is completely dropped to the low level.

1.3 Overall Action of Bidirectional Shift Register

Overall action of the bidirectional shift register 20 when a forward shift is performed will be described with reference to FIG. 10. Note that the node VC in the unit circuit 2(1) of the first stage is represented as "VC(1)", and the node VC in the unit circuit 2(i) of the last stage is represented as "VC(i)". When the forward shift is performed, the gate start pulse signal GSP and the third gate clock signal GCK3 are set to be at the high level in a period P0. As described above, the forward shift start pulse signal GSP1Z is obtained through sampling the gate start pulse signal GSP by using the third gate clock signal GCK3, while the backward shift start pulse signal GSP2Z is obtained through sampling the gate start pulse signal GSP by using the first gate clock signal GCK1. Accordingly, during the period P0, the forward shift start pulse signal GSP1Z is at the high level, but the backward shift start pulse signal GSP2Z is maintained at the low level. Thus, the potential of the node VC(1) rises, but the potential of the node VC(i) is maintained at the low level. Because of this, problems like those caused in the known techniques do not occur. Thereafter, the clock pulses are repeatedly generated in the order of the "first gate clock signal GCK1, second gate clock signal GCK2, and third gate clock signal GCK3", so that the output signals Q(1) to Q(i) of the unit circuits 2(1) to 2(i) from the first stage to the last stage are each sequentially set to be at the high level for a predetermined period in a period indicated by an arrow mark denoted by a reference sign 60 in FIG. 10. As a result, the writing of the image signal to the pixel capacitance 56 is performed in a sequence from the upper portion toward the lower portion of the image.

Next, overall action of the bidirectional shift register 20 when a backward shift is performed will be described with reference to FIG. 11. When the backward shift is performed, the gate start pulse signal GSP and the first gate clock signal GCK1 are set to be at the high level in a period P1. With this, during the period P1, the backward shift start pulse signal GSP2Z is at the high level, but the forward shift start pulse signal GSP1Z is maintained at the low level. Thus, the potential of the node VC(i) rises, but the potential of the node VC(1) is maintained at the low level. Because of this, problems like those caused in the known techniques do not occur. Thereafter, the clock pulses are repeatedly generated in the order of the "third gate clock signal GCK3, second gate clock signal GCK2, and first gate clock signal GCK1", so that the output signals Q(i) to Q(1) of the unit circuits 2(i) to 2(1) from the last stage to the first stage are each sequentially set to be at the high level for a predetermined period in a period indicated by an arrow mark denoted by a reference sign 61 in FIG. 11. As a result, the writing of the image signal to the pixel capacitance 56 is performed in a sequence from the lower portion toward the upper portion of the image.

Figure 10:
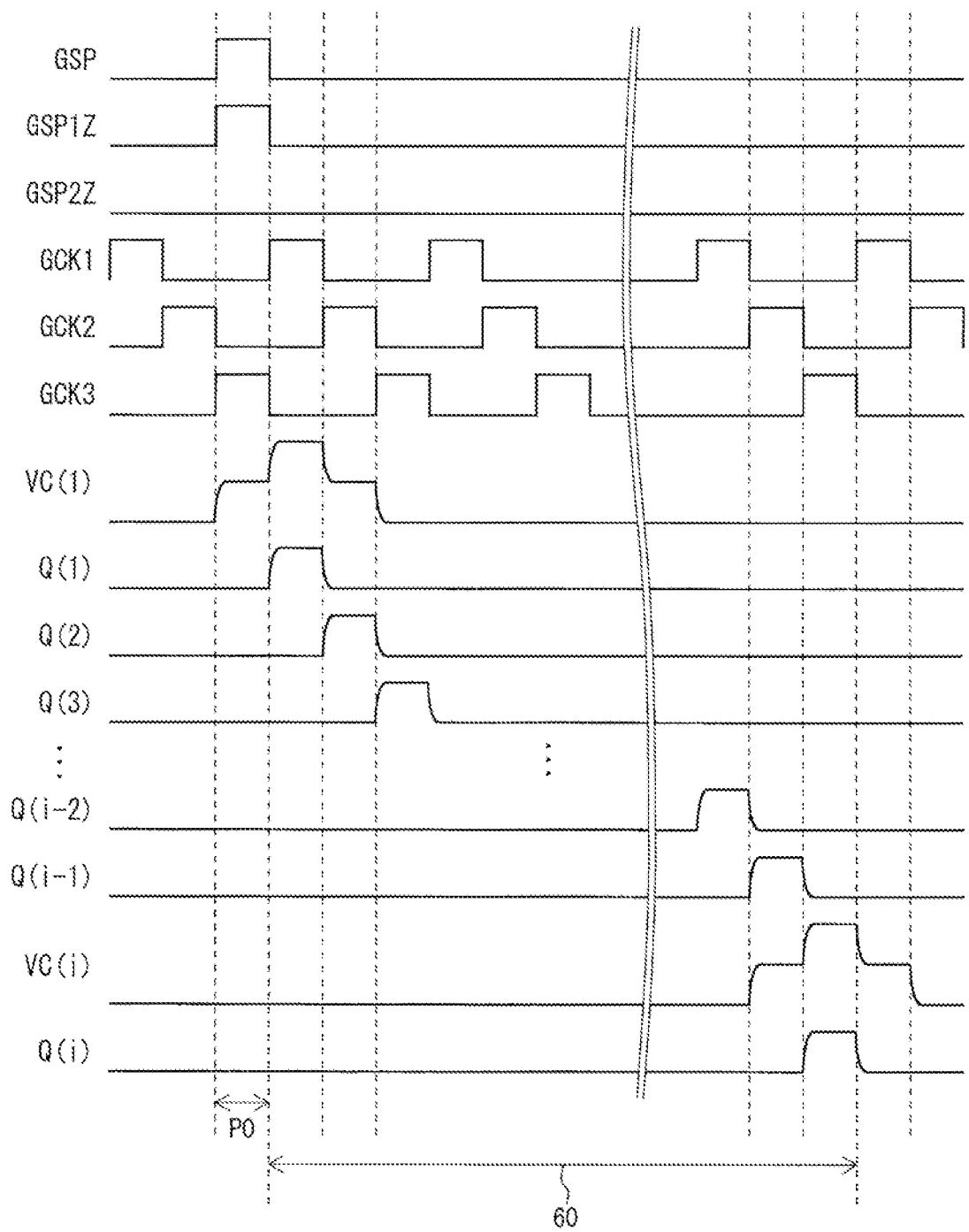
FIG. 10 is a signal waveform diagram for describing overall action of a bidirectional shift register when a forward shift is performed in the first embodiment.
Figure 11:
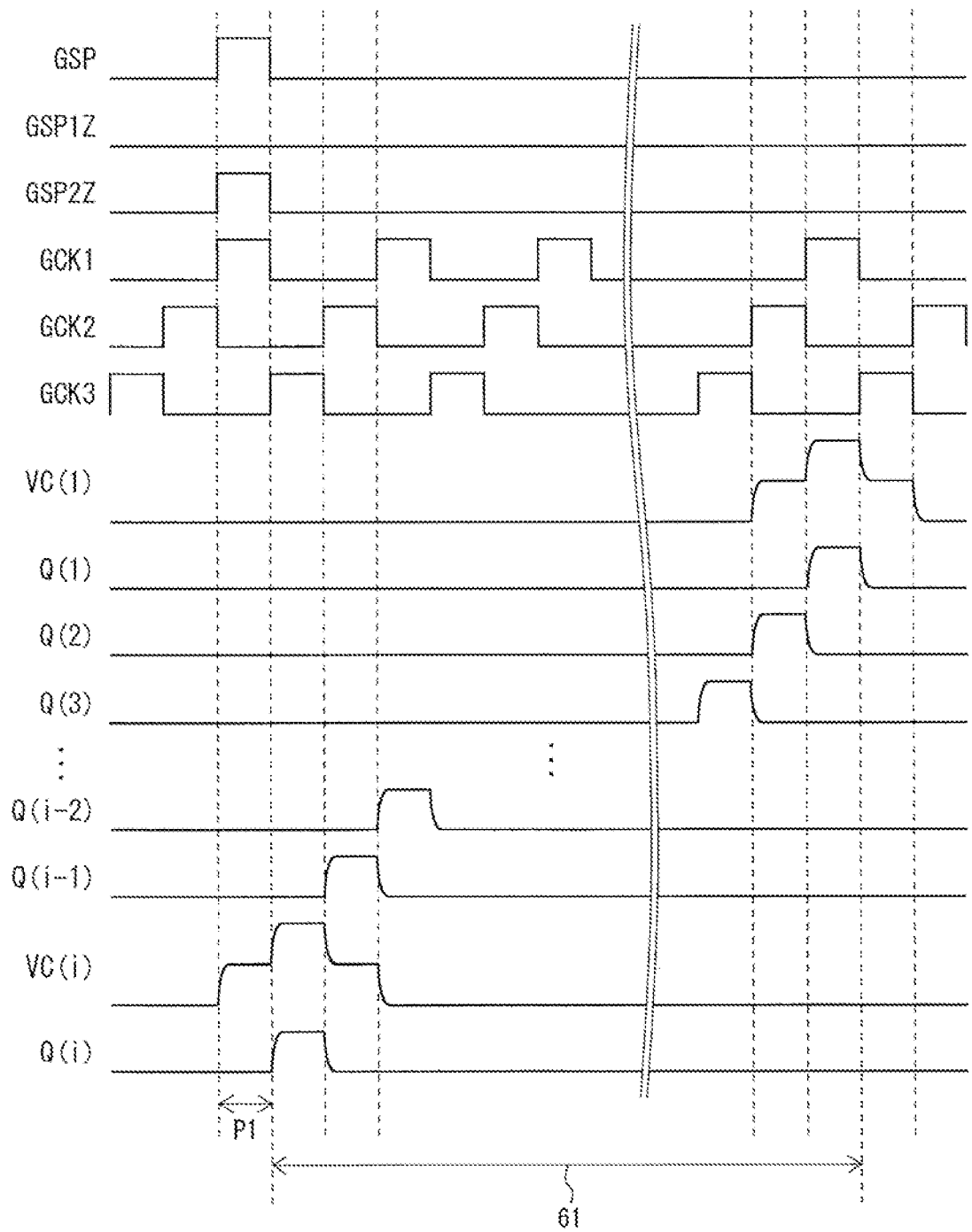
FIG. 11 is a signal waveform diagram for describing overall action of a bidirectional shift register when a backward shift is performed in the first embodiment.

As is understood from FIGS. 10 and 11, the pulse width of the gate start pulse signal GSP is equal to the pulse width of the gate clock signal GCK (the first to third gate clock signals GCK1 to GCK3).

The unit circuits 2(i+1) and 2(i+2), which are provided on the subsequent stage side relative to the last stage and configures the dummy stages, are constituted such that the internal states thereof are reset based on the gate start pulse signal GSP when the forward shift is performed. Thus, during the vertical blanking period, the potential of the node VC in the unit circuits 2(i+1) and 2(i+2) is maintained at the high level. However, since any of the output signals Q(i+1) and Q(i+2) of the unit circuits 2(i+1) and 2(i+2) is not supplied to the other unit circuits 2 as the first set signal S1 or the second set signal S2, a problem does not occur. The unit circuits 2(−1) and 2(0), which are provided on the preceding stage side relative to the first stage and configures the dummy stages, are constituted such that the internal states thereof are reset based on the gate start pulse signal GSP when the backward shift is performed, and for the same reason described above, a problem does not occur.

1.4 Effects

According to the present embodiment, in the bidirectional shift register 20 configured to perform the shift action based on the first to third gate clock signals GCK1 to GCK3, which are three-phase clock signals, a signal obtained through sampling the gate start pulse signal GSP by using the third gate clock signal GCK3 (the forward shift start pulse signal GSP1Z) is supplied as the first set signal S1 to the first stage unit circuit 2(1), and a signal obtained through sampling the gate start pulse signal GSP by using the first gate clock signal GCK1 (the backward shift start pulse signal GSP2Z) is supplied as the second set signal S2 to the last stage unit circuit 2(i). Due to this, it is possible to switch shift directions by simply changing the generation sequence of pulses of the three-phase clock signals (the first to third gate clock signals GCK1 to GCK3) by using only one gate start pulse signal GSP as a signal for switching the shift directions. The forward shift start pulse signal GSP1Z and the backward shift start pulse signal GSP2Z are obtained through sampling the gate start pulse signal GSP by using mutually different signals, and therefore the shift pulses are not input at the same timing to the first stage unit circuit 2(1) and the last stage unit circuit 2(i). This prevents occurrence of a problem. As described thus far, according to the present embodiment, there is achieved the bidirectional shift register 20 having a smaller circuit area than the known bidirectional shift registers, and being able to switch the shift directions without causing a problem. With this, for example, it is possible to narrow the frame of a liquid crystal display device including a bidirectional shift register.

2. Second Embodiment 2.1 Overall Configuration of Bidirectional Shift Register

The configuration of the bidirectional shift register 20 in the present embodiment is substantially the same as the configuration of the bidirectional shift register 20 in the first embodiment. However, a configuration for generating the forward shift start pulse signal GSP1Z and the backward shift start pulse signal GSP2Z is different from that of the first embodiment.

Figure 12:
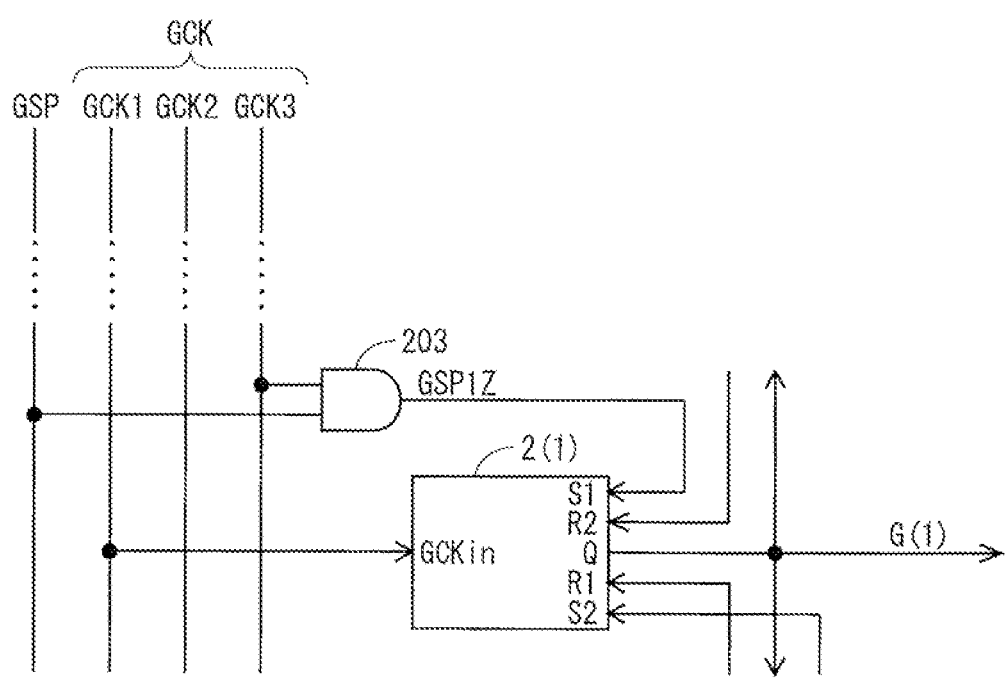
FIG. 12 is a diagram for describing a configuration to generate a forward shift start pulse signal in a second embodiment.

In the above-described first embodiment, the forward shift start pulse signal GSP1Z and the backward shift start pulse signal GSP2Z are obtained through sampling the gate start pulse signal GSP by using the gate clock signal GCK. In contrast, in the present embodiment, the forward shift start pulse signal GSP1Z and the backward shift start pulse signal GSP2Z are obtained through sampling the gate start pulse signal GSP by using logic circuits. Specifically, as illustrated in FIG. 12, in the vicinity of the first stage unit circuit 2(1), there is provided an AND circuit 203 configured to output a signal indicating a logical product of the third gate clock signal GCK3 and the gate start pulse signal GSP, as the forward shift start pulse signal GSP1Z. Similarly, in the vicinity of the last stage unit circuit 2(i), there is provided an AND circuit (not illustrated) configured to output a signal indicating a logical product of the first gate clock signal GCK1 and the gate start pulse signal GSP, as the backward shift start pulse signal GSP2Z. With the configuration described above, the forward shift start pulse signal GSP1Z is maintained at the high level during a period in which both the gate start pulse signal GSP and the third gate clock signal GCK3 are at the high level, and the backward shift start pulse signal GSP2Z is maintained at the high level during a period in which both the gate start pulse signal GSP and the first gate clock signal GCK1 are at the high level.

In the present embodiment, the first logic circuit is achieved by the AND circuit 203 provided in the vicinity of the first stage unit circuit 2(1), and the second logic circuit is achieved by the AND circuit provided in the vicinity of the last stage unit circuit 2(i).

2.2 Configuration and Action of Unit Circuit

Figure 13:
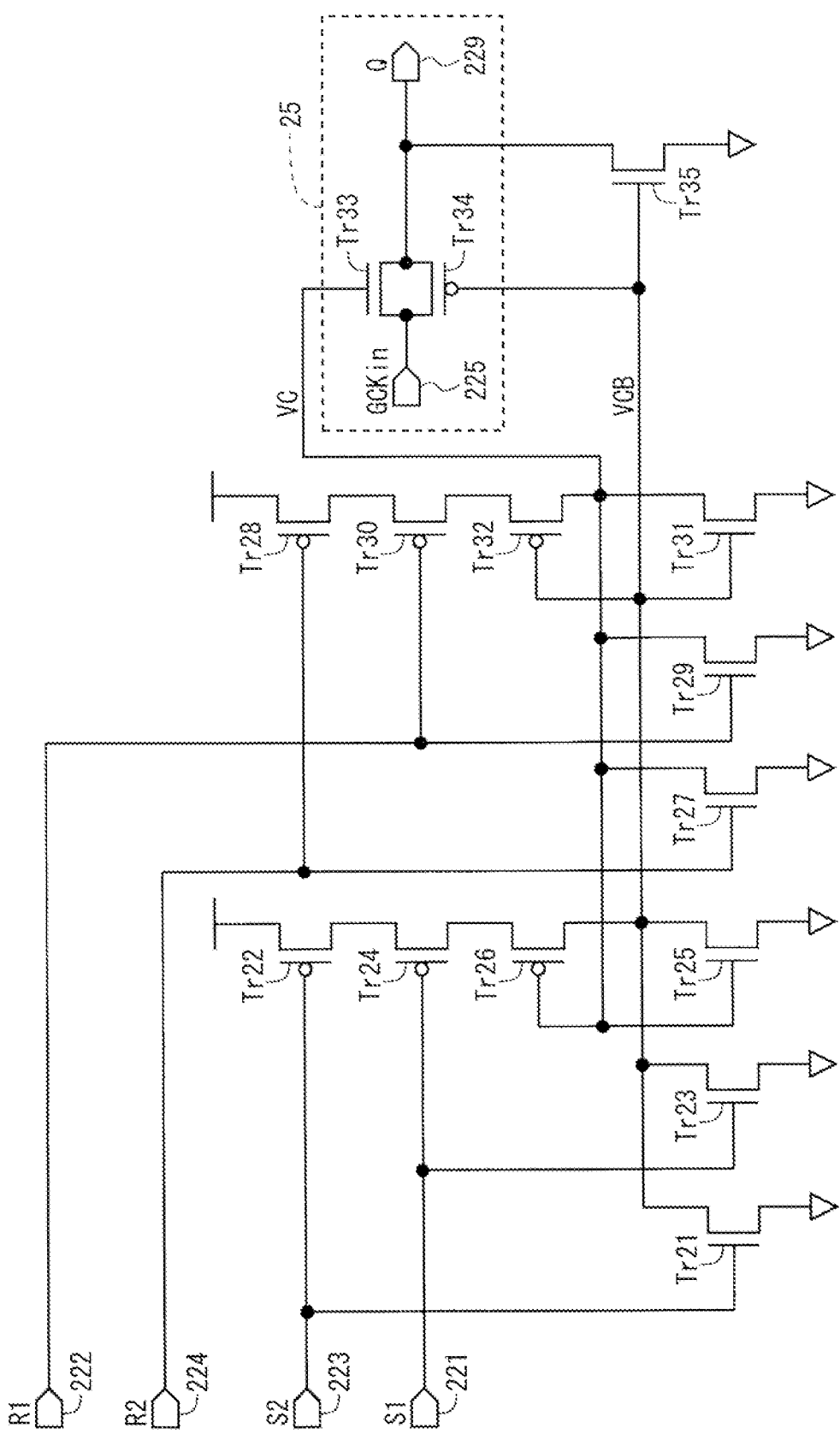
FIG. 13 is a circuit diagram illustrating a configuration of a unit circuit (configuration of one stage of a bidirectional shift register) in the second embodiment.

FIG. 13 is a circuit diagram illustrating a configuration of the unit circuit 2 (configuration of one stage of the bidirectional shift register 20) in the present embodiment. As illustrated in FIG. 13, the unit circuit 2 includes 15 thin film transistors Tr21 to Tr35. The thin film transistors Tr21, Tr23, Tr25, Tr27, Tr29, Tr31, Tr33, and Tr35 are each an n-channel thin film transistor. The thin film transistors Tr22, Tr24, Tr26, Tr28, Tr30, Tr32, and Tr34 are each a p-channel thin film transistor. The unit circuit 2 includes, in addition to input terminals for the high-level DC power supply voltage VDD and the low-level DC power supply voltage VSS, five input terminals 221 to 225 and an output terminal 229. The input terminal for receiving the first set signal S1 is denoted by a reference sign 221, the input terminal for receiving the first reset signal R1 is denoted by a reference sign 222, the input terminal for receiving the second set signal S2 is denoted by a reference sign 223, the input terminal for receiving the second reset signal R2 is denoted by a reference sign 224, and the input terminal for receiving the input gate clock signal GCKin is denoted by a reference sign 225. The output terminal for outputting the output signal Q is denoted by a reference sign 229. A node connected to the control terminal of the thin film transistor Tr33 is referred to as "node VC", and a node connected to the control terminal of the thin film transistor Tr34 is referred to as "node VCB".

In the first embodiment described above, a configuration using an NMOS is employed for the configuration of the unit circuit 2, but a configuration using a CMOS is employed for the configuration of the unit circuit 2 in the present embodiment as is understood from FIG. 13.

As for the thin film transistor Tr21, the control terminal is connected to the input terminal 223, the first conduction terminal is connected to the node VCB, and the second conduction terminal is connected to the input terminal for the low-level DC power supply voltage VSS. As for the thin film transistor Tr22, the control terminal is connected to the input terminal 223, the first conduction terminal is connected to the input terminal for the high-level DC power supply voltage VDD, and the second conduction terminal is connected to the first conduction terminal of the thin film transistor Tr24. As for the thin film transistor Tr23, the control terminal is connected to the input terminal 221, the first conduction terminal is connected to the node VCB, and the second conduction terminal is connected to the input terminal for the low-level DC power supply voltage VSS. As for the thin film transistor Tr24, the control terminal is connected to the input terminal 221, the first conduction terminal is connected to the second conduction terminal of the thin film transistor Tr22, and the second conduction terminal is connected to the first conduction terminal of the thin film transistor Tr26. As for the thin film transistor Tr25, the control terminal is connected to the node VC, the first conduction terminal is connected to the node VCB, and the second conduction terminal is connected to the input terminal for the low-level DC power supply voltage VSS.

As for the thin film transistor Tr26, the control terminal is connected to the node VC, the first conduction terminal is connected to the second conduction terminal of the thin film transistor Tr24, and the second conduction terminal is connected to the node VCB. As for the thin film transistor Tr27, the control terminal is connected to the input terminal 224, the first conduction terminal is connected to the node VC, and the second conduction terminal is connected to the input terminal for the low-level DC power supply voltage VSS. As for the thin film transistor Tr28, the control terminal is connected to the input terminal 224, the first conduction terminal is connected to the input terminal for the high-level DC power supply voltage VDD, and the second conduction terminal is connected to the first conduction terminal of the thin film transistor Tr30. As for the thin film transistor Tr29, the control terminal is connected to the input terminal 222, the first conduction terminal is connected to the node VC, and the second conduction terminal is connected to the input terminal for the low-level DC power supply voltage VSS. As for the thin film transistor Tr30, the control terminal is connected to the input terminal 222, the first conduction terminal is connected to the second conduction terminal of the thin film transistor Tr28, and the second conduction terminal is connected to the first conduction terminal of the thin film transistor Tr32.

As for the thin film transistor Tr31, the control terminal is connected to the node VCB, the first conduction terminal is connected to the node VC, and the second conduction terminal is connected to the input terminal for the low-level DC power supply voltage VSS. As for the thin film transistor Tr32, the control terminal is connected to the node VCB, the first conduction terminal is connected to the second conduction terminal of the thin film transistor Tr30, and the second conduction terminal is connected to the node VC. As for the thin film transistor Tr33, the control terminal is connected to the node VC, the first conduction terminal is connected to the input terminal 225, and the second conduction terminal is connected to the output terminal 229. As for the thin film transistor Tr34, the control terminal is connected to the node VCB, the first conduction terminal is connected to the input terminal 225, and the second conduction terminal is connected to the output terminal 229. As for the thin film transistor Tr35, the control terminal is connected to the node VCB, the first conduction terminal is connected to the output terminal 229, and the second conduction terminal is connected to the input terminal for the low-level DC power supply voltage VSS.

Attention is focused on a section denoted by a reference sign 25 in FIG. 13. As for the thin film transistor Tr33, when the potential of the node VC is at the high level, the transistor is turned on, and when the potential of the node VC is at the low level, the transistor is turned off. As for the thin film transistor Tr34, when the potential of the node VCB is at the high level, the transistor is turned off, and when the potential of the node VCB is at the low level, the transistor is turned on. Thus, when the potential of the node VC is at the high level and the potential of the node VCB is at the low level, the thin film transistor Tr33 and the thin film transistor Tr34 are turned on. At this time, the potential of the input gate clock signal GCKin is supplied to the output terminal 229. When the potential of the node VC is at the low level and the potential of the node VCB is at the high level, the thin film transistor Tr33 and the thin film transistor Tr34 are turned off. At this time, the input terminal 225 and the output terminal 229 are electrically separated from each other.

Figure 14:
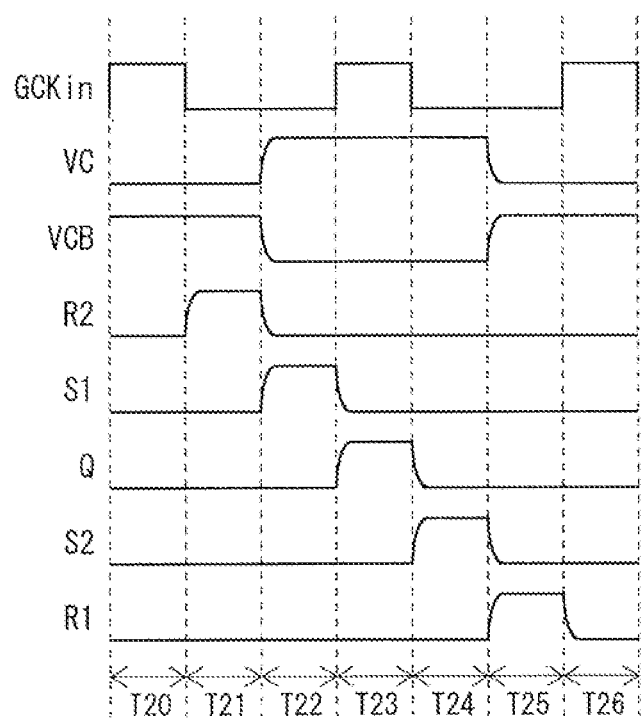
FIG. 14 is a signal waveform diagram for describing action of a unit circuit when a forward shift is performed in the second embodiment.

Action of the unit circuit 2 when a forward shift is performed will be described with reference to FIG. 14. In a period before a period T20 and in the period T20, the potential of the node VC, the second reset signal R2, the first set signal S1, the output signal Q, the second set signal S2, and the first reset signal R1 are at the low level, while the potential of the node VCB is at the high level. During the above-described period, the thin film transistors Tr22, Tr24, Tr26, Tr28, Tr30, Tr31, and Tr35 are in an on state, and the thin film transistors Tr21, Tr23, Tr25, Tr27, Tr29, Tr32, Tr33, and Tr34 are in an off state.

In a period T21, the second reset signal R2 changes from the low level to the high level. With this, the thin film transistor Tr27 is turned on, but the potential of the node VC is at the low level, so that the state of the thin film transistor Tr33 does not change.

In a period T22, the second reset signal R2 changes from the high level to the low level. With this, the thin film transistor Tr27 is turned off. Further, in the period T22, the first set signal S1 changes from the low level to the high level. With this, the thin film transistor Tr23 is turned on, and the potential of the node VCB is set to be at the low level. As a result, the thin film transistors Tr32 and Tr34 are turned on, and the thin film transistors Tr31 and Tr35 are turned off. This causes the potential of the node VC to be at the high level. As a result, the thin film transistors Tr25 and Tr33 are turned on, and the thin film transistor Tr26 is turned off. As described above, during the period T22, each of the thin film transistor Tr33 and the thin film transistor Tr34 is in the on state. However, during the period T22, the input gate clock signal GCKin is at the low level. Due to this, during this period, the output signal Q is maintained at the low level.

In a period T23, the input gate clock signal GCKin changes from the low level to the high level. At this time, since the thin film transistors Tr33 and Tr34 are in the on state, the potential of the input gate clock signal GCKin is supplied to the output terminal 229. That is, the output signal Q is set to be at the high level, and the gate bus line GL connected to the output terminal 229 of the unit circuit 2 is set to be in a selection state. During this period, the thin film transistor Tr35 is maintained in the off state, so that the potential of the output signal Q is not lowered.

In a period T24, the input gate clock signal GCKin changes from the high level to the low level. At this time, since the thin film transistors Tr33 and Tr34 are maintained in the on state, the output signal Q is also at the low level. Further, in the period T24, the second set signal S2 changes from the low level to the high level. With this, the thin film transistor Tr21 is turned on. Thus, the potential of the node VCB is maintained at the low level.

In a period T25, the second set signal S2 changes from the high level to the low level. With this, the thin film transistor Tr21 is turned off. Further, in the period T25, the first reset signal R1 changes from the low level to the high level. With this, the thin film transistor Tr29 is turned on, and the potential of the node VC is set to be at the low level. As a result, the thin film transistors Tr25 and Tr33 are turned off, and the thin film transistor Tr26 is turned on. This causes the potential of the node VCB to be at the high level. As a result, the thin film transistors Tr31 and Tr35 are turned on, and the thin film transistors Tr32 and Tr34 are turned off. As described above, during the period T25, each of the thin film transistor Tr33 and the thin film transistor Tr34 is in the off state.

Figure 15:
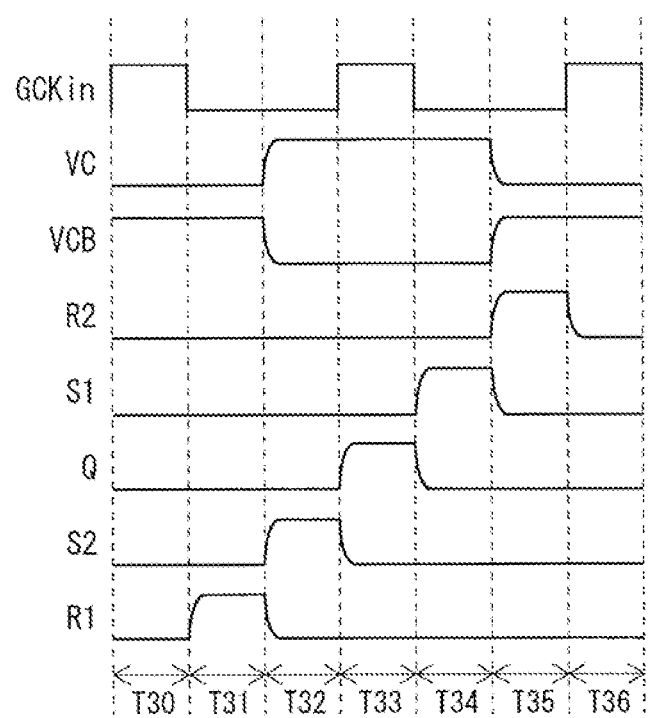
FIG. 15 is a signal waveform diagram for describing action of a unit circuit when a backward shift is performed in the second embodiment.

Action of the unit circuit 2 when a backward shift is performed will be described with reference to FIG. 15. Signal waveforms in a period before a period T30 and in the period T30 are the same as those in the period before the period T20 and in the period T20 (see FIG. 14).

In a period T31, the first reset signal R1 changes from the low level to the high level. With this, the thin film transistor Tr29 is turned on, but the potential of the node VC is at the low level, so that the state of the thin film transistor Tr33 does not change.

In a period T32, the first reset signal R1 changes from the high level to the low level. With this, the thin film transistor Tr29 is turned off. Further, in the period T32, the second set signal S2 changes from the low level to the high level. With this, the thin film transistor Tr21 is turned on, and the potential of the node VCB is set to be at the low level. As a result, like in the above-described period T22, the potential of the node VC is set to be at the high level. As described above, during the period T32, each of the thin film transistor Tr33 and the thin film transistor Tr34 is in the on state. However, during the period T32, the input gate clock signal GCKin is at the low level. Due to this, during this period, the output signal Q is maintained at the low level.

In a period T33, the input gate clock signal GCKin changes from the low level to the high level. With this, as in the period T23 described above, the output signal Q is set to be at the high level, and the gate bus line GL connected to the output terminal 229 of the unit circuit 2 is set to be in the selection state.

In a period T34, the input gate clock signal GCKin changes from the high level to the low level. Consequently, like in the period T24 described above, the output signal Q is also set to be at the low level. Further, in the period T34, the first set signal S1 changes from the low level to the high level. With this, the thin film transistor Tr23 is turned on. Thus, the potential of the node VCB is maintained at the low level.

In a period T35, the first set signal S1 changes from the high level to the low level. With this, the thin film transistor Tr23 is turned off. Further, in the period T35, the second reset signal R2 changes from the low level to the high level. With this, the thin film transistor Tr27 is turned on, and the potential of the node VC is set to be at the low level. As a result, like in the above-described period T25, the potential of the node VCB is set to be at the high level. As described above, during the period T35, each of the thin film transistor Tr33 and the thin film transistor Tr34 is in the off state.

2.3 Overall Action of Bidirectional Shift Register

Figure 16:
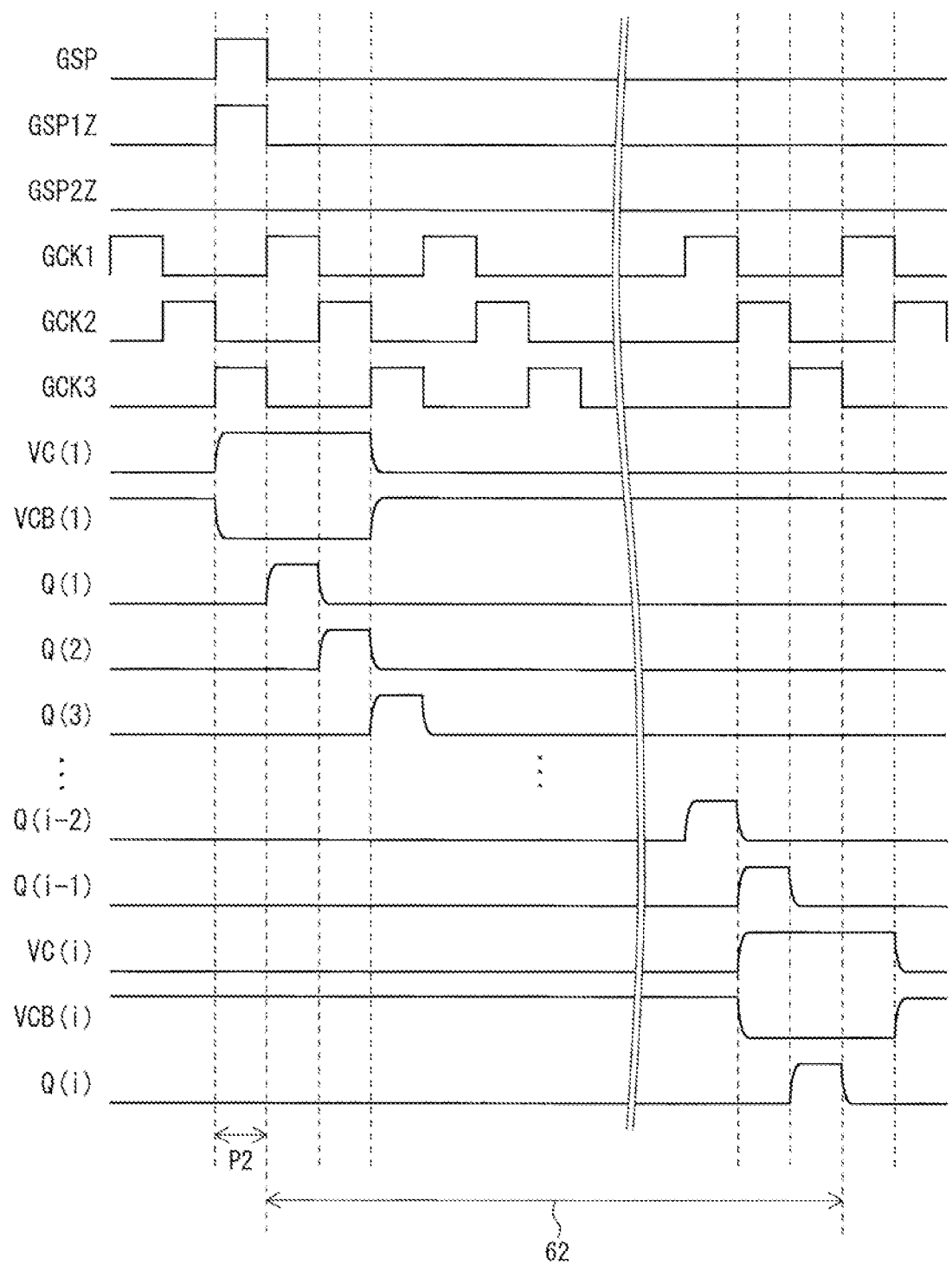
FIG. 16 is a signal waveform diagram for describing overall action of a bidirectional shift register when a forward shift is performed in the second embodiment.

Overall action of the bidirectional shift register 20 when a forward shift is performed will be described with reference to FIG. 16. The node VC and node VCB in the unit circuit 2(1) of the first stage are represented as "VC(1)" and "VCB(1)" respectively, and the node VC and node VCB in the unit circuit 2(i) of the last stage is represented as "VC(i)" and "VCB(i)" respectively. When the forward shift is performed, the gate start pulse signal GSP and the third gate clock signal GCK3 are set to be at the high level in a period P2. The forward shift start pulse signal GSP1Z is set to be at the high level when both the gate start pulse signal GSP and the third gate clock signal GCK3 are at the high level; the backward shift start pulse signal GSP2Z is set to be at the high level when both the gate start pulse signal GSP and the first gate clock signal GCK1 are at the high level. Accordingly, during the period P2, the forward shift start pulse signal GSP1Z is at the high level, but the backward shift start pulse signal GSP2Z is maintained at the low level. Thus, the potential of the node VC(1) rises, but the potential of the node VC(i) is maintained at the low level. The potential of the node VCB(1) is lowered, but the potential of the node VCB(i) is maintained at the high level. Because of this, problems like those caused in the known techniques do not occur. Thereafter, the clock pulses are repeatedly generated in the order of the "first gate clock signal GCK1, second gate clock signal GCK2, and third gate clock signal GCK3", so that the output signals Q(1) to Q(i) of the unit circuits 2(1) to 2(i) from the first stage to the last stage are each sequentially set to be at the high level for a predetermined period in a period indicated by an arrow mark denoted by a reference sign 62 in FIG. 16. As a result, the writing of the image signal to the pixel capacitance 56 is performed in a sequence from the upper portion toward the lower portion of the image.

Figure 17:
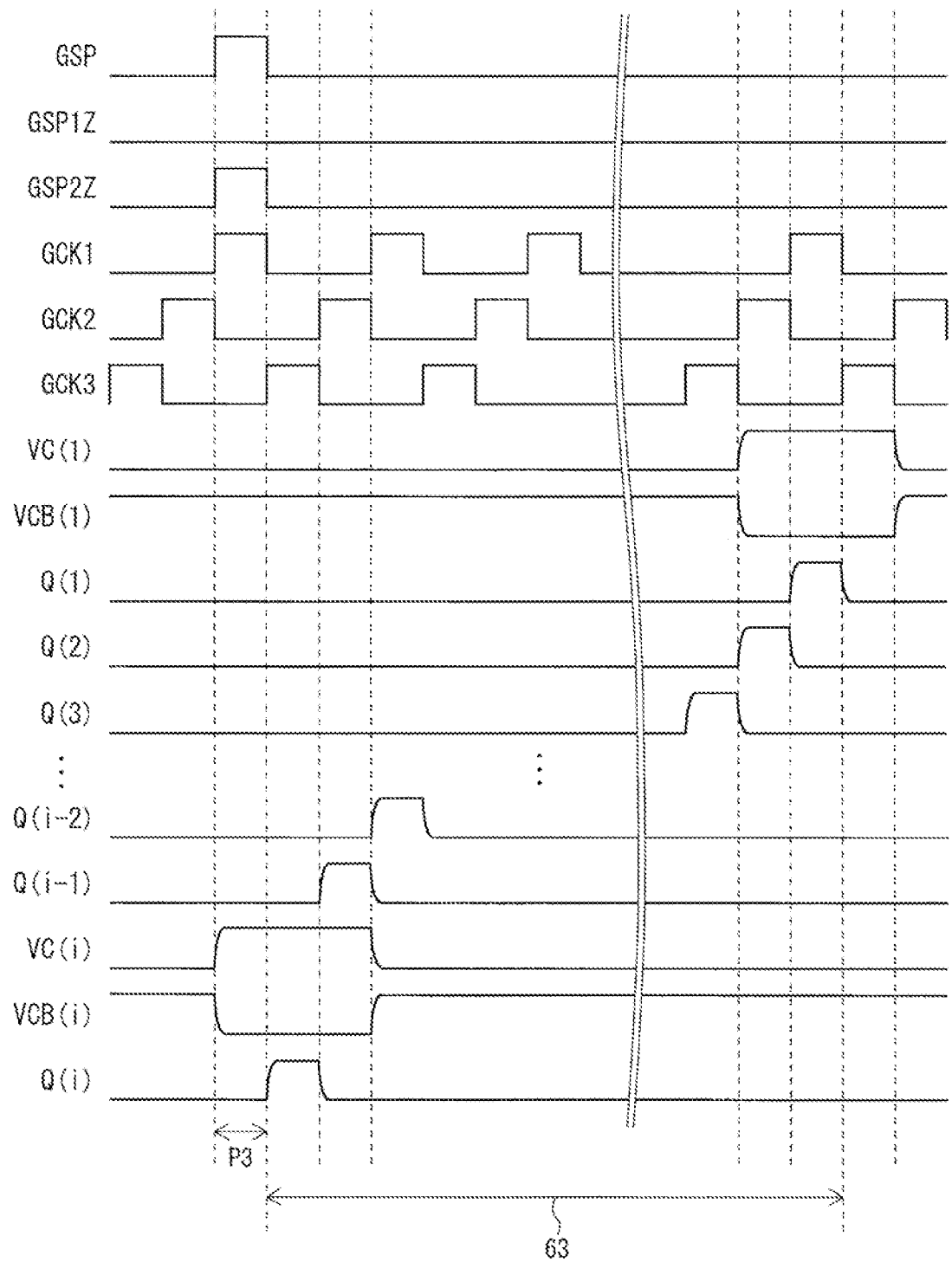
FIG. 17 is a signal waveform diagram for describing overall action of a bidirectional shift register when a backward shift is performed in the second embodiment.

Next, overall action of the bidirectional shift register 20 when the backward shift is performed will be described with reference to FIG. 17. When the backward shift is performed, the gate start pulse signal GSP and the first gate clock signal GCK1 are set to be at the high level in a period P3. With this, during the period P3, the backward shift start pulse signal GSP2Z is set to be at the high level, but the forward shift start pulse signal GSP1Z is maintained at the low level. Thus, the potential of the node VC(i) rises, but the potential of the node VC(1) is maintained at the low level. The potential of the node VCB(i) is lowered, but the potential of the node VCB(1) is maintained at the high level. Because of this, problems like those caused in the known techniques do not occur. Thereafter, the clock pulses are repeatedly generated in the order of the "third gate clock signal GCK3, second gate clock signal GCK2, and first gate clock signal GCK1", so that the output signals Q(i) to Q(1) of the unit circuits 2(i) to 2(1) from the last stage to the first stage are each sequentially set to be at the high level for a predetermined period in a period indicated by an arrow mark denoted by a reference sign 63 in FIG. 17. As a result, the writing of the image signal to the pixel capacitance 56 is performed in a sequence from the lower portion toward the upper portion of the image.

2.4 Effects

According to the present embodiment, in the bidirectional shift register 20 configured to perform the shift action based on the first to third gate clock signals GCK1 to GCK3, which are three-phase clock signals, a signal indicating the logical product of the gate start pulse signal GSP and the third gate clock signal GCK3 (the forward shift start pulse signal GSP1Z) is supplied as the first set signal S1 to the first stage unit circuit 2(1), and a signal indicating the logical product of the gate start pulse signal GSP and the first gate clock signal GCK1 (the backward shift start pulse signal GSP2Z) is supplied as the second set signal S2 to the last stage unit circuit 2(i). Due to this, it is possible to switch shift directions by simply changing the generation sequence of pulses of the three-phase clock signals (the first to third gate clock signals GCK1 to GCK3) by using only one gate start pulse signal GSP as a signal for switching the shift directions. Furthermore, the shift pulses are not input at the same timing to the unit circuit 2(1) of the first stage and the unit circuit 2(i) of the last stage, and thus no problem occurs. As described thus far, according to the present embodiment, there is achieved the bidirectional shift register 20 having a smaller circuit area than the known bidirectional shift registers, and being able to switch the shift directions without causing a problem.

3. Third Embodiment 3.1 Overall Configuration of Bidirectional Shift Register

The bidirectional shift register 20 in the present embodiment has a similar overall configuration to that of the bidirectional shift register 20 in the first embodiment described above. However, in the first embodiment, i (the number of stages of the shift register excluding the dummy stages) is a multiple of 3; in contrast, in the present embodiment, i is (3K+1), where K is a natural number. Accordingly, a scheme to apply the gate clock signal GCK to each stage near the last stage is different from that of the first embodiment. The configuration of the unit circuit 2 is similar to that of the first embodiment described above (see FIG. 7).

Figure 18:
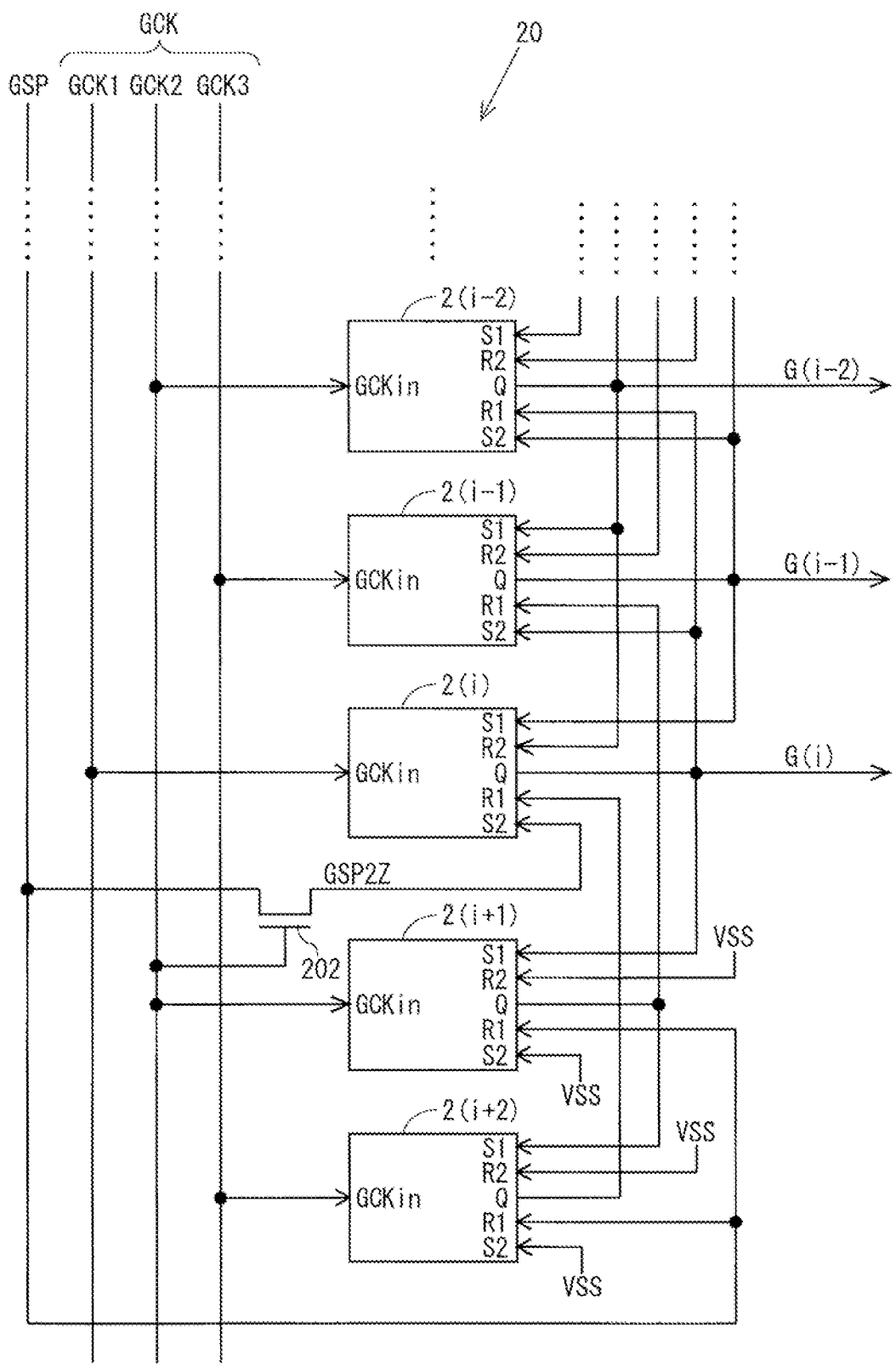
FIG. 18 is a block diagram illustrating a configuration near the last stage of a bidirectional shift register in a third embodiment.

FIG. 18 is a block diagram illustrating a configuration near the last stage of the bidirectional shift register 20. In the present embodiment, the last stage unit circuit 2(i) is supplied with the first gate clock signal GCK1 as the input gate clock signal GCKin. The backward shift start pulse signal GSP2Z is generated through sampling the gate start pulse signal GSP by using the second gate clock signal GCK2, and the generated backward shift start pulse signal GSP2Z is supplied as the second set signal S2 to the last stage unit circuit 2(i).

3.2 Overall Action of Bidirectional Shift Register

Figure 19:
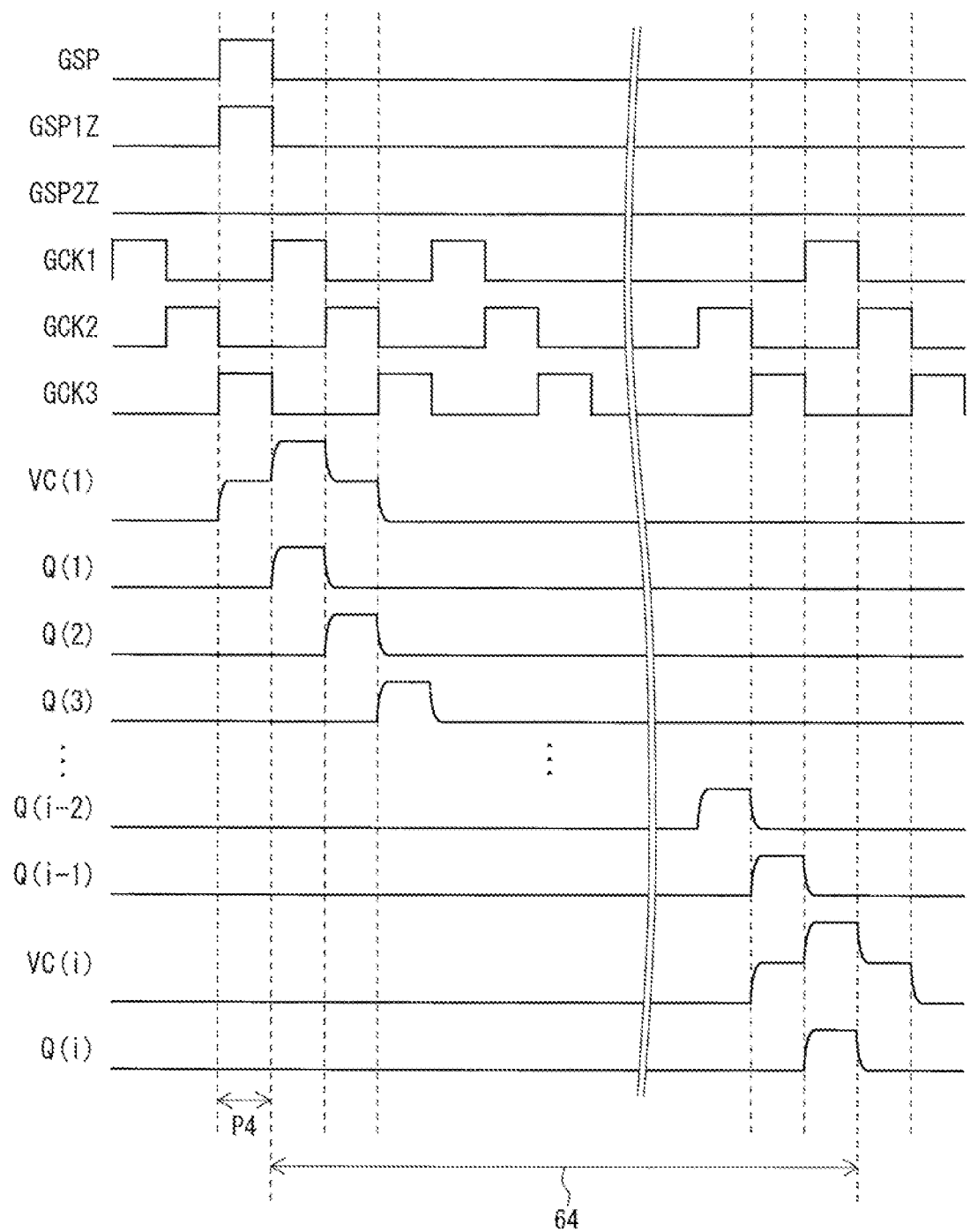
FIG. 19 is a signal waveform diagram for describing overall action of a bidirectional shift register when a forward shift is performed in the third embodiment.

Overall action of the bidirectional shift register 20 when a forward shift is performed will be described with reference to FIG. 19. The gate start pulse signal GSP and the third gate clock signal GCK3 are set to be at the high level in a period P4, so that the forward shift start pulse signal GSP1Z is set to be at the high level in the period P4; subsequently, like in the first embodiment, in a period indicated by an arrow mark denoted by a reference sign 64 in FIG. 19, the output signals Q(1) to Q(i) of the unit circuits 2(1) to 2(i) from the first stage to the last stage are each sequentially set to be at the high level for a predetermined period. Unlike the first embodiment, the output signal Q(i) is at the high level when the first gate clock signal GCK1 is at the high level. Since the backward shift start pulse signal GSP2Z is maintained at the low level during the period P4, problems like those caused in the known techniques do not occur.

Figure 20:
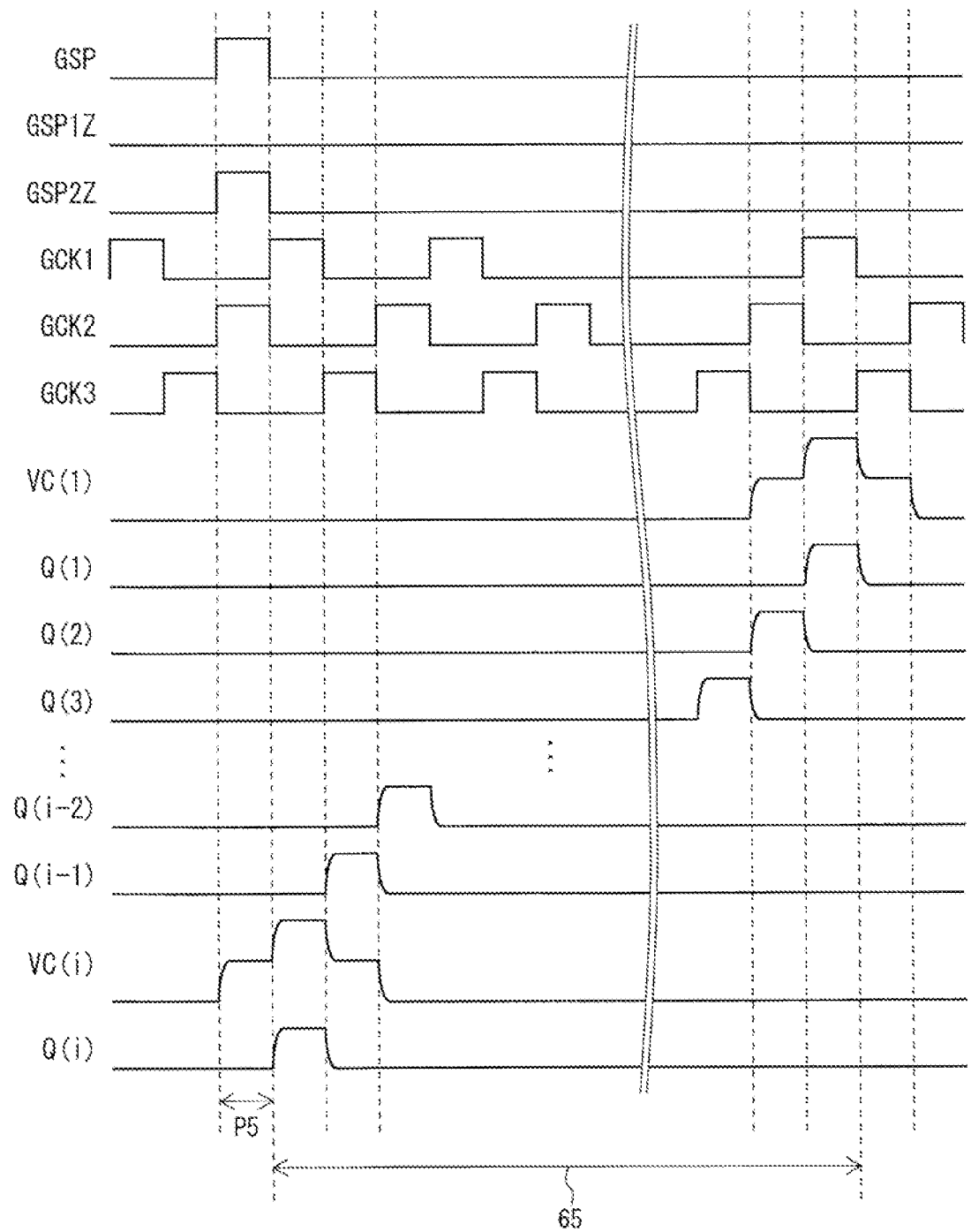
FIG. 20 is a signal waveform diagram for describing overall action of a bidirectional shift register when a backward shift is performed in the third embodiment.

Next, overall action of the bidirectional shift register 20 when a backward shift is performed will be described with reference to FIG. 20. The gate start pulse signal GSP and the second gate clock signal GCK2 are set to be at the high level in a period P5, so that the backward shift start pulse signal GSP2Z is set to be at the high level in the period P5; subsequently, like in the first embodiment, in a period indicated by an arrow mark denoted by a reference sign 65 in FIG. 20, the output signals Q(i) to Q(1) of the unit circuits 2(i) to 2(1) from the last stage to the first stage are each sequentially set to be at the high level for a predetermined period. Unlike the first embodiment, the output signal Q(i) is at the high level when the first gate clock signal GCK1 is at the high level. Since the forward shift start pulse signal GSP1Z is maintained at the low level during the period P5, problems like those caused in the known techniques do not occur.

3.3 Effects

As in the first embodiment, also in the present embodiment, there is achieved the bidirectional shift register 20 having a smaller circuit area than the known bidirectional shift registers, and being able to switch the shift directions without causing a problem.

3.4 Notes

Figure 21:
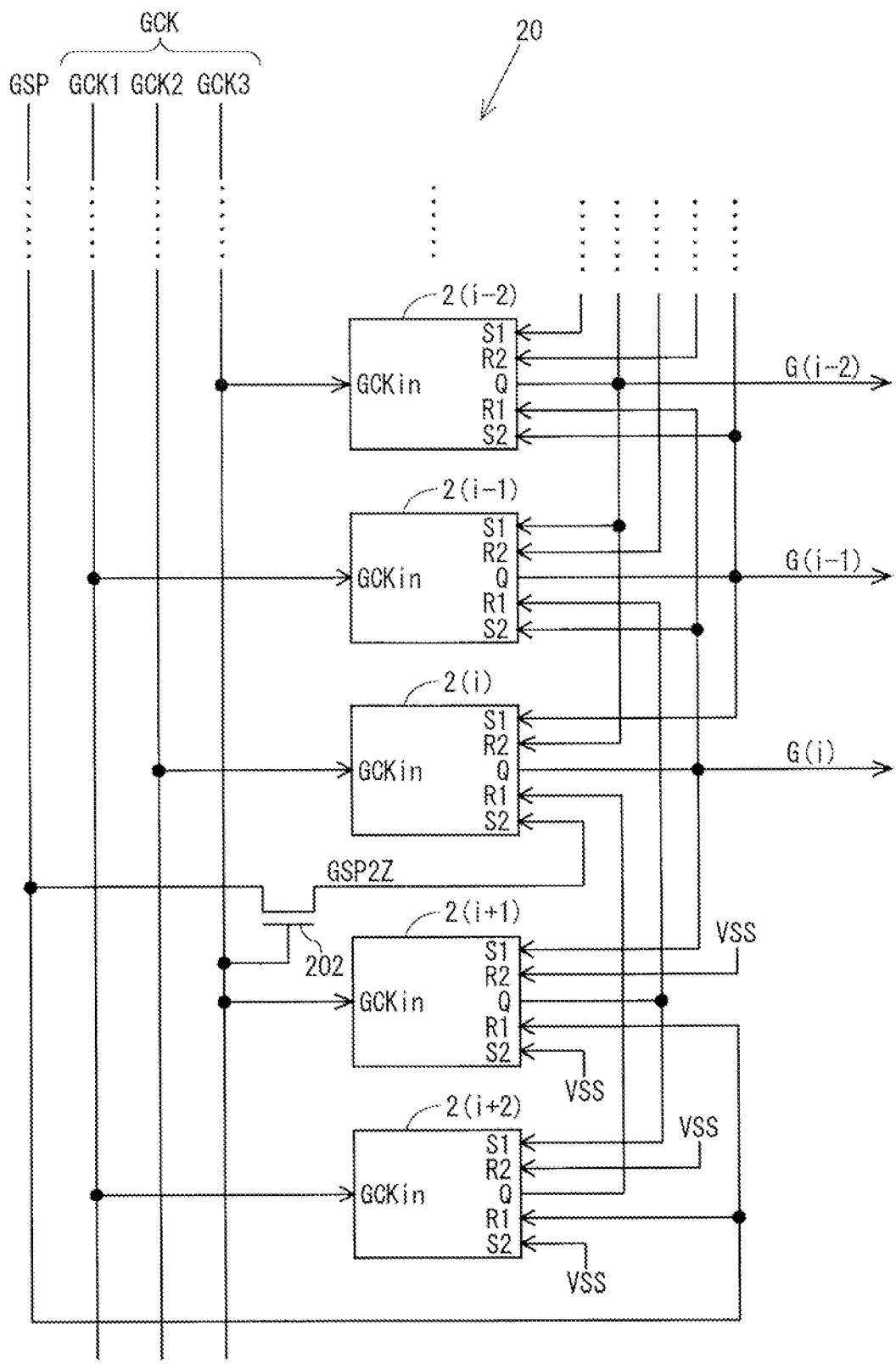
FIG. 21 is a block diagram illustrating a configuration near the last stage of a bidirectional shift register in a case where i (the number of stages of the shift register excluding dummy stages) is (3K+2).
Figure 22:
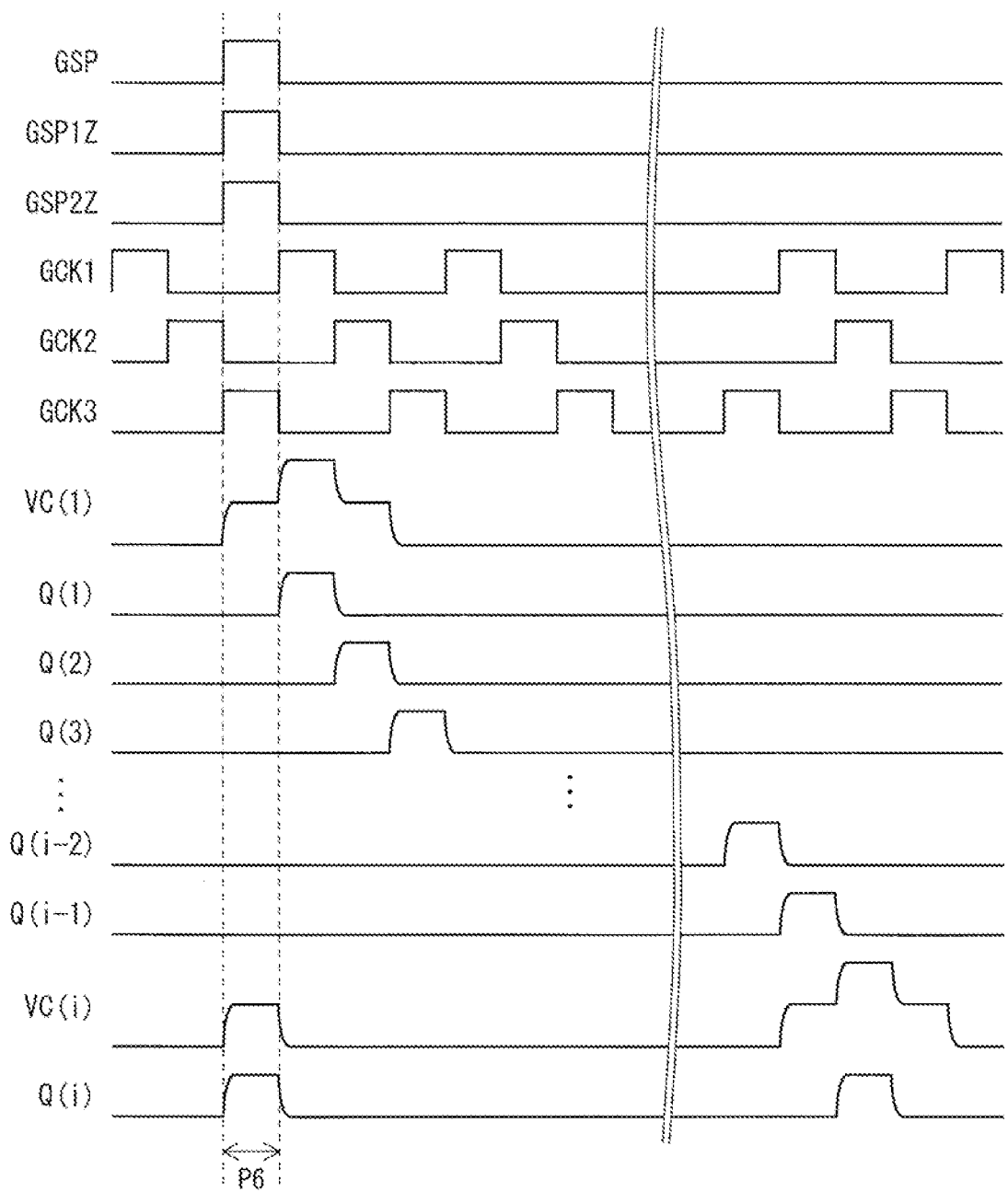
FIG. 22 is a signal waveform diagram for describing overall action of a bidirectional shift register when a forward shift is performed in a case where i is (3K+2).
Figure 23:
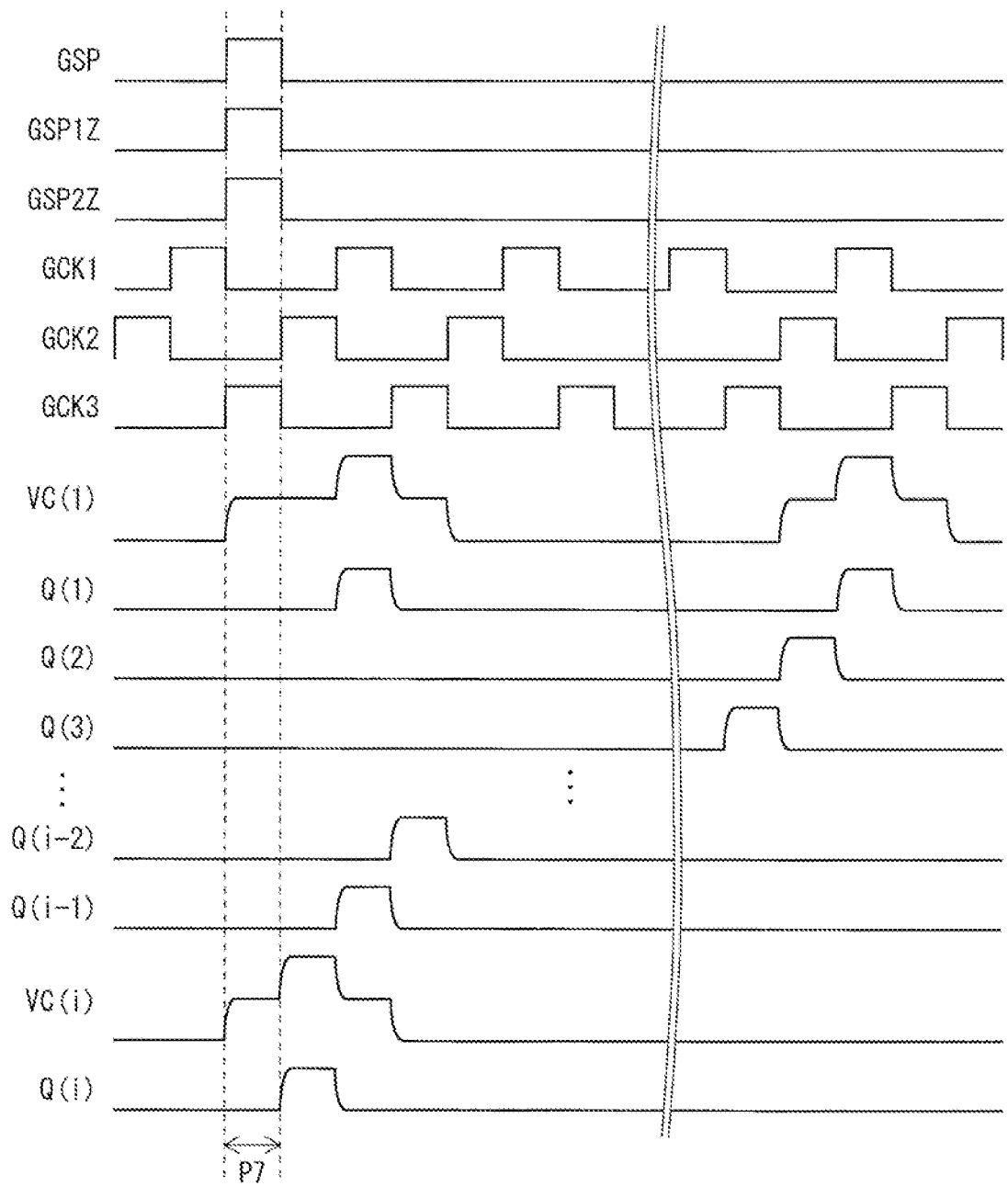
FIG. 23 is a signal waveform diagram for describing overall action of a bidirectional shift register when a backward shift is performed in a case where i is (3K+2).

Hereinafter, a case will be described in which i (the number of stages of the shift register excluding dummy stages) is (3K+2), where K is a natural number. In this case, the configuration near the first stage of the bidirectional shift register 20 takes the configuration illustrated in FIG. 1, and the configuration near the last stage of the bidirectional shift register 20 takes a configuration illustrated in FIG. 21. Accordingly, the forward shift start pulse signal GSP1Z and the backward shift start pulse signal GSP2Z are obtained through sampling the gate start pulse signal GSP by using the third gate clock signal GCK3. As a result, when the forward shift is performed, as illustrated in FIG. 22, the potential of the node VC(i) and the output signal Q(i) are set to be at the high level in a period P6 when the gate start pulse signal GSP is at the high level. This is because the last stage unit circuit 2(i) is supplied with a signal obtained through sampling the gate start pulse signal GSP by using the third gate clock signal GCK3 (backward shift start pulse signal GSP2Z) as the second set signal S2, and is supplied with the second gate clock signal GCK2 as the input gate clock signal GCKin. When the backward shift is performed, as illustrated in FIG. 23, the potential of the node VC(1) rises in a period P7 when the gate start pulse signal GSP is at the high level, and then the output signal Q(1) is set to be at the high level in the second subsequent horizontal scan period. This is because the first stage unit circuit 2(1) is supplied with a signal obtained through sampling the gate start pulse signal GSP by using the third gate clock signal GCK3 (forward shift start pulse signal GSP1Z) as the first set signal S1, and is supplied with the first gate clock signal GCK1 as the input gate clock signal GCKin. As described above, a problem occurs when i is (3K+2).

4. Fourth Embodiment 4.1 Overall Configuration of Bidirectional Shift Register

Figure 24:
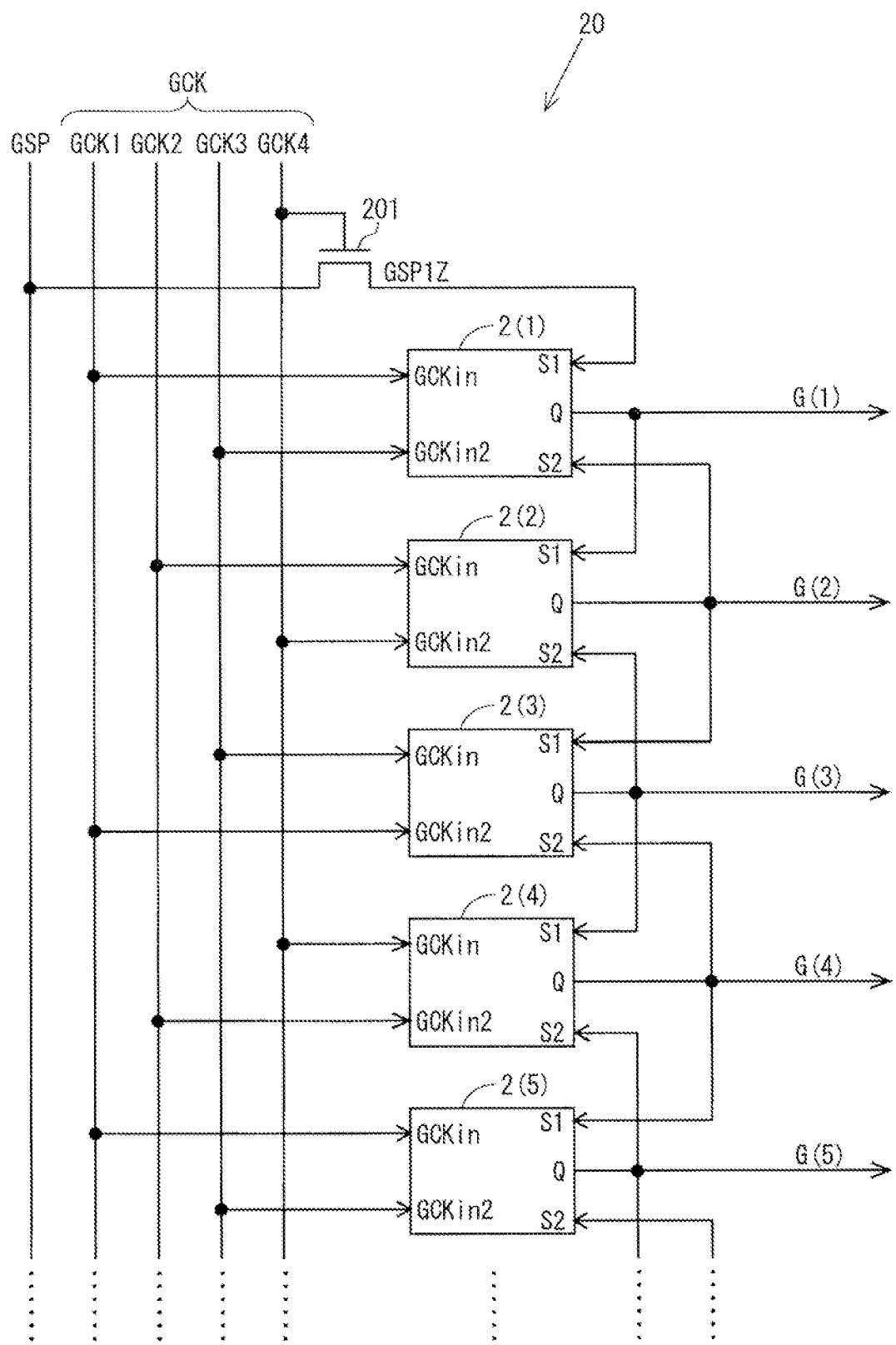
FIG. 24 is a block diagram illustrating a configuration near the first stage of a bidirectional shift register in a fourth embodiment.
Figure 25:
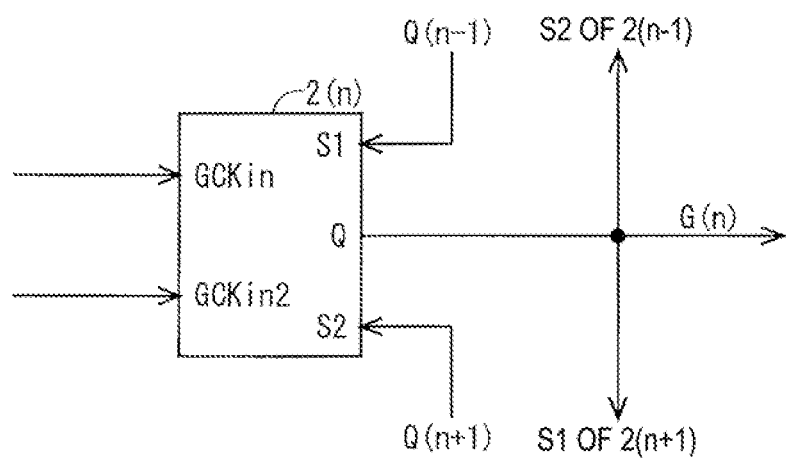
FIG. 25 is a diagram illustrating input and output signals of a unit circuit of the n-th stage in the fourth embodiment.
Figure 26:
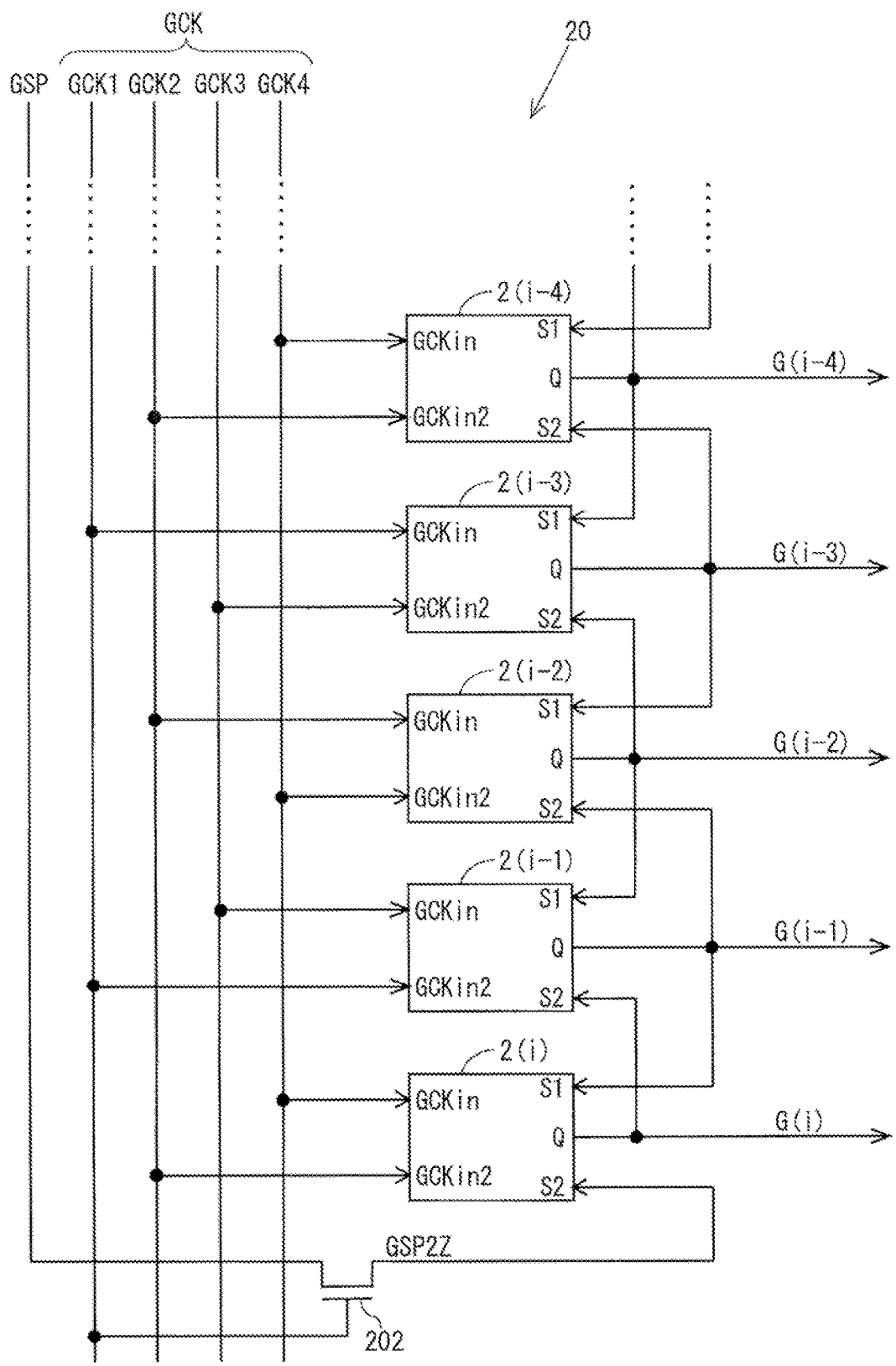
FIG. 26 is a block diagram illustrating a configuration near the last stage of a bidirectional shift register in the fourth embodiment.

FIG. 24 is a block diagram illustrating a configuration near the first stage of the bidirectional shift register 20. FIG. 25 is a diagram illustrating input and output signals of the unit circuit 2(n) of the n-th stage, where n is an integer in a range of 2 or more and (i–1) or less. FIG. 26 is a block diagram illustrating a configuration near the last stage of the bidirectional shift register 20. In the present embodiment, i is a multiple of 4. As illustrated in FIGS. 24 and 26, the bidirectional shift register 20 in the present embodiment is supplied with first to fourth gate clock signals GCK1 to GCK4, which are four-phase clock signals, as a gate clock signal GCK. In the present embodiment, no dummy stage is provided. The unit circuits 2(1) to 2(i) from the first stage to the last stage are connected to the gate bus lines GL disposed in the display portion 500.

Each unit circuit 2 includes an input terminal that receives any of the first to fourth gate clock signals GCK1 to GCK4 as the input gate clock signal GCKin, an input terminal that receives any of the first to fourth gate clock signals GCK1 to GCK4 as a second input gate clock signal GCKin2, an input terminal that receives the first set signal S1, an input terminal that receives the second set signal S2, and an output terminal for outputting the output signal Q. In each unit circuit 2, the phase of the signal supplied as the input gate clock signal GCKin and the phase of the signal supplied as the second input gate clock signal GCKin2 are shifted from each other by 180 degrees.

Basically, each unit circuit 2 is supplied with the output signal Q of the preceding stage as the first set signal S1, and supplied with the output signal Q of the subsequent stage as the second set signal S2 (see FIG. 25). However, the forward shift start pulse signal GSP1Z is supplied as the first set signal S1 to the unit circuit 2(1) of the first stage (see FIG. 24), and the backward shift start pulse signal GSP2Z is supplied as the second set signal S2 to the unit circuit 2(i) of the last stage (see FIG. 26).

The input gate clock signal GCKin and the second input gate clock signal GCKin2 are signals as follows. Note that Z is an integer here. The unit circuit 2(4Z–3) of the (4Z–3)th stage is supplied with the first gate clock signal GCK1 as the input gate clock signal GCKin, and is supplied with the third gate clock signal GCK3 as the second input gate clock signal GCKin2. The unit circuit 2(4Z–2) of the (4Z–2)th stage is supplied with the second gate clock signal GCK2 as the input gate clock signal GCKin, and is supplied with the fourth gate clock signal GCK4 as the second input gate clock signal GCKin2. The unit circuit 2(4Z–1) of the (4Z–1)th stage is supplied with the third gate clock signal GCK3 as the input gate clock signal GCKin, and is supplied with the first gate clock signal GCK1 as the second input gate clock signal GCKin2. The unit circuit 2(4Z) of the 4Zth stage is supplied with the fourth gate clock signal GCK4 as the input gate clock signal GCKin, and is supplied with the second gate clock signal GCK2 as the second input gate clock signal GCKin2.

The output signals Q of the unit circuits 2(1) to 2(i) from the first stage to the last stage are applied as scanning signals G(1) to G(i) to the gate bus lines GL(1) to GL(i), respectively.

Similarly to the first embodiment, the thin film transistor 201 for generating the forward shift start pulse signal GSP1Z through sampling the gate start pulse signal GSP by using the gate clock signal GCK is provided in the vicinity of the first stage unit circuit 2(1), and the thin film transistor 202 for generating the backward shift start pulse signal GSP2Z through sampling the gate start pulse signal GSP by using the gate clock signal GCK is provided in the vicinity of the last stage unit circuit 2(i). However, in the present embodiment, the forward shift start pulse signal GSP1Z is generated through sampling the gate start pulse signal GSP by using the fourth gate clock signal GCK4.

4.2 Configuration and Action of Unit Circuit

Figure 27:
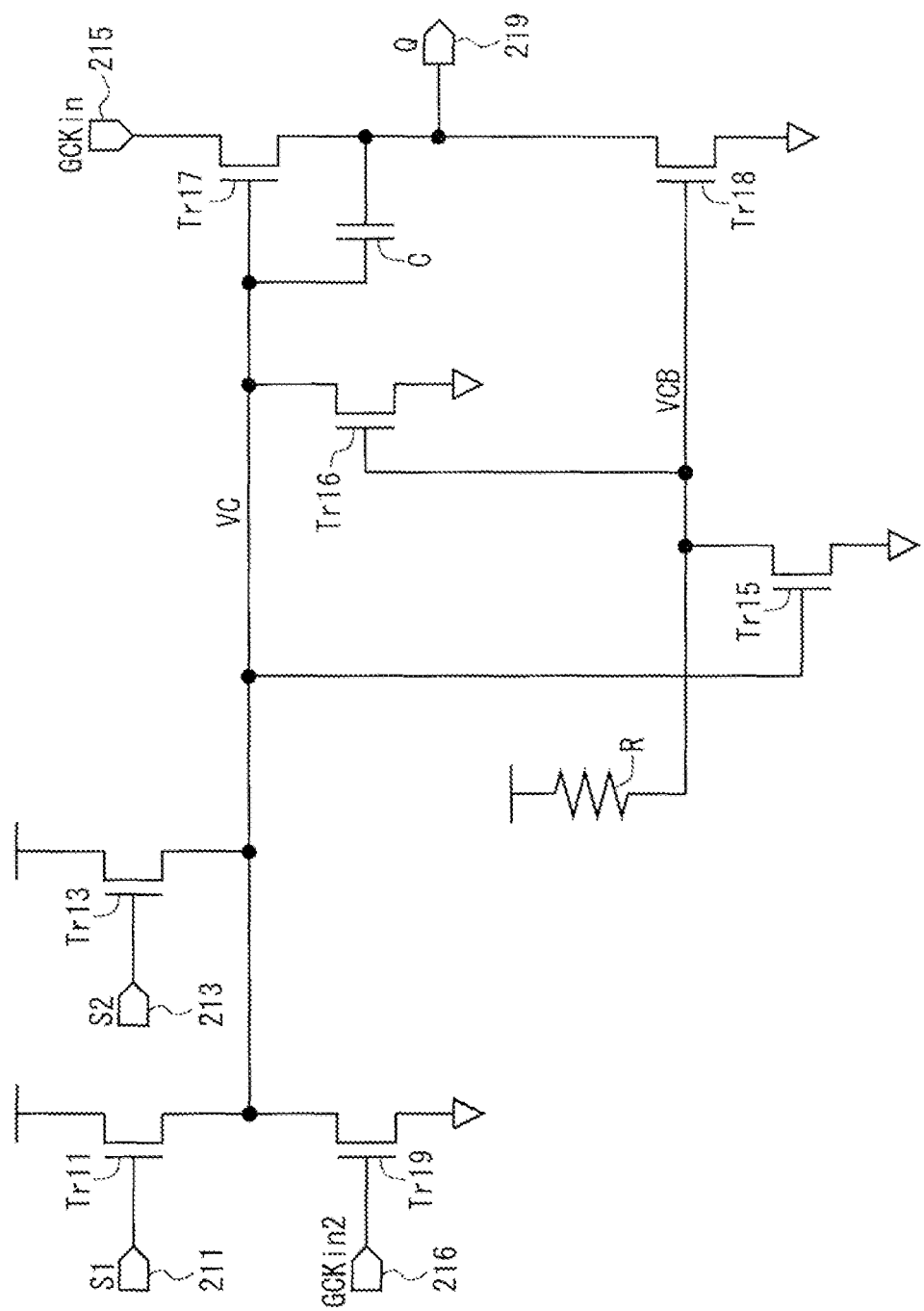
FIG. 27 is a circuit diagram illustrating a configuration of a unit circuit (configuration of one stage of a bidirectional shift register) in the fourth embodiment.

FIG. 27 is a circuit diagram illustrating a configuration of the unit circuit 2 (configuration of one stage of the bidirectional shift register 20) in the present embodiment. In the unit circuit 2, a thin film transistor Tr19 is provided in place of the thin film transistors Tr12 and Tr14 in the first embodiment (see FIG. 7). As for the thin film transistor Tr19, a control terminal is connected to an input terminal 216, a first conduction terminal is connected to a node VC, and a second conduction terminal is connected to an input terminal for the low-level DC power supply voltage VSS. The input terminal 216 is supplied with any of the first to fourth gate clock signals GCK1 to GCK4 as the second input gate clock signal GCKin2. As described above, in the present embodiment, a configuration is adopted in which the state of the node VC is reset using the gate clock signal GCK (the potential of the node VC is lowered down to the low level).

Figure 28:
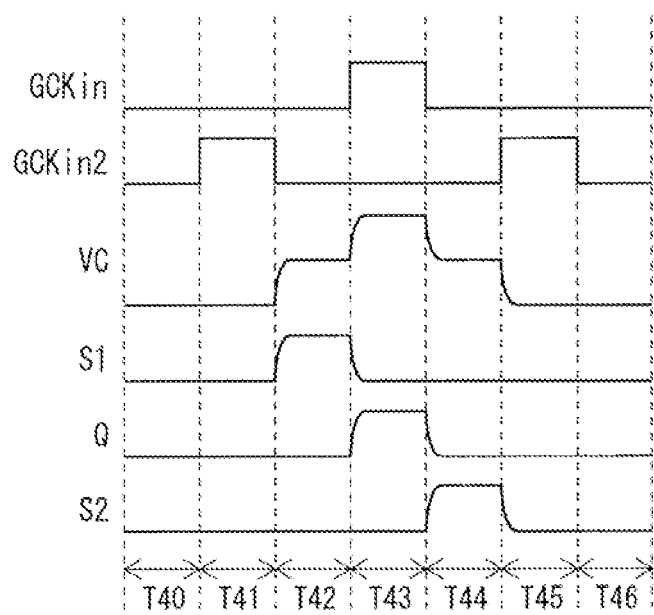
FIG. 28 is a signal waveform diagram for describing action of a unit circuit when a forward shift is performed in the fourth embodiment.

Action of the unit circuit 2 when a forward shift is performed will be described with reference to FIG. 28. In a period before a period T40 and in the period T40, the potential of the node VC, the first set signal S1, the output signal Q, and the second set signal S2 are at the low level.

In a period T41, the second input gate clock signal GCKin2 changes from the low level to the high level. With this, the thin film transistor Tr19 is turned on, but the potential of the node VC is at the low level, so that the state of the thin film transistor Tr17 does not change.

In a period T42, the second input gate clock signal GCKin2 changes from the high level to the low level. With this, the thin film transistor Tr19 is turned off. Further, in the period T42, the first set signal S1 changes from the low level to the high level. With this, the thin film transistor Tr11 is turned on, and a capacitor C is charged. As a result, the potential of the node VC rises, and the thin film transistor Tr17 is turned on. During the period T42, the input gate clock signal GCKin is at the low level. Due to this, during this period, the output signal Q is maintained at the low level.

In a period T43, the input gate clock signal GCKin changes from the low level to the high level. As a result, like in the above-described period T03 (see FIG. 8), the potential of the output signal Q rises up to the high level potential of the input gate clock signal GCKin, and the gate bus line GL connected to the output terminal 219 of the unit circuit 2 is set to be in a selection state.

In a period T44, the input gate clock signal GCKin changes from the high level to the low level. As a result, the potential of the output terminal 219 (the potential of the output signal Q) is lowered as the potential of the input terminal 215 is lowered, and the potential of the node VC is also lowered through the capacitor C. Further, in the period T44, the second set signal S2 changes from the low level to the high level. With this, the thin film transistor Tr13 is turned on. Thus, the potential of the node VC is not lowered down to the low level.

In a period T45, the second set signal S2 changes from the high level to the low level. With this, the thin film transistor Tr13 is turned off. Further, in the period T45, the second input gate clock signal GCKin2 changes from the low level to the high level. With this, the thin film transistor Tr19 is turned on. As a result, the potential of the node VC is lowered completely down to the low level. Furthermore, as in the above-described period T05 (see FIG. 8), the potential of the output terminal 219 (potential of the output signal Q) is completely dropped to the low level.

Figure 29:
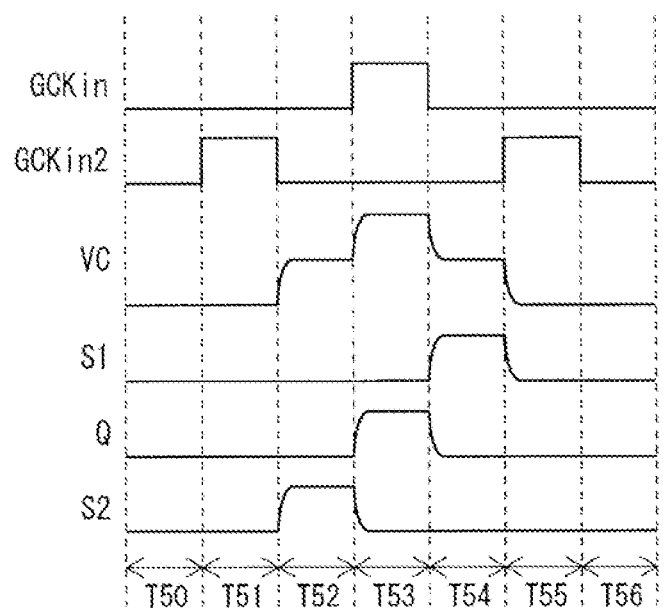
FIG. 29 is a signal waveform diagram for describing action of a unit circuit when a backward shift is performed in the fourth embodiment.

Action of the unit circuit 2 when a backward shift is performed will be described with reference to FIG. 29. In a period before a period T50 and in the period T50, the potential of the node VC, the first set signal S1, the output signal Q, and the second set signal S2 are at the low level.

In a period T51, the second input gate clock signal GCKin2 changes from the low level to the high level. With this, the thin film transistor Tr19 is turned on, but the potential of the node VC is at the low level, so that the state of the thin film transistor Tr17 does not change.

In a period T52, the second input gate clock signal GCKin2 changes from the high level to the low level. With this, the thin film transistor Tr19 is turned off. Further, in the period T52, the second set signal S2 changes from the low level to the high level. With this, the thin film transistor Tr13 is turned on, and the capacitor C is charged. As a result, the potential of the node VC rises, and the thin film transistor Tr17 is turned on. During the period T52, the input gate clock signal GCKin is at the low level. Due to this, during this period, the output signal Q is maintained at the low level.

In a period T53, the input gate clock signal GCKin changes from the low level to the high level. As a result, like in the above-described period T03 (see FIG. 8), the potential of the output signal Q rises up to the high level potential of the input gate clock signal GCKin, and the gate bus line GL connected to the output terminal 219 of the unit circuit 2 is set to be in the selection state.

In a period T54, the input gate clock signal GCKin changes from the high level to the low level. As a result, the potential of the output terminal 219 (the potential of the output signal Q) is lowered as the potential of the input terminal 215 is lowered, and the potential of the node VC is also lowered through the capacitor C. Further, in the period T54, the first set signal S1 changes from the low level to the high level. With this, the thin film transistor Tr11 is turned on. Thus, the potential of the node VC is not lowered down to the low level.

In a period T55, the first set signal S1 changes from the high level to the low level. With this, the thin film transistor Tr11 is turned off. Further, in the period T55, the second input gate clock signal GCKin2 changes from the low level to the high level. With this, the thin film transistor Tr19 is turned on. As a result, the potential of the node VC is lowered completely down to the low level. Furthermore, as in the above-described period T05 (see FIG. 8), the potential of the output terminal 219 (potential of the output signal Q) is completely dropped to the low level.

4.3 Overall Action of Bidirectional Shift Register

Figure 30:
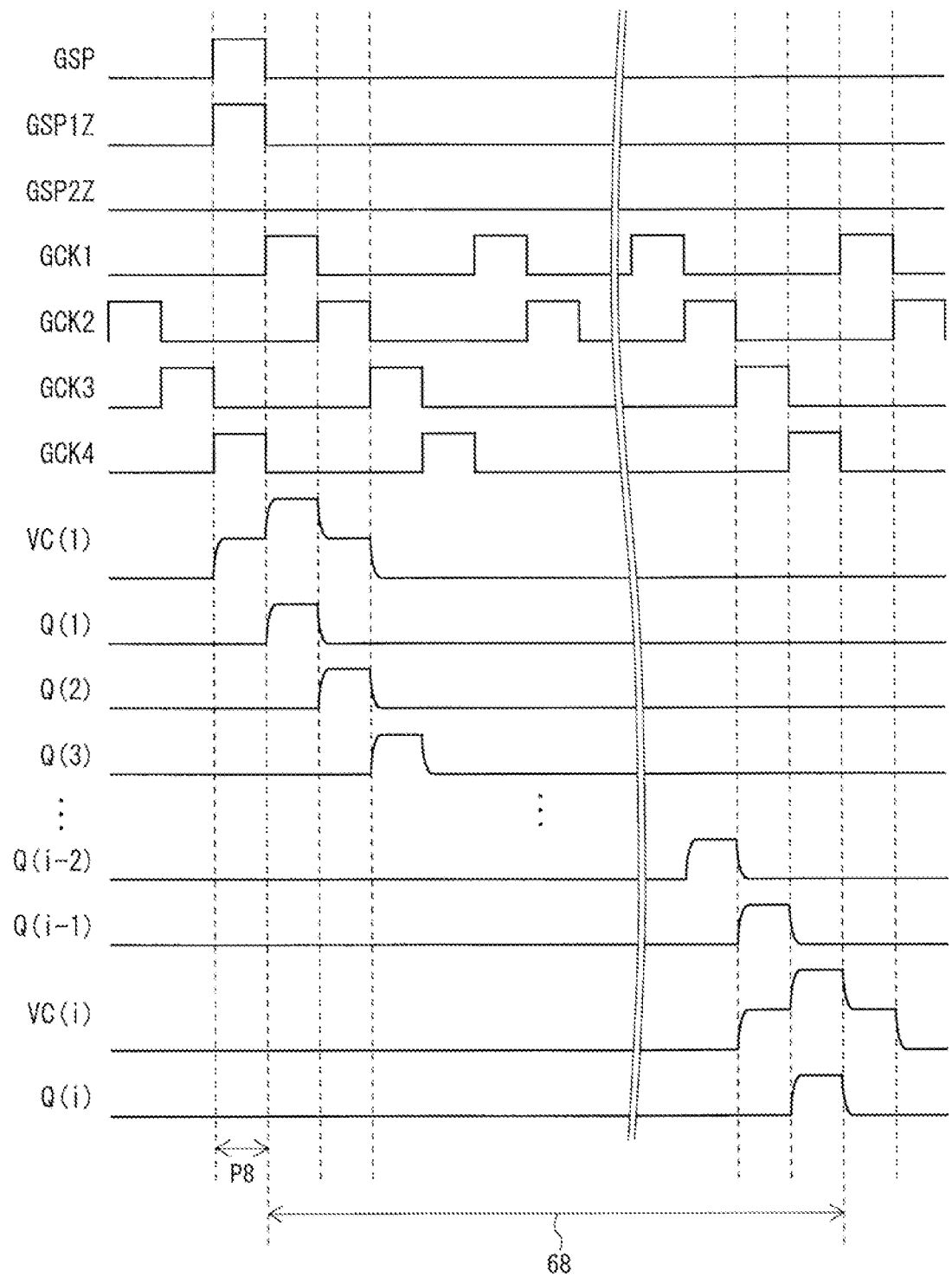
FIG. 30 is a signal waveform diagram for describing overall action of a bidirectional shift register when a forward shift is performed in the fourth embodiment.

Overall action of the bidirectional shift register 20 when the forward shift is performed will be described with reference to FIG. 30. When the forward shift is performed, the gate start pulse signal GSP and the fourth gate clock signal GCK4 are set to be at the high level in a period P8. At this time, the forward shift start pulse signal GSP1Z is set to be at the high level, but the backward shift start pulse signal GSP2Z is maintained at the low level. Thus, the potential of the node VC(1) rises, but the potential of the node VC(i) is maintained at the low level. Because of this, problems like those caused in the known techniques do not occur. Thereafter, the clock pulses are repeatedly generated in the order of the "first gate clock signal GCK1, second gate clock signal GCK2, third gate clock signal GCK3, and fourth gate clock signal GCK4", so that the output signals Q(1) to Q(i) of the unit circuits 2(1) to 2(i) from the first stage to the last stage are each sequentially set to be at the high level for a predetermined period in a period indicated by an arrow mark denoted by a reference sign 68 in FIG. 30. As a result, the writing of the image signal to the pixel capacitance 56 is performed in a sequence from the upper portion toward the lower portion of the image.

Figure 31:
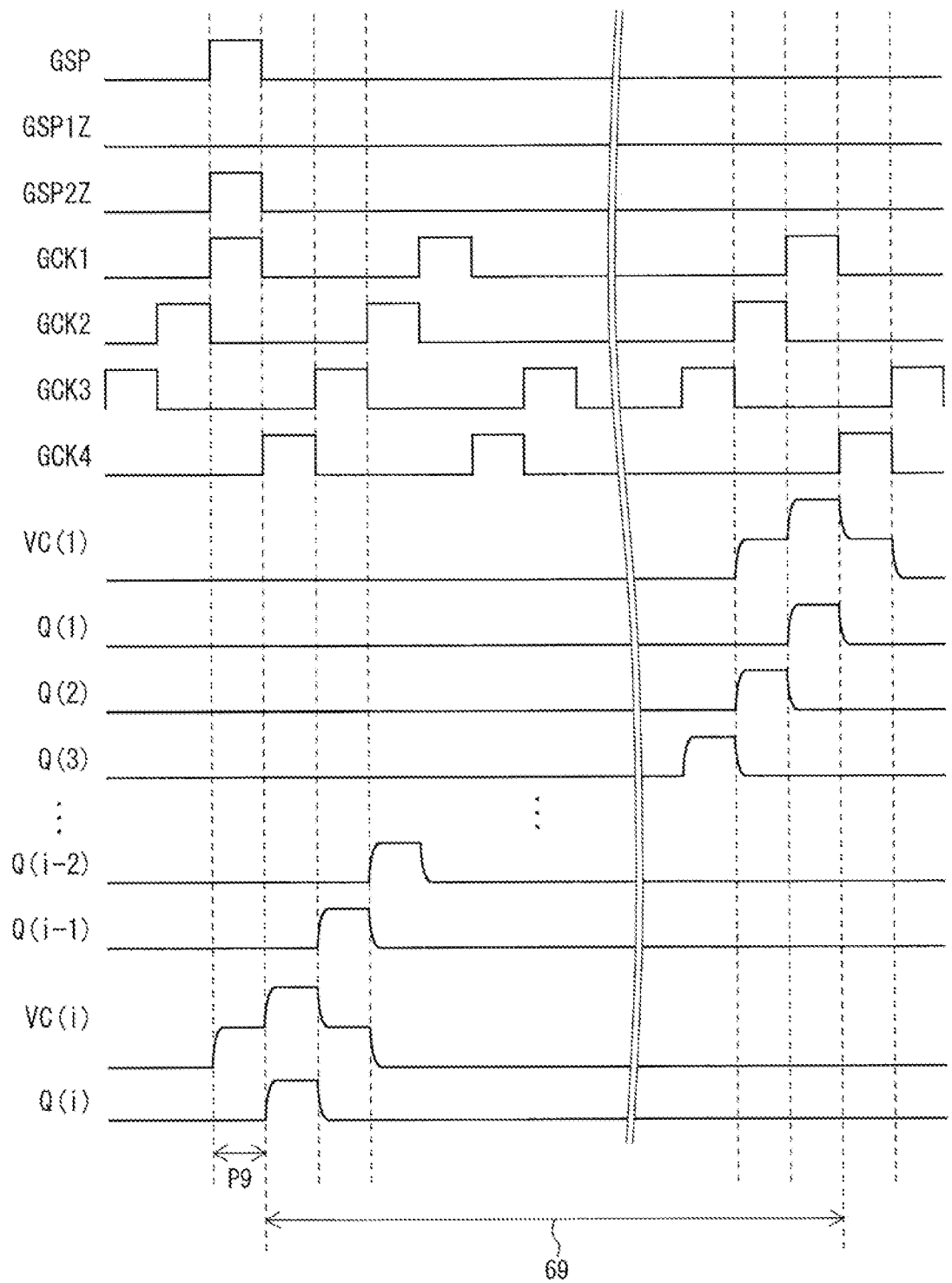
FIG. 31 is a signal waveform diagram for describing overall action of a bidirectional shift register when a backward shift is performed in the fourth embodiment.

Next, overall action of the bidirectional shift register 20 when the backward shift is performed will be described with reference to FIG. 31. When the backward shift is performed, the gate start pulse signal GSP and the first gate clock signal GCK1 are set to be at the high level in a period P9. At this time, the backward shift start pulse signal GSP2Z is set to be at the high level, but the forward shift start pulse signal GSP1Z is maintained at the low level. Thus, the potential of the node VC(i) rises, but the potential of the node VC(1) is maintained at the low level. Because of this, problems like those caused in the known techniques do not occur. Thereafter, the clock pulses are repeatedly generated in the order of the "fourth gate clock signal GCK4, third gate clock signal GCK3, second gate clock signal GCK2, and first gate clock signal GCK1", so that the output signals Q(i) to Q(1) of the unit circuits 2(i) to 2(1) from the last stage to the first stage are each sequentially set to be at the high level for a predetermined period in a period indicated by an arrow mark denoted by a reference sign 69 in FIG. 31. As a result, the writing of the image signal to the pixel capacitance 56 is performed in a sequence from the lower portion toward the upper portion of the image.

4.4 Effects

As in the first embodiment, also in the present embodiment, there is achieved the bidirectional shift register 20 having a smaller circuit area than the known bidirectional shift registers, and being able to switch the shift directions without causing a problem. Further, the number of thin film transistors required in the unit circuit 2 can be reduced by one compared to that of the first embodiment (see FIG. 7). Furthermore, no dummy stage needs to be provided in the bidirectional shift register 20.

4.5 Notes

Figure 32:
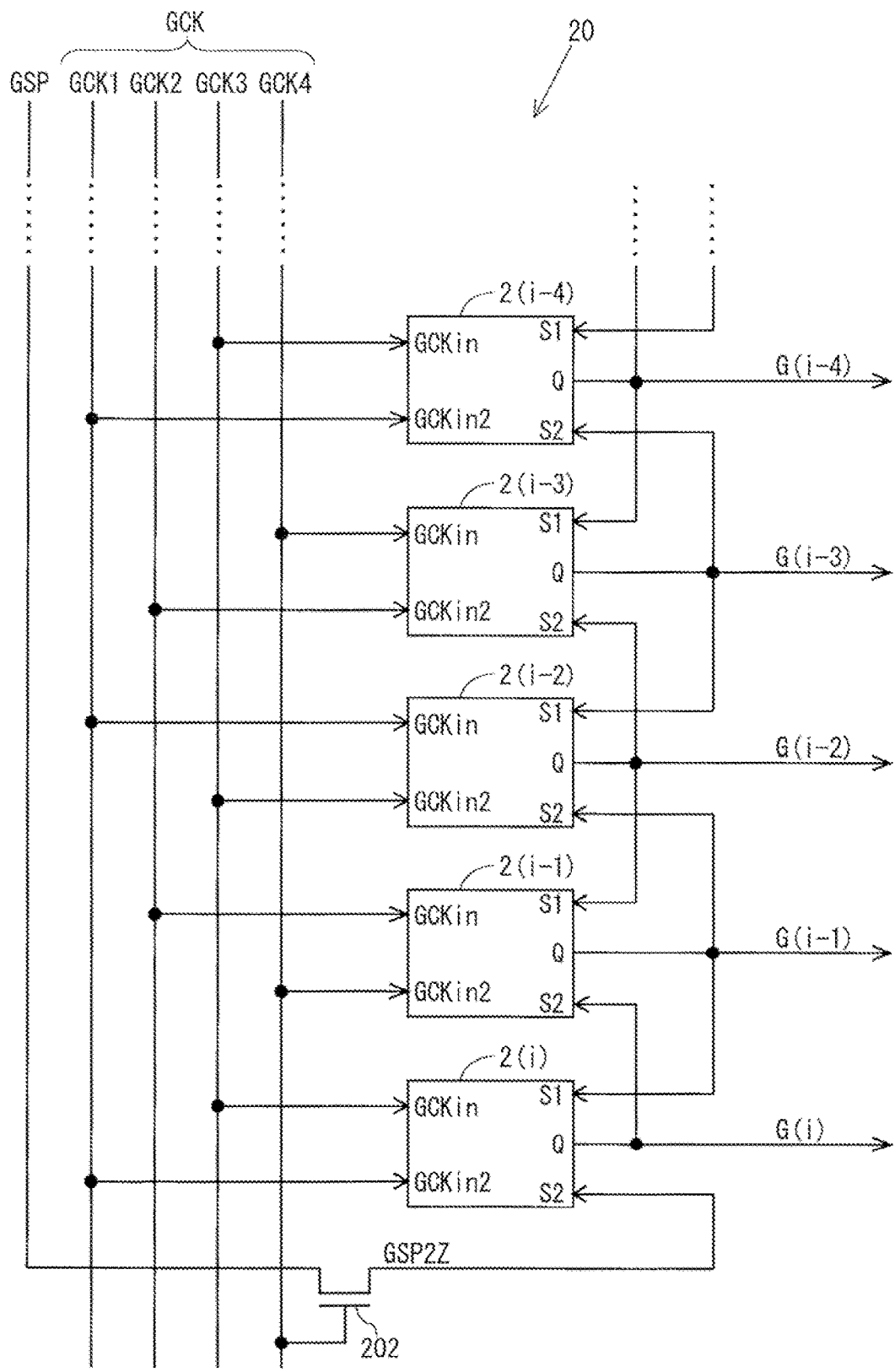
FIG. 32 is a block diagram illustrating a configuration near the last stage of a bidirectional shift register in a case where i (the number of stages of the shift register excluding dummy stages) is (4K+3).
Figure 33:
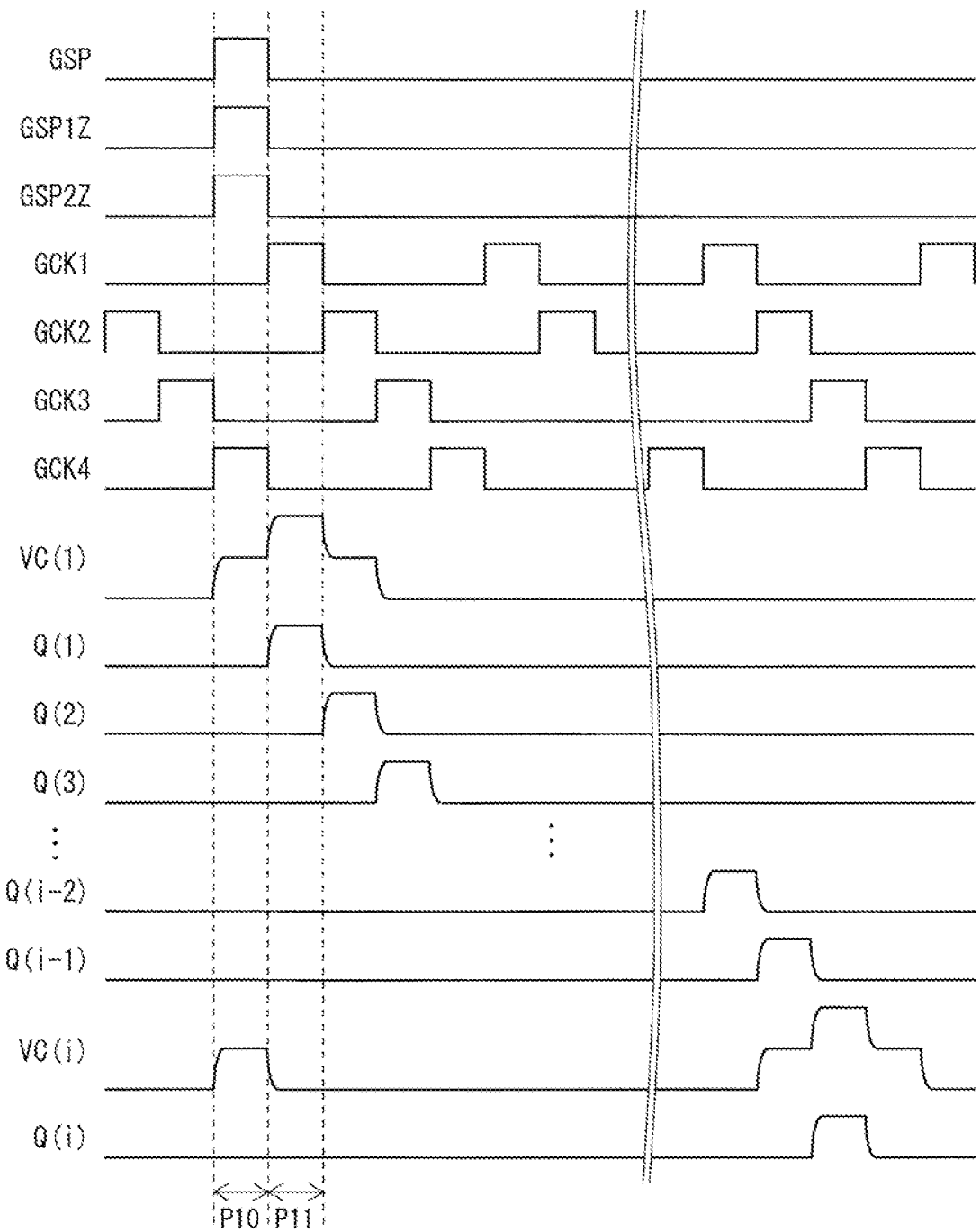
FIG. 33 is a signal waveform diagram for describing overall action of a bidirectional shift register when a forward shift is performed in a case where i is (4K+3).
Figure 34:
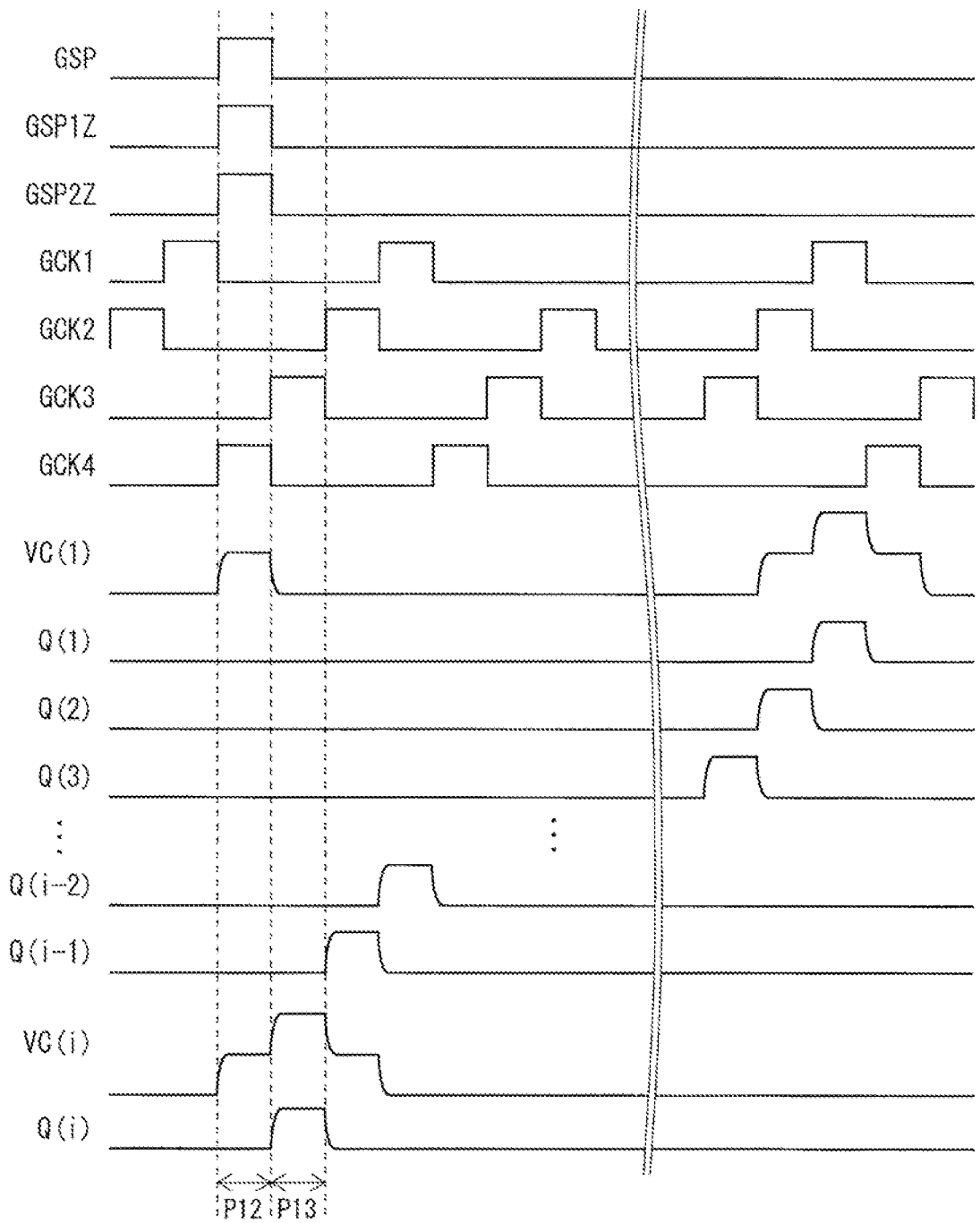
FIG. 34 is a signal waveform diagram for describing overall action of a bidirectional shift register when a backward shift is performed in a case where i is (4K+3).

Hereinafter, a case will be described in which i (the number of stages of the shift register excluding dummy stages) is (4K+3), where K is a natural number. In this case, the configuration near the first stage of the bidirectional shift register 20 takes the configuration illustrated in FIG. 24, and the configuration near the last stage of the bidirectional shift register 20 takes a configuration illustrated in FIG. 32. Accordingly, the forward shift start pulse signal GSP1Z and the backward shift start pulse signal GSP2Z are obtained through sampling the gate start pulse signal GSP by using the fourth gate clock signal GCK4. As a result, when the forward shift is performed, as illustrated in FIG. 33, not only the potential of the node VC(1) but also the potential of the node VC(i) is set to be at the high level in a period P10 when the gate start pulse signal GSP is at the high level. However, in a period P11 immediately after the period P10, the first gate clock signal GCK1 changes from the low level to the high level, so that the second input gate clock signal GCKin2 supplied to the unit circuit 2(i) of the last stage changes from the low level to the high level, and the potential of the node VC(i) is lowered down to the low level. Thus, an unnecessary pulse as the output signal Q(i) is not output from the last stage unit circuit 2(i). When the backward shift is performed, as illustrated in FIG. 34, not only the potential of the node VC(i) but also the potential of the node VC(1) is set to be at the high level in a period P12 when the gate start pulse signal GSP is at the high level. However, in a period P13 immediately after the period P12, the third gate clock signal GCK3 changes from the low level to the high level, so that the second input gate clock signal GCKin2 supplied to the unit circuit 2(1) of the first stage changes from the low level to the high level, and the potential of the node VC(i) is lowered down to the low level. Thus, an unnecessary pulse as the output signal Q(1) is not output from the first stage unit circuit 2(1). As described above, problems such as those caused in the known techniques do not occur even in a case where i is (4K+3). However, in this case, even when the gate start pulse signal GSP is directly supplied to the unit circuit 2(1) of the first stage and the unit circuit 2(i) of the last stage, the same action is carried out. In other words, none of the thin film transistors 201 and 202 for sampling the gate start pulse signal GSP are necessary.

In a case where i (the number of stages of the shift register excluding dummy stages) is (4K+1) or (4K+2), where K is a natural number, by providing the thin film transistors 201 and 202 for sampling the gate start pulse signal GSP in the bidirectional shift register 20 in the same manner as in the fourth embodiment described above, it is possible to switch the shift directions without causing a problem.

5. Fifth Embodiment 5.1 Overall Configuration of Bidirectional Shift Register

The configuration of the bidirectional shift register 20 in the present embodiment is substantially the same as the configuration of the bidirectional shift register 20 in the fourth embodiment described above. However, a configuration for generating the forward shift start pulse signal GSP1Z and the backward shift start pulse signal GSP2Z is different from that of the fourth embodiment.

Figure 35:
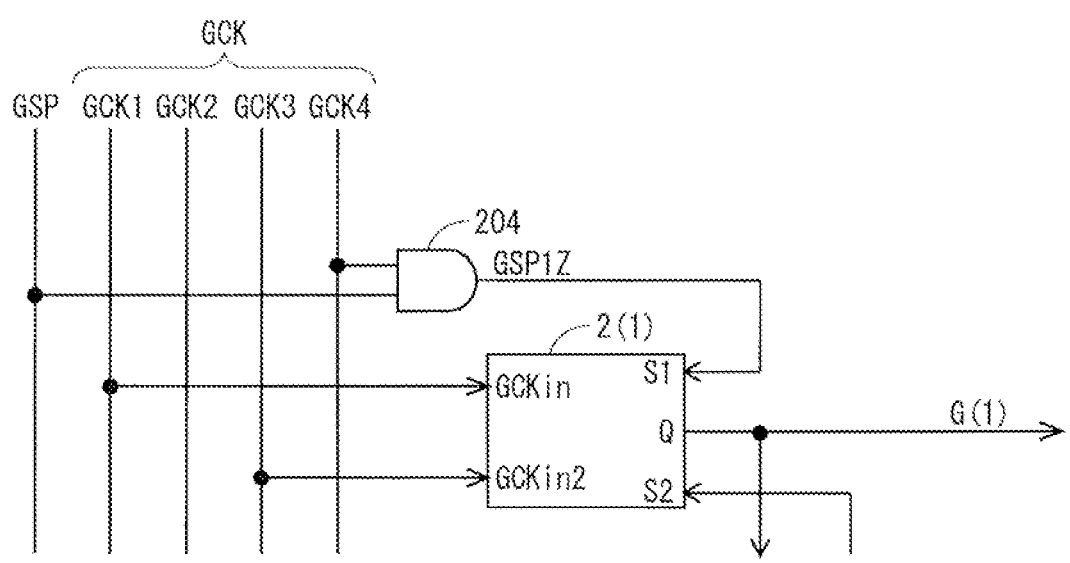
FIG. 35 is a diagram for describing a configuration to generate a forward shift start pulse signal in a fifth embodiment.

In the present embodiment, similarly to the above-described second embodiment, the forward shift start pulse signal GSP1Z and the backward shift start pulse signal GSP2Z are obtained through sampling the gate start pulse signal GSP by using logic circuits. Specifically, as illustrated in FIG. 35, in the vicinity of the first stage unit circuit 2(1), there is provided an AND circuit 204 configured to output a signal indicating a logical product of the fourth gate clock signal GCK4 and the gate start pulse signal GSP, as the forward shift start pulse signal GSP1Z. Similarly, in the vicinity of the last stage unit circuit 2(i), there is provided an AND circuit (not illustrated) configured to output a signal indicating a logical product of the first gate clock signal GCK1 and the gate start pulse signal GSP, as the backward shift start pulse signal GSP2Z. With the configuration described above, the forward shift start pulse signal GSP1Z is maintained at the high level during a period when both the gate start pulse signal GSP and the fourth gate clock signal GCK4 are at the high level, and the backward shift start pulse signal GSP2Z is maintained at the high level during a period when both the gate start pulse signal GSP and the first gate clock signal GCK1 are at the high level.

5.2 Configuration and Action of Unit Circuit

Figure 36:
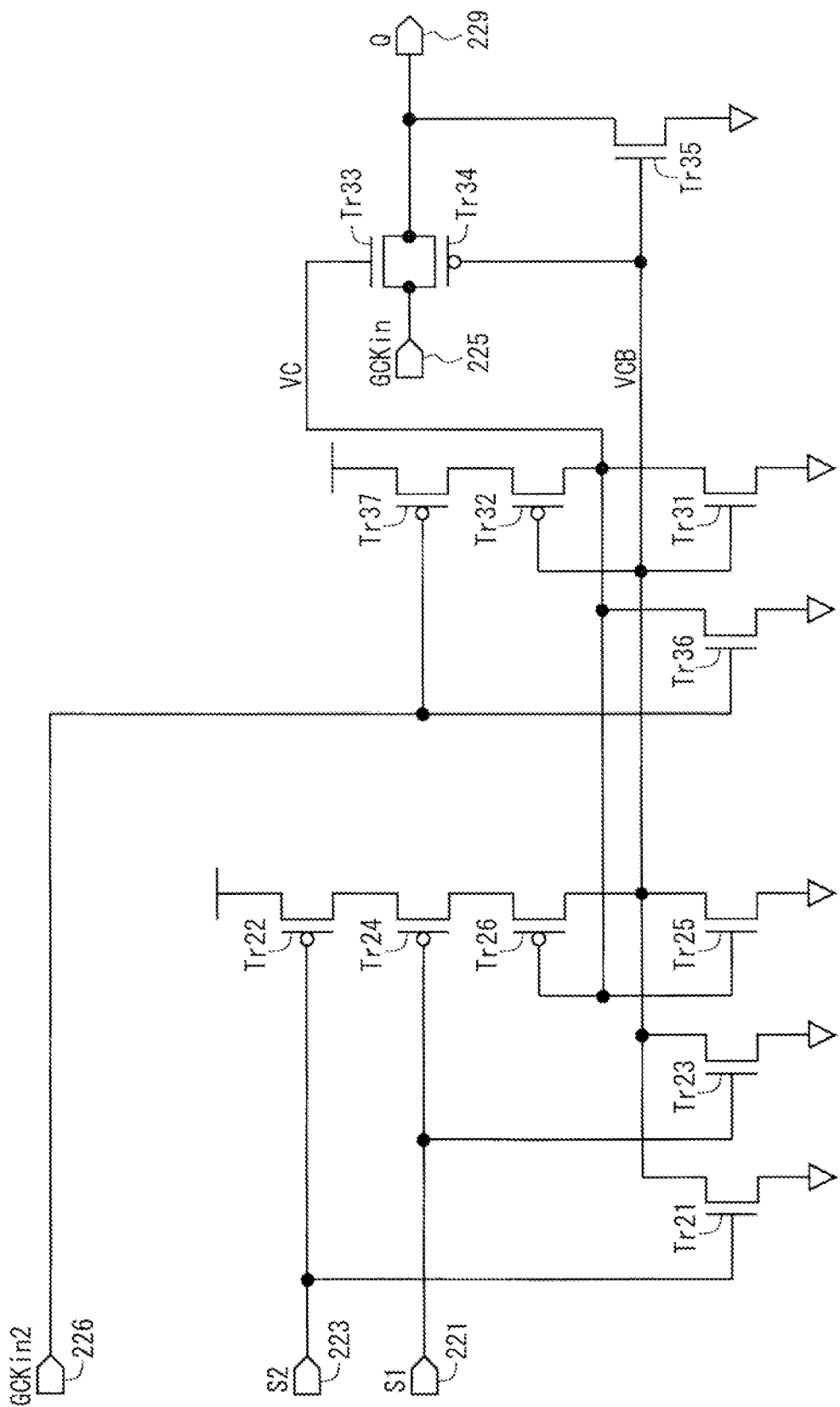
FIG. 36 is a circuit diagram illustrating a configuration of a unit circuit (configuration of one stage of a bidirectional shift register) in the fifth embodiment.

FIG. 36 is a circuit diagram illustrating a configuration of the unit circuit 2 (configuration of one stage of the bidirectional shift register 20) in the present embodiment. In the unit circuit 2, thin film transistors Tr36 and Tr37 are provided in place of the thin film transistors Tr27, Tr28, Tr29, and Tr30 in the second embodiment (see FIG. 13). As for the thin film transistor Tr36, a control terminal is connected to an input terminal 226, a first conduction terminal is connected to a node VC, and a second conduction terminal is connected to an input terminal for the low-level DC power supply voltage VSS. As for the thin film transistor Tr37, the control terminal is connected to the input terminal 226, the first conduction terminal is connected to an input terminal for the high-level DC power supply voltage VDD, and the second conduction terminal is connected to the first conduction terminal of the thin film transistor Tr32. The input terminal 226 is supplied with any of the first to fourth gate clock signals GCK1 to GCK4 as the second input gate clock signal GCKin2. As is understood from FIG. 36, in the present embodiment, a configuration using a CMOS is employed for the configuration of the unit circuit 2 in a similar manner to that of the second embodiment. Further, similar to the fourth embodiment, a configuration is employed in which the state of the node VC is reset using the gate clock signal GCK.

Figure 37:
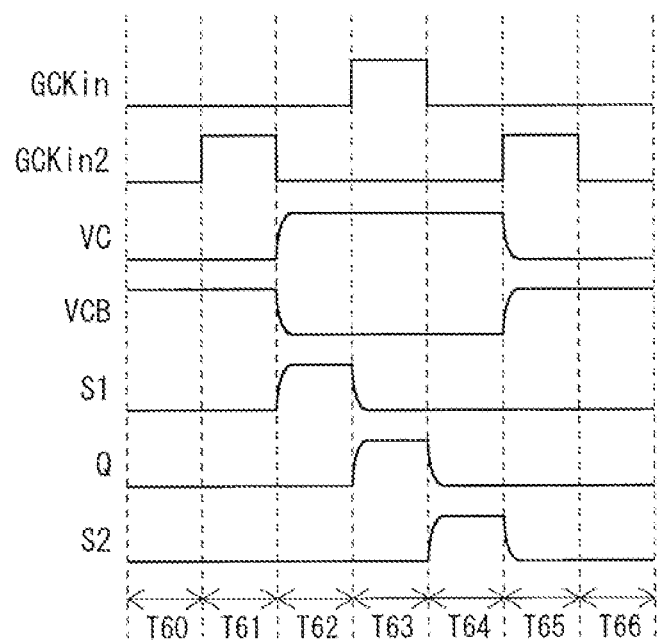
FIG. 37 is a signal waveform diagram for describing action of a unit circuit when a forward shift is performed in the fifth embodiment.

Action of the unit circuit 2 when a forward shift is performed will be described with reference to FIG. 37. In a period T60, the potential of the node VC, the first set signal S1, an output signal Q, and the second set signal S2 are at the low level, while the potential of a node VCB is at the high level. During this period, the thin film transistors Tr22, Tr24, Tr26, Tr31, Tr35, and Tr37 are in an on state, and the thin film transistors Tr21, Tr23, Tr25, Tr32, Tr33, Tr34, and Tr36 are in an off state.

In a period T61, the second input gate clock signal GCKin2 changes from the low level to the high level. With this, the thin film transistor Tr36 is turned on, but the potential of the node VC is at the low level, so that the state of the thin film transistor Tr33 does not change.

In a period T62, the second input gate clock signal GCKin2 changes from the high level to the low level. With this, the thin film transistor Tr36 is turned off. Further, in the period T62, the first set signal S1 changes from the low level to the high level. With this, like in the period T22 (see FIG. 14), each of the thin film transistor Tr33 and the thin film transistor Tr34 is set to be in the on state. However, during the period T62, the input gate clock signal GCKin is at the low level. Due to this, during this period, the output signal Q is maintained at the low level.

In a period T63, the input gate clock signal GCKin changes from the low level to the high level. With this, like in the period T23 (see FIG. 14), the output signal Q is set to be at the high level, and the gate bus line GL connected to the output terminal 229 of the unit circuit 2 is set to be in a selection state.

In a period T64, the input gate clock signal GCKin changes from the high level to the low level. Consequently, like in the period T24 (see FIG. 14), the output signal Q is also set to be at the low level. Further, in the period T64, the second set signal S2 changes from the low level to the high level. With this, the thin film transistor Tr21 is turned on. Thus, the potential of the node VCB is maintained at the low level.

In a period T65, the second set signal S2 changes from the high level to the low level. With this, the thin film transistor Tr21 is turned off. Further, in the period T65, the second input gate clock signal GCKin2 changes from the low level to the high level. With this, the thin film transistor Tr36 is turned on, and the potential of the node VC is set to be at the low level. As a result, the thin film transistors Tr25 and Tr33 are turned off, and the thin film transistor Tr26 is turned on. This causes the potential of the node VCB to be at the high level. As a result, the thin film transistors Tr31 and Tr35 are turned on, and the thin film transistors Tr32 and Tr34 are turned off. As described above, during the period T65, each of the thin film transistor Tr33 and the thin film transistor Tr34 is in the off state.

Figure 38:
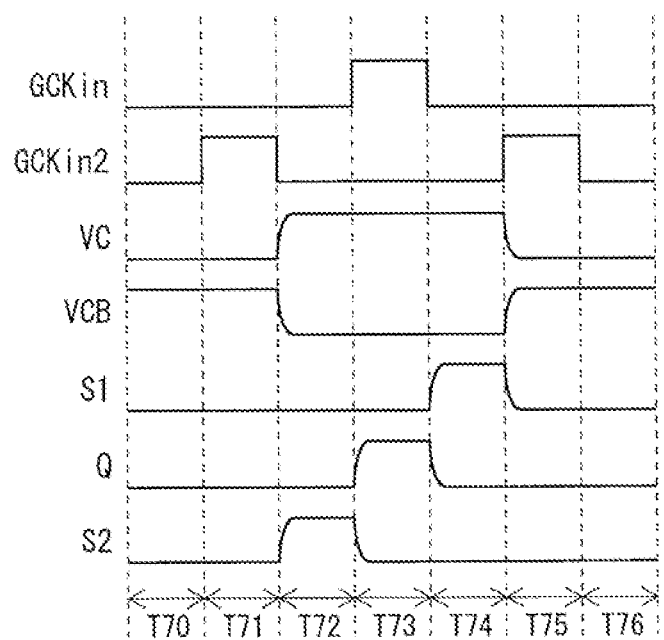
FIG. 38 is a signal waveform diagram for describing action of a unit circuit when a backward shift is performed in the fifth embodiment.

Action of the unit circuit 2 when a backward shift is performed will be described with reference to FIG. 38. Signal waveforms in a period T70 are the same as those in the period T60 (see FIG. 37).

In a period T71, the second input gate clock signal GCKin2 changes from the low level to the high level. With this, the thin film transistor Tr36 is turned on, but the potential of the node VC is at the low level, so that the state of the thin film transistor Tr33 does not change.

In a period T72, the second input gate clock signal GCKin2 changes from the high level to the low level. With this, the thin film transistor Tr36 is turned off. Further, in the period T72, the second set signal S2 changes from the low level to the high level. With this, like in the period T22 (see FIG. 14), each of the thin film transistor Tr33 and the thin film transistor Tr34 is set to be in the on state. However, during the period T72, the input gate clock signal GCKin is at the low level. Due to this, during this period, the output signal Q is maintained at the low level.

In a period T73, the input gate clock signal GCKin changes from the low level to the high level. With this, like in the period T23 (see FIG. 14), the output signal Q is set to be at the high level, and the gate bus line GL connected to the output terminal 229 of the unit circuit 2 is set to be in the selection state.

In a period T74, the input gate clock signal GCKin changes from the high level to the low level. Consequently, like in the period T24 (see FIG. 14), the output signal Q is also set to be at the low level. Further, in the period T74, the first set signal S1 changes from the low level to the high level. With this, the thin film transistor Tr23 is turned on. Thus, the potential of the node VCB is maintained at the low level.

In a period T75, the first set signal S1 changes from the high level to the low level. With this, the thin film transistor Tr23 is turned off. Further, in the period T75, the second input gate clock signal GCKin2 changes from the low level to the high level. With this, the thin film transistor Tr36 is turned on, and the potential of the node VC is set to be at the low level. As a result, like in the period T25 (see FIG. 14), the potential of the node VCB is set to be at the high level. As described above, during the period T75, each of the thin film transistor Tr33 and the thin film transistor Tr34 is in the off state.

5.3 Overall Action of Bidirectional Shift Register

Figure 39:
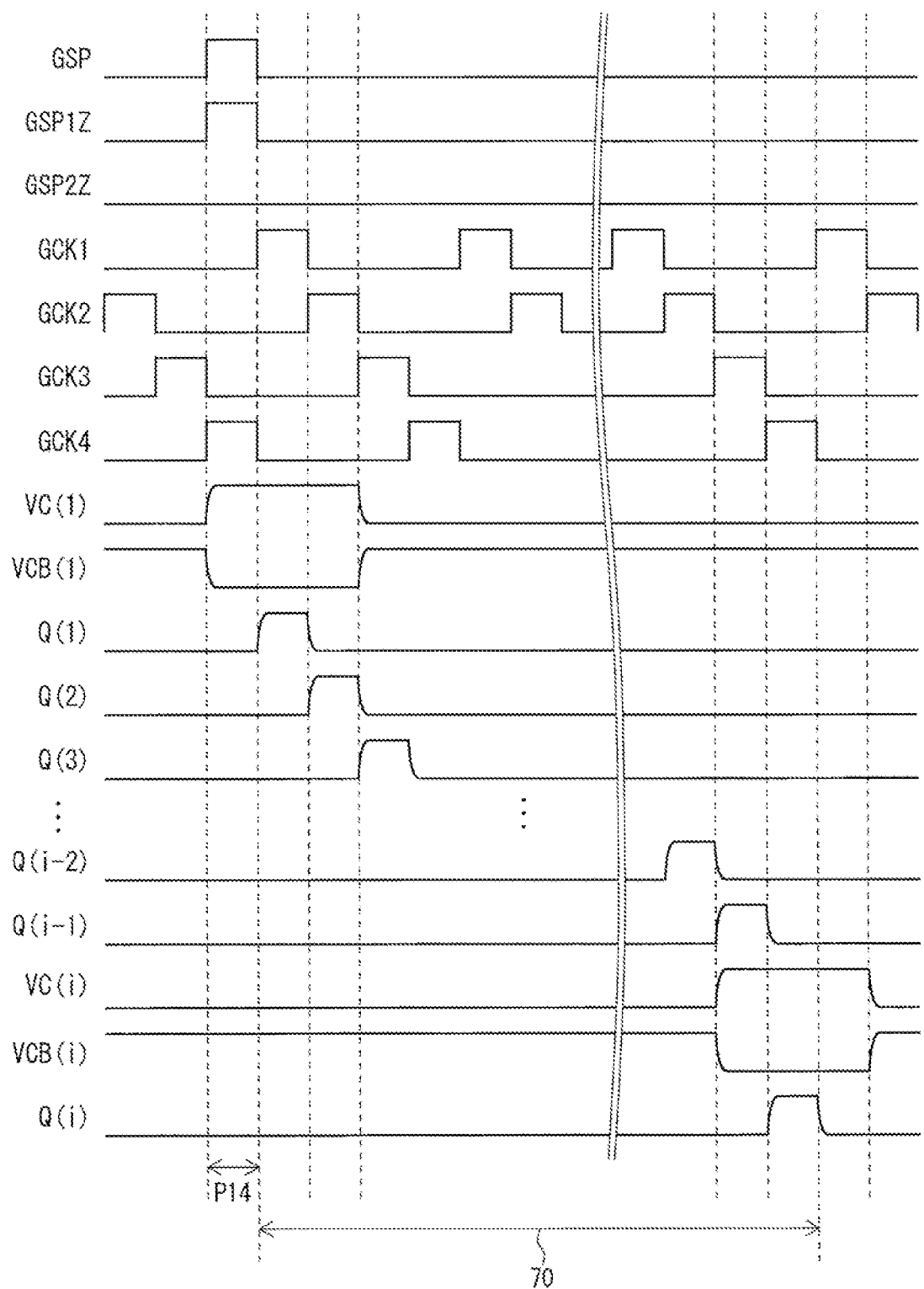
FIG. 39 is a signal waveform diagram for describing overall action of a bidirectional shift register when a forward shift is performed in the fifth embodiment.

Overall action of the bidirectional shift register 20 when a forward shift is performed will be described with reference to FIG. 39. When the forward shift is performed, the gate start pulse signal GSP and the fourth gate clock signal GCK4 are set to be at the high level in a period P14. The forward shift start pulse signal GSP1Z is set to be at the high level when both the gate start pulse signal GSP and the fourth gate clock signal GCK4 are at the high level; the backward shift start pulse signal GSP2Z is set to be at the high level when both the gate start pulse signal GSP and the first gate clock signal GCK1 are at the high level. Accordingly, during the period P14, the forward shift start pulse signal GSP1Z is at the high level, but the backward shift start pulse signal GSP2Z is maintained at the low level. Thus, the potential of the node VC(1) rises, but the potential of the node VC(i) is maintained at the low level. The potential of the node VCB(1) is lowered, but the potential of the node VCB(i) is maintained at the high level. Because of this, problems like those caused in the known techniques do not occur. Thereafter, the clock pulses are repeatedly generated in the order of the "first gate clock signal GCK1, second gate clock signal GCK2, third gate clock signal GCK3, and fourth gate clock signal GCK4", so that the output signals Q(1) to Q(i) of the unit circuits 2(1) to 2(i) from the first stage to the last stage are each sequentially set to be at the high level for a predetermined period in a period indicated by an arrow mark denoted by a reference sign 70 in FIG. 39. As a result, the writing of the image signal to the pixel capacitance 56 is performed in a sequence from the upper portion toward the lower portion of the image.

Figure 40:
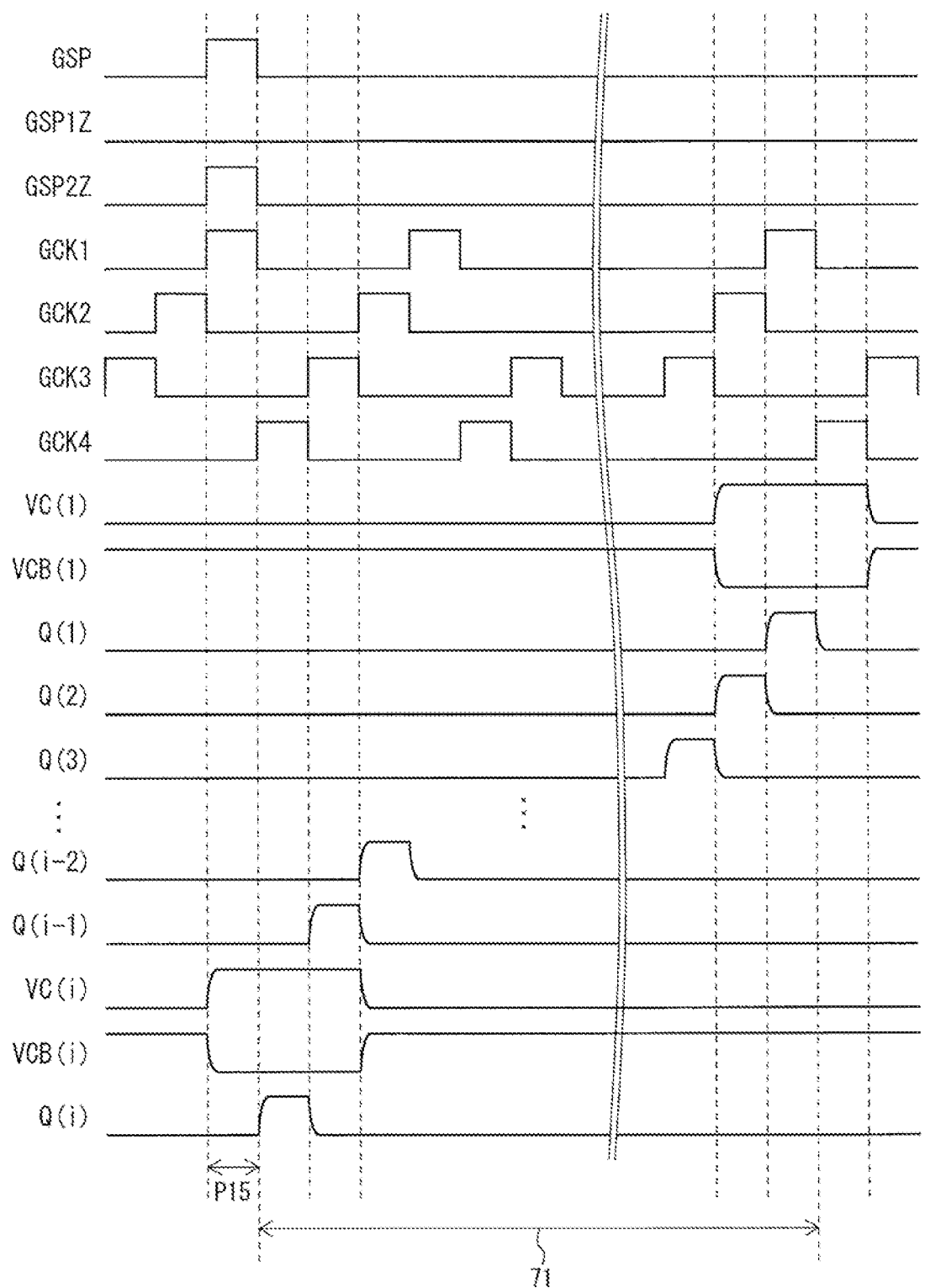
FIG. 40 is a signal waveform diagram for describing overall action of a bidirectional shift register when a backward shift is performed in the fifth embodiment.

Next, overall action of the bidirectional shift register 20 when the backward shift is performed will be described with reference to FIG. 40. When the backward shift is performed, the gate start pulse signal GSP and the first gate clock signal GCK1 are set to be at the high level in a period P15. With this, during the period P15, the backward shift start pulse signal GSP2Z is set to be at the high level, but the forward shift start pulse signal GSP1Z is maintained at the low level. Thus, the potential of the node VC(i) rises, but the potential of the node VC(1) is maintained at the low level. The potential of the node VCB(i) is lowered, but the potential of the node VCB(1) is maintained at the high level. Because of this, problems like those caused in the known techniques do not occur. Thereafter, the clock pulses are repeatedly generated in the order of the "fourth gate clock signal GCK4, third gate clock signal GCK3, second gate clock signal GCK2, and first gate clock signal GCK1", so that the output signals Q(i) to Q(1) of the unit circuits 2(i) to 2(1) from the last stage to the first stage are each sequentially set to be at the high level for a predetermined period in a period indicated by an arrow mark denoted by a reference sign 71 in FIG. 40. As a result, the writing of the image signal to the pixel capacitance 56 is performed in a sequence from the lower portion toward the upper portion of the image.

5.4 Effects

As in the first embodiment, also in the present embodiment, there is achieved the bidirectional shift register 20 having a smaller circuit area than the known bidirectional shift registers, and being able to switch the shift directions without causing a problem. Further, the number of thin film transistors required in the unit circuit 2 can be reduced by two compared to that of the second embodiment (see FIG. 13). Furthermore, no dummy stage needs to be provided in the bidirectional shift register 20.

6. Modified Examples and Others

Modified examples will be described below.

Figure 41:
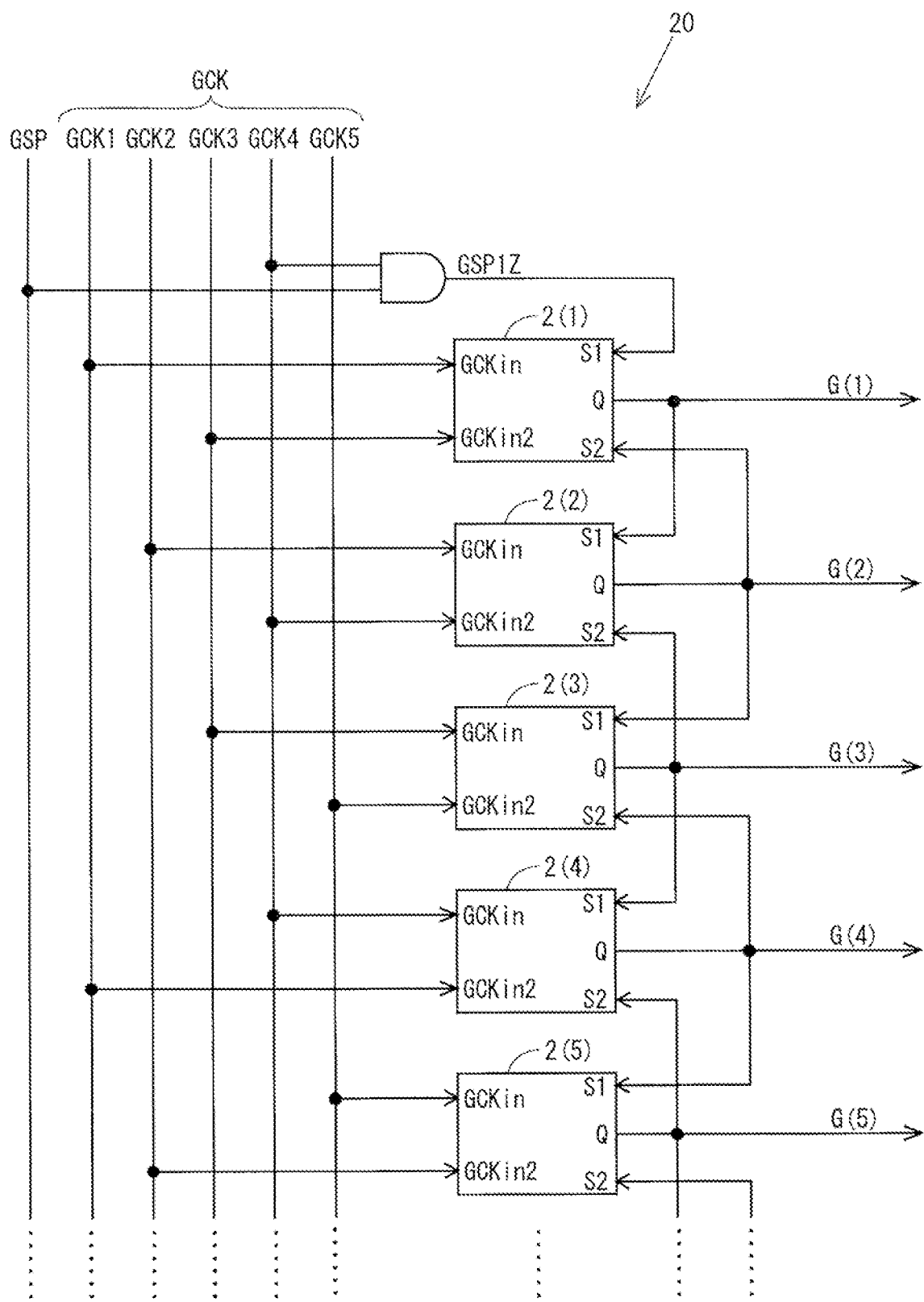
FIG. 41 is a block diagram illustrating an example of a configuration near the first stage of a bidirectional shift register in a case where five-phase clock signals are used as gate clock signals.

In the above first to third embodiments, three-phase clock signals are used as the gate clock signal GCK, and in the fourth and fifth embodiments, four-phase clock signals are used as the gate clock signal GCK. However, the clock signals are not limited thereto, and a configuration may be employed in which five-phase clock signals are used as the gate clock signal GCK. In this case, the configuration near the first stage of the bidirectional shift register 20 takes a configuration as illustrated in FIG. 41, for example. Further, a configuration may be employed in which clock signals of six or more phases are used as the gate clock signal GCK.

Figure 42:
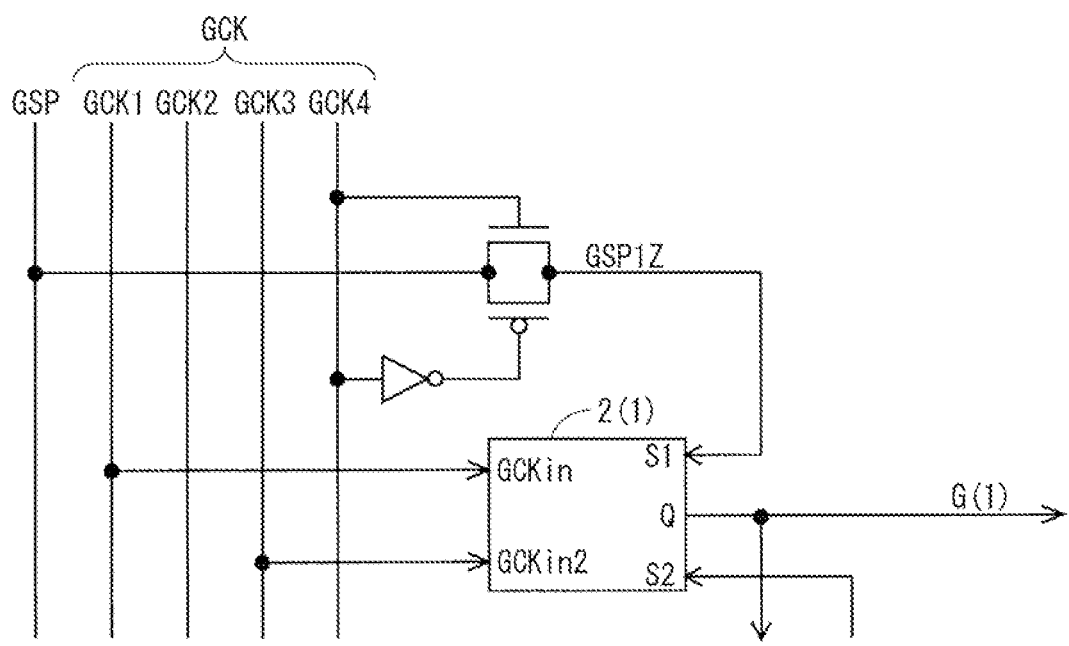
FIG. 42 is a diagram for describing a case in which a gate start pulse signal is sampled using a CMOS switch.

For example, as illustrated in FIG. 42, the forward shift start pulse signal GSP1Z may be generated through sampling the gate start pulse signal GSP by using a CMOS switch. The same applies to the backward shift start pulse signal GSP2Z.

Figure 43:
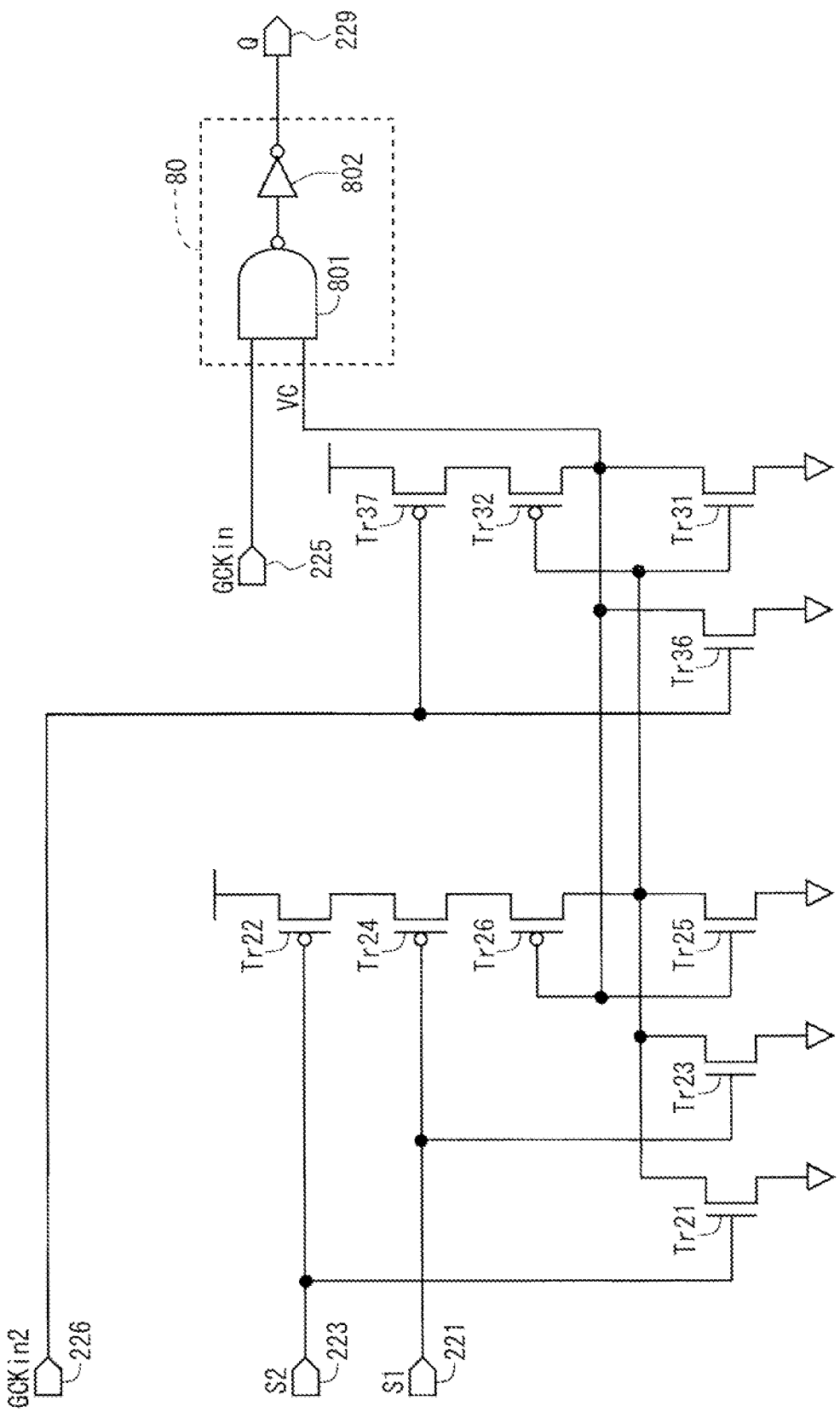
FIG. 43 is a circuit diagram for describing an example of configuring a buffer in a unit circuit by using a NAND circuit.
Figure 44:
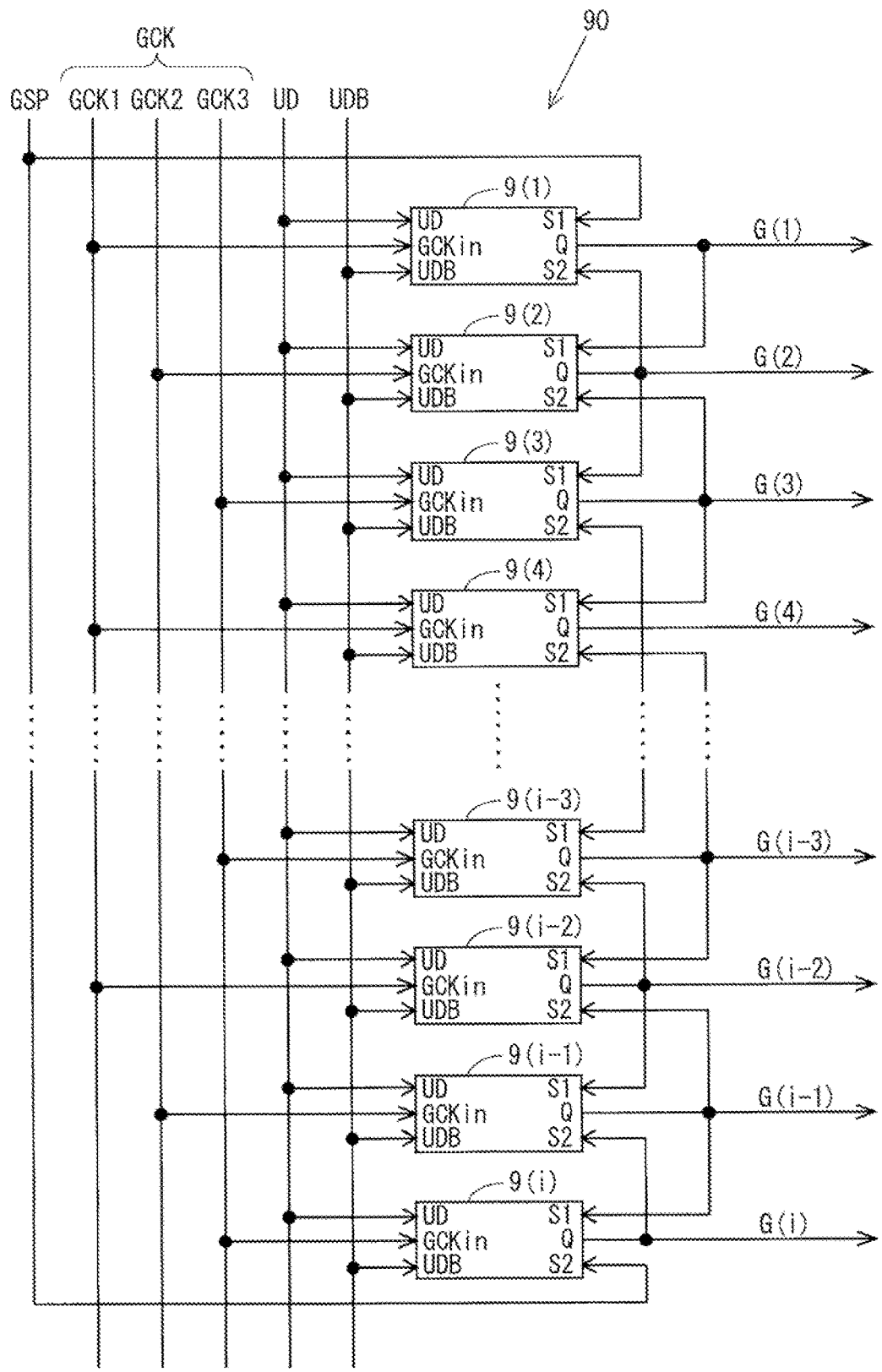
FIG. 44 is a block diagram illustrating a configuration example of a bidirectional shift register constituting a gate driver of a known liquid crystal display device.
Figure 45:
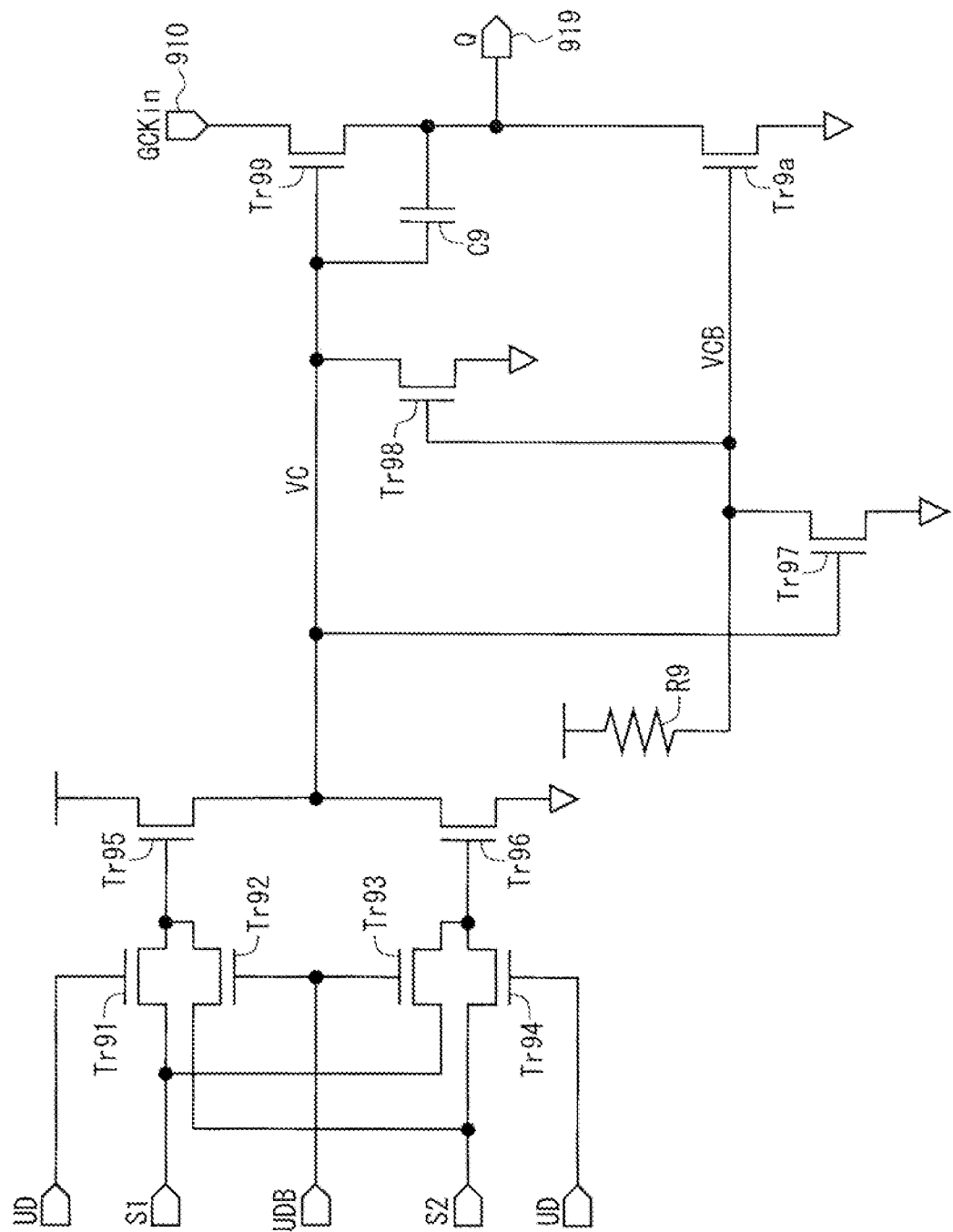
FIG. 45 is a circuit diagram illustrating a configuration example of a unit circuit included in a known bidirectional shift register.
Figure 46:
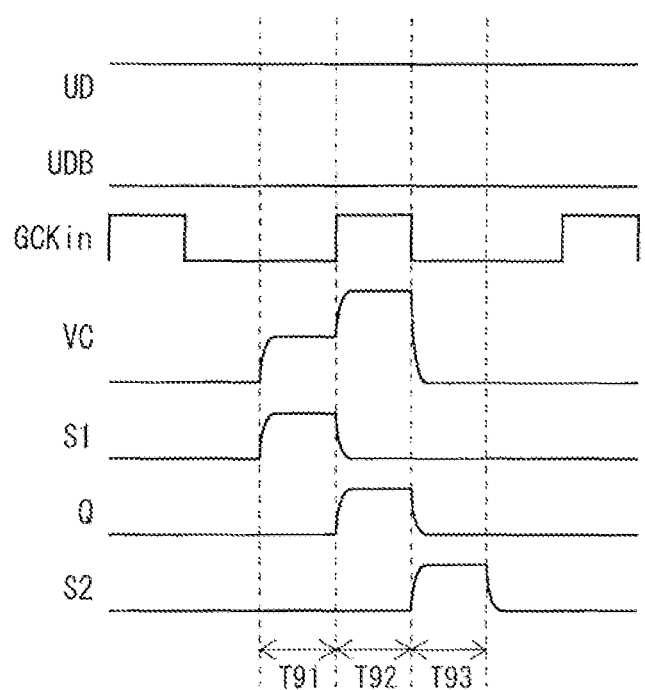
FIG. 46 is a signal waveform diagram for describing action of a unit circuit when a forward shift is performed in a known example.
Figure 47:
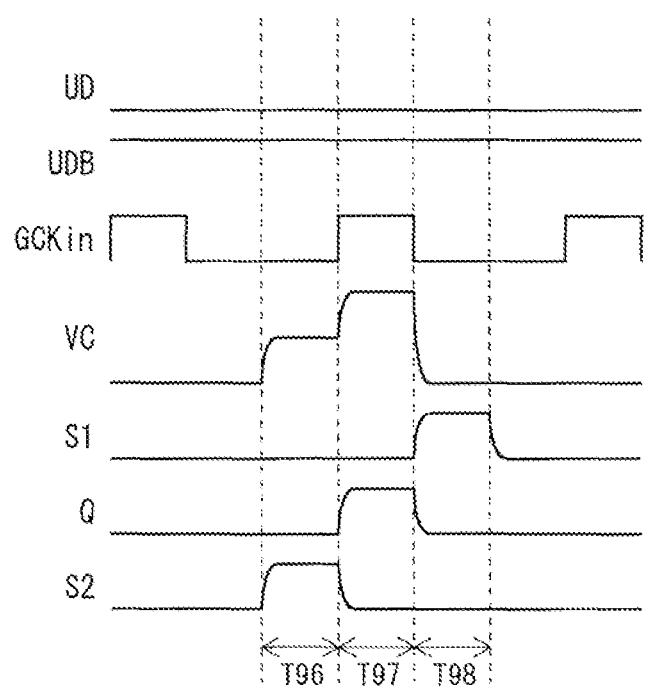
FIG. 47 is a signal waveform diagram for describing action of a unit circuit when a backward shift is performed in the known example.
Figure 48:
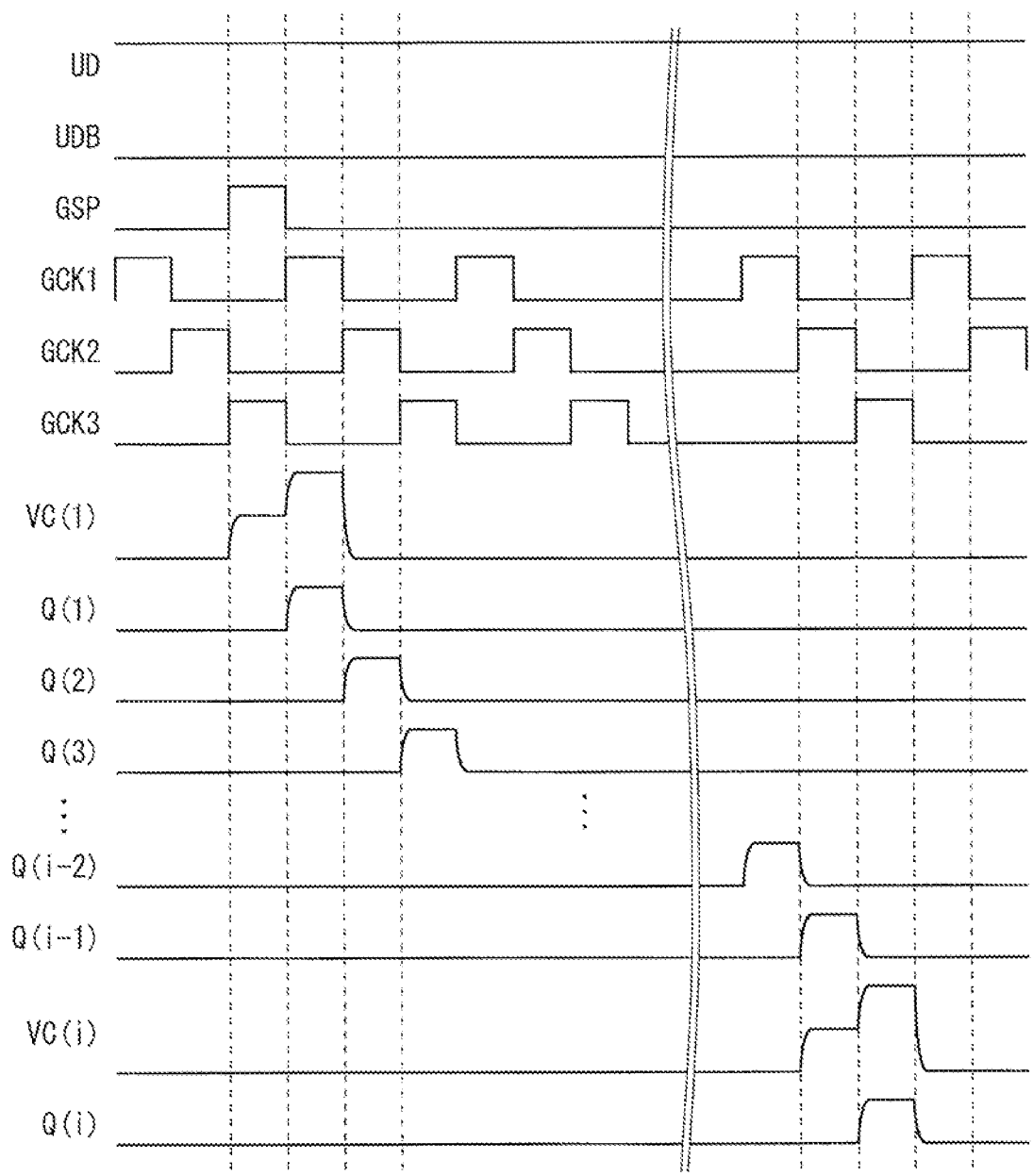
FIG. 48 is a signal waveform diagram for describing overall action of a bidirectional shift register when a forward shift is performed in the known example.
Figure 49:
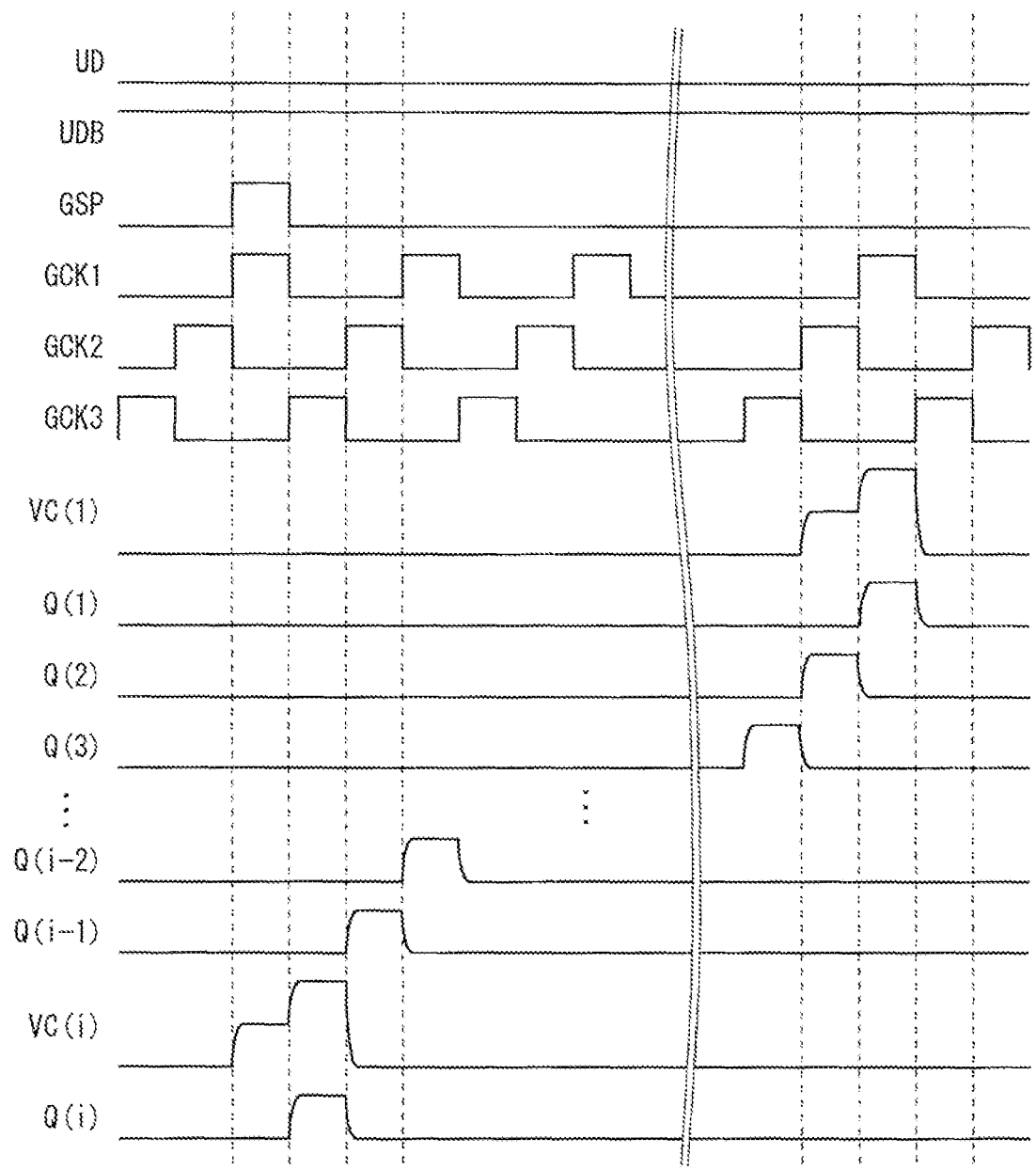
FIG. 49 is a signal waveform diagram for describing overall action of a bidirectional shift register when a backward shift is performed in the known example.

The configuration of the unit circuit 2 included in the bidirectional shift register 20 is not particularly limited. For example, in a case where a configuration using a CMOS is employed as the configuration of the unit circuit 2, a buffer may be constituted by a NAND circuit 801 configured to input the input gate clock signal GCKin and the potential of the node VC, and an inverter 802 configured to input the output from the NAND circuit 801, as illustrated in a section denoted by a reference sign 80 in FIG. 43.

Although the present disclosure has been described in detail above, the above description is exemplary in all respects and is not limiting. It is understood that numerous other modifications or variations can be made without departing from the scope of the present disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A bidirectional shift register comprising a plurality of stages,
wherein the bidirectional shift register is configured to perform shift action based on a plurality of clock signals of three or more phases, each of the plurality of clock signals repeating a change from a high level to a low level and a change from the low level to the high level throughout a period during which the shift action is performed,
a signal obtained through sampling a shift start signal by using one of the plurality of clock signals supplied to the plurality of stages is supplied as a shift pulse for a forward shift action to a first stage of the plurality of stages, and
a signal obtained through sampling the shift start signal by using another one of the plurality of clock signals supplied to the plurality of stages is supplied as a shift pulse for a backward shift action to a last stage of the plurality of stages.

2. The bidirectional shift register according to claim 1, wherein the sampling of the shift start signal is performed by transistors.

3. The bidirectional shift register according to claim 2, further comprising, as the transistors configured to perform the sampling of the shift start signal:
a first transistor including a control terminal to be supplied with the one of the plurality of clock signals, a first conduction terminal to be supplied with the shift start signal, and a second conduction terminal connected to the first stage of the plurality of stages; and
a second transistor including a control terminal to be supplied with the other one of the plurality of clock signals, a first conduction terminal to be supplied with the shift start signal, and a second conduction terminal connected to the last stage of the plurality of stages.

4. The bidirectional shift register according to claim 1, wherein the sampling of the shift start signal is performed by logic circuits.

5. The bidirectional shift register according to claim 4, further comprising, as the logic circuits configured to perform the sampling of the shift start signal:
a first logic circuit configured to output a signal indicating a logical product of the one of the plurality of clock signals and the shift start signal; and
a second logic circuit configured to output a signal indicating a logical product of the other one of the plurality of clock signals and the shift start signal.

6. The bidirectional shift register according to claim 1, wherein the number of phases of the plurality of clock signals is three, and
the number of the plurality of stages is 3K or (3K+1), where K is a natural number.

7. The bidirectional shift register according to claim 1, wherein the number of phases of the plurality of clock signals is four, and
an internal state of a unit circuit, comprising of each stage of the plurality of stages, is reset based on one of the plurality of clock signals.

8. The bidirectional shift register according to claim 1, wherein a pulse width of the shift start signal is equal to a pulse width of at least one of the plurality of clock signals.

9. A display device comprising:
a display portion in which a plurality of scanning signal lines is disposed;
a scanning signal line drive circuit configured to drive the plurality of scanning signal lines; and
a display control circuit configured to control actions of the scanning signal line drive circuit, wherein the scanning signal line drive circuit includes the bidirectional shift register according to claim 1, in which each of the plurality of stages has a one-to-one correspondence with one of the plurality of scanning signal lines, and the display control circuit differentiates a generation sequence of pulses of the plurality of clock signals that are supplied to the scanning signal line drive circuit between when performing the forward shift action and when performing the backward shift action.

\* \* \* \* \*